(12) United States Patent
Hirose et al.

(10) Patent No.: US 7,166,859 B2
(45) Date of Patent: Jan. 23, 2007

(54) ORGANIC SEMICONDUCTOR TRANSISTOR ELEMENT, SEMICONDUCTOR DEVICE USING THE SAME, AND PROCESS FOR PRODUCING THE SEMICONDUCTOR DEVICE

(75) Inventors: Hidekazu Hirose, Kanagawa (JP); Mieko Seki, Kanagawa (JP); Daisuke Okuda, Kanagawa (JP); Tadayoshi Ozaki, Kanagawa (JP); Takeshi Agata, Kanagawa (JP); Toru Ishii, Kanagawa (JP); Kiyokazu Mashimo, Kanagawa (JP); Katsuhiro Sato, Kanagawa (JP); Hiroaki Moriyama, Kanagawa (JP); Yohei Nishino, Kanagawa (JP)

(73) Assignee: Fuji Xerox Co., Ltd., Kanagawa (JP)

( * ) Notice: Subject to any disclaimer, the term of this patent is extended or adjusted under 35 U.S.C. 154(b) by 108 days.

(21) Appl. No.: 10/959,224

(22) Filed: Oct. 7, 2004

(65) Prior Publication Data
US 2005/0104097 A1    May 19, 2005

(30) Foreign Application Priority Data
Nov. 17, 2003    (JP) .............................. 2003-386590

(51) Int. Cl.
*H01L 29/08*    (2006.01)
(52) U.S. Cl. .......................... 257/40; 257/72; 257/642; 257/759; 257/E21.007; 257/E21.299; 257/E27.117; 438/82
(58) Field of Classification Search ..................... None
See application file for complete search history.

(56) References Cited

U.S. PATENT DOCUMENTS 6,096,822 A * 8/2000 Seven et al. ................. 524/513
6,720,644 B1 * 4/2004 Yoshizawa et al. .......... 257/692

FOREIGN PATENT DOCUMENTS

| JP | 5-55568 A | 3/1993 |
| JP | 5-190877 A | 7/1993 |
| JP | 8-228034 A | 9/1996 |
| JP | 8-228035 A | 9/1996 |
| JP | 8-264805 A | 10/1996 |
| JP | 10-125924 A | 5/1998 |
| JP | 10-190001 A | 7/1998 |
| JP | 10-270712 A | 10/1998 |
| JP | 2000-174277 A | 6/2000 |
| JP | 2001-94107 A | 4/2001 |
| JP | 2005047810 A * | 2/2005 |

OTHER PUBLICATIONS

C.J. Drury et al.; "Low-Cost All-Polymer Integrated Circuits"; American Institute of Physics; vol. 73, No. 1; Jul. 6, 1998; pp. 108-110.

* cited by examiner

Primary Examiner—Leonardo Andujar
Assistant Examiner—Scott R Wilson
(74) Attorney, Agent, or Firm—Sughrue Mion, PLLC

(57) ABSTRACT

The present invention provides an organic semiconductor transistor element that includes at least a source electrode, a drain electrode, an organic semiconductor formed to be electrically conductive to the source electrode and the drain electrode, and a gate electrode which is both insulated from the organic semiconductor and capable of applying an electric field. The organic semiconductor includes a polymer compound containing an aromatic tertiary amine.

20 Claims, 3 Drawing Sheets

ORGANIC SEMICONDUCTOR TRANSISTOR ELEMENT, SEMICONDUCTOR DEVICE USING THE SAME, AND PROCESS FOR PRODUCING THE SEMICONDUCTOR DEVICE

CROSS-REFERENCE TO RELATED APPLICATION

This application claims priority under 35 USC 119 from Japanese Patent Application No. 2003-386590, the disclosure of which is incorporated by reference herein.

BACKGROUND OF THE INVENTION

1. Field of the Invention

The present invention relates to an organic semiconductor transistor element using an organic semiconductor, a semiconductor device using this element, and a process for producing the semiconductor. More specifically, the present invention relates to an organic semiconductor transistor element which can be used suitably in the fields of driving circuits of display elements (such as electronic paper, digital paper, organic EL elements, electrophoresis type display elements or liquid crystal elements), logic circuits or memory elements used in electronic tags, smart cards or the like, gas sensors or the like, semiconductor devices using this element, and also relates to a process for producing the semiconductor device.

2. Description of the Related Art

Thin film transistors are widely used as switching elements for displays, for example, as liquid crystal display elements. To present, thin film transistors have been produced from amorphous or polycrystal silicon. However, the production of thin film transistors from silicon involves production process using a vacuum system such as sputtering or CVD equipment, and involves a very high cost. To produce a thin film transistor, it is necessary to repeat the production process using this kind of vacuum system to form plural layers such as a semiconductor layer; therefore, in order to make a large-sized display device or other device using a thin film transistor, there is also a large increase in production cost.

The process for forming a film from amorphous or polycrystal silicon is performed at a very high temperature. Thus, material which can be used as a substrate for the film is limited. Consequently, the problem remains of an inability to use a light and flexible substrate, such as a resin substrate.

Organic semiconductors, a typical example of which is an organic EL element, have also undergone active research in recent years. In tandem with this, there have also been studies of integrating organic material into a circuit, the organic material having characteristics of lightness and flexibility that silicon material does not have.

A low molecular weight compound or a polymer compound is adopted for the organic material used in this kind of thin film transistor. For the low molecular weight compound, polyacene compounds such as pentacene and tetracene (see, for example, Japanese Patent Application Laid-Open (JP-A-) Nos. 5-55568, 10-270712 and 2001-94107) and phthalocyanine compounds such as copper phthalocyanine are suggested (see, for example, JP-A Nos. 5-190877 and 2000-174277).

However, in the case of the low molecular weight compound, it is necessary to repeat the production process using the same vacuum system as used in the case of silicon. Thus, the previously mentioned problems relating to the production process also exist in this case.

For the polymer compound, aromatic oligomers such as sexithiophene (see, for example, JP-A No. 8-264805), and polymer compounds such as polythiophene, polythienylvinylene, and poly(p-phenylenevinylene) are suggested (see, for example, JP-A Nos. 8-228034, 8-228035, 10-125924 and 10-190001, and Appl. Phys. Lett., vol. 73, 108 (1998)).

This kind of polymer compound is advantageous in the production process since the compound has a greater solubility and can be formed into a film through a low-cost technique such as spin coating or dip coating. However, there exists a problem with the polymer compound that the mobility of carriers contained therein is low. In the case of poly(p-phenylenevinylene), since a soluble precursor is subjected to spin coating followed by heat treatment, defects are easily formed in the main chain conjugated system of the polymer so as to produce a marked lowering in the electrical characteristic thereof.

SUMMARY OF THE INVENTION

The present invention has been made in light of the above-mentioned situation. The invention provides an organic semiconductor transistor element which has a high operation speed, can be easily produced, and is made of a polymer compound that includes an aromatic tertiary amine possessing superior solubility in and compatibility with solvent or resin and also possessing a high carrier mobility; a semiconductor device using this element; and a process for producing the semiconductor device.

The inventors of the present invention have eagerly investigated polymer compounds having carrier-transporting capability and have found that a polymer compound having an aromatic tertiary amine has carrier mobility, a carrier injecting property, and an ability to form into thin film, and thus is suitable as an organic semiconductor transistor element.

A first aspect of the invention is to provide an organic semiconductor transistor element that includes at least a source electrode, a drain electrode, an organic semiconductor formed to be electrically conductive to the source electrode and the drain electrode, and a gate electrode which is both insulated from the organic semiconductor and capable of applying an electric field, wherein the organic semiconductor includes a polymer compound containing an aromatic tertiary amine.

A second aspect of the invention is to provide a semiconductor device that includes a substrate, and one or more organic semiconductor transistor elements provided on the substrate, the one or more organic semiconductor transistor elements including at least a source electrode, a drain electrode, an organic semiconductor formed to be electrically conductive to the source electrode and the drain electrode, and a gate electrode which is both insulated from the organic semiconductor and capable of applying an electric field, wherein the organic semiconductor includes a polymer compound containing an aromatic tertiary amine.

A third aspect of the invention is to provide a process for producing a semiconductor device that includes a substrate, and one or more organic semiconductor transistor elements provided on the substrate, the one or more organic semiconductor transistor elements including at least a source electrode, a drain electrode, an organic semiconductor layer which is formed to be electrically conductive to the source electrode and the drain electrode and which includes a polymer compound containing an aromatic tertiary amine, and a gate electrode which is both insulated from the organic semiconductor layer and capable of applying an electric field, wherein the organic semiconductor layer is formed through a liquid-phase film-forming process.

DETAILED DESCRIPTION OF THE INVENTION

Figure 1:
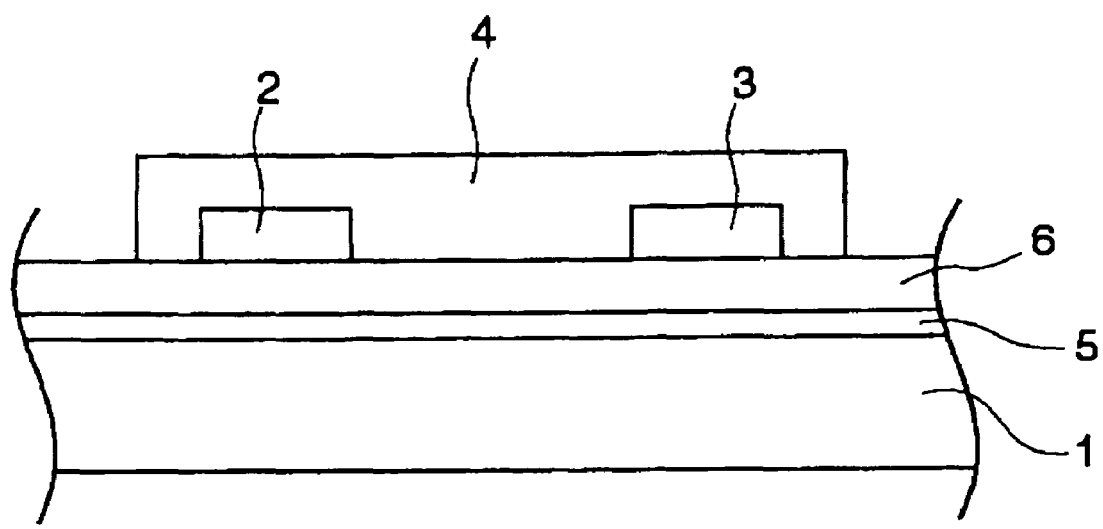
FIG. 1 is a view which schematically illustrates an example of a layer structure of an organic semiconductor transistor element according to the present invention.

An organic semiconductor transistor element according to the present invention includes at least a source electrode, a drain electrode, an organic semiconductor formed to be electrically conductive to the source electrode and the drain electrode, and a gate electrode which is both insulated from the organic semiconductor and capable of applying an electric field, wherein the organic semiconductor includes a polymer compound containing an aromatic tertiary amine.

Since the polymer compound used in the invention includes an aromatic tertiary amine, the compound has a better carrier mobility property than conventional polymer type organic semiconductor materials. Since the polymer compound used in the invention is superior in heat stability as well as in solubility in and compatibility with solvent or resin, the compound can easily be formed into a thin film through a known liquid-phase film-forming process. Therefore, in the production of organic semiconductor transistor elements or various kinds of electronic devices using the elements, the organic semiconductor potion of the elements can be produced through a liquid-phase film-forming process. Such a process is superior in terms of mass production as well as production of the elements with large surface areas.

In other words, the invention allows high production levels of high-performance transistor elements, which cannot be attained when conventional polymer type organic semiconductor materials and low molecular weight compound type organic semiconductor materials are used.

The polymer compound used in the invention is a carrier-transporting material, which has a carrier-transporting property. The carrier mobility thereof can be adjusted to fall within a range of about $10^{-7}$ to $10^{-2}$ cm$^2$/Vs by adjusting the molecular structure or the molecular weight thereof according to the purpose of the organic semiconductor transistor element.

Examples of the basic structure of the polymer compound used in the invention include polyester, polyether, polyurethane, polyimide, polyamide, polyetherketone, polycarbonate, polysulfide, polyethersulfide, silicon-containing polymer and germanium-containing polymer as well as copolymers thereof. Of these polymers, polyester is preferable from the viewpoints of ease of synthesis, thermal stability, as well as solubility in and compatibility with solvent or resin.

The following can be used for the aromatic tertiary amine contained in the polymer compound as described above: aromatic diamine compounds wherein aromatic tertiary amine units of 1,1-bis{4-(di-p-tolylamine) phenyl}cyclohexane are linked to each other (JP-A No. 59-194393); aromatic amines containing two or more tertiary amines, a typical example of which is 4,4-bis[(N-1-naphthyl)-N-phenylamino]biphenyl (JP-A No. 5-234681); aromatic amines which are derived from triphenylbenezene and have a star-burst structure (U.S. Pat. No. 4,923,774); aromatic amines such as N,N'-diphenyl-N,N'-bis(3-methylphenyl)-(1,1'-biphenyl)-4,4'-diamine (U.S. Pat. No. 4,764,625); α,α,α',α'-tetramethyl-α,α'-bis(4-di-p-triaminophenyl)-p-xylene (JP-A No. 3-269084); three-dimensionally asymmetric triphenylamine derivatives (JP-A No. 4-129271); compounds having a pyrenyl group substituted with plural aromatic diamine groups (JP-A No. 4-175395); aromatic diamines wherein aromatic tertiary amines are linked to each other through an ethylene group (JP-A No. 4-264189); aromatic diamines having a styryl group (JP-A No. 4-290851); compounds wherein aromatic tertiary amines are linked to each other through a thiophene group (JP-A No. 4-304466); star-burst type aromatic triamines (JP-A No. 4-308688); compounds wherein tertiary amines are linked to each other through a fluorene group (JP-A No. 5-25473); aromatic diamines having a phenoxazine skeleton (JP-A No. 5-290728); and others.

The aromatic tertiary amine preferably contains an aromatic component comprising at least one of a condensed aromatic ring and a polynuclear aromatic ring, bonded to a tertiary amine nitrogen atom thereof.

The aromatic tertiary amine may be incorporated, as a repeating unit, in the main chain structure of the polymer compound.

In this case, the polymer compound used in the invention preferably includes a repeating unit containing, as its partial structure, at least one selected from the following formulae (I-1) and (I-2). Since this kind of polymer compound has better solubility in and compatibility with solvent or resin, an organic semiconductor transistor element with this kind of compound can be produced more easily. Furthermore, the carrier-transporting property of the organic semiconductor transistor element can be improved.

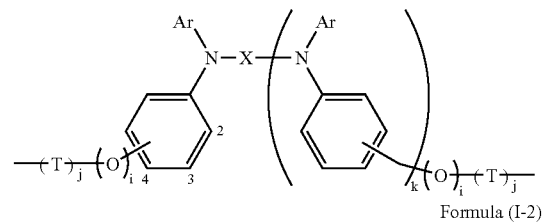

Formula (I-1)

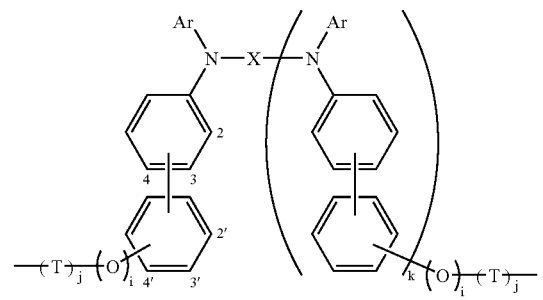

Formula (I-2)

In the formulae (I-1) and (I-2), Ar represents a substituted or unsubstituted monovalent benzene ring, a substituted or unsubstituted monovalent polynuclear aromatic hydrocarbon having 2 to 10 aromatic rings, a substituted or unsubstituted monovalent condensed aromatic hydrocarbon having 2 to 10 aromatic rings, or a substituted or unsubstituted monovalent aromatic heteroring; X represents a substituted or unsubstituted bivalent benzene ring, a substituted or unsubstituted bivalent polynuclear aromatic hydrocarbon having 2 to 10 aromatic rings, a substituted or unsubstituted bivalent condensed aromatic hydrocarbon having 2 to 10 aromatic rings, or a substituted or unsubstituted bivalent aromatic heteroring; T represents a bivalent straight-chain hydrocarbon group having 1 to 6 carbon atoms, or a bivalent branched hydrocarbon group having 2 to 10 carbon atoms; and k, i, and j each independently represent an integer of 0 or 1.

Specifically, the polynuclear aromatic hydrocarbon and the condensed aromatic hydrocarbon used in the invention are aromatic hydrocarbons as defined per the following:

The "polynuclear aromatic hydrocarbon" is a hydrocarbon wherein two or more aromatic rings composed of carbon and hydrogen atoms are present and the aromatic rings are bonded to each other through carbon-carbon bonds. Specific examples thereof include biphenyl and terphenyl. The "condensed aromatic hydrocarbon" is a hydrocarbon wherein two or more aromatic rings composed of carbon and hydrogen atoms are present and the aromatic rings have a pair of carbon atoms in common. Specific examples thereof include naphthalene, anthracene, and phenanthrene, and fluorene.

Regarding the heteroring, the number (Nr) of atoms constituting the cyclic skeleton thereof is preferably 5 or 6. The kind and the number of atoms (heteroatoms) other than carbon atoms which is contained in the ring are not particularly limited. For example, a sulfur, nitrogen, oxygen or some other atom is preferably used. The ring skeleton may contain two kinds of heteroatoms and/or two or more heteroatoms. In particular, thiophene, pyrrole, furan or a heteroring wherein the carbon atom at the 3- or 4-position of the compound is substituted with a nitrogen atom is preferably used as the heteroring having a 5-membered ring structure, and pyridine is preferably used as the heteroring having a 6-membered ring structure.

Examples of the substituent of the benzene ring, the polynuclear aromatic hydrocarbon, or the condensed aromatic hydrocarbon include hydrogen and halogen atoms; and alkyl, alkoxy, aryl, aralkyl, and substituted amino groups. The alkyl group is preferably an alkyl group having 1 to 10 carbon atoms, examples of which include methyl, ethyl, propyl, and isopropyl groups. The alkoxy group is preferably an alkoxy group having 1 to 10 carbon atoms, examples of which include methoxy, ethoxy, propoxy, and isopropoxy groups. The aryl group is preferably an aryl group having 6 to 20 carbon atoms, examples of which include phenyl, and toluyl groups. The aralkyl group is preferably an aralkyl group having 7 to 20 carbon atoms, examples of which include benzyl, and phenethyl groups. Examples of the substituent of the substituted amino group include alkyl, aryl and aralkyl groups. Specific examples thereof are the same as described above.

X represents a substituted or unsubstituted bivalent benzene ring, a substituted or unsubstituted polynuclear aromatic hydrocarbon having 2 to 10 aromatic rings, a substituted or unsubstituted bivalent condensed aromatic hydrocarbon having 2 to 10 aromatic rings, or a substituted or unsubstituted bivalent aromatic heteroring. X is specifically a group represented by any one selected from the following formulae (1) to (13):

Formulae (1) to (13)

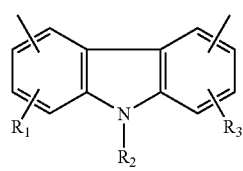

(1)

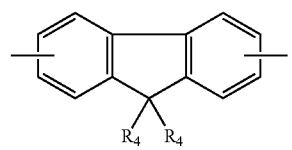

(2)

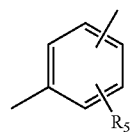

(3)

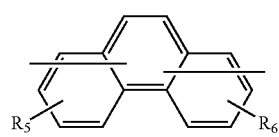

(4)

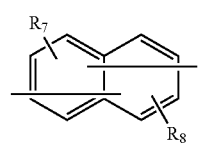

(5)

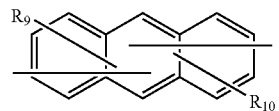

(6)

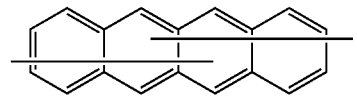

(7)

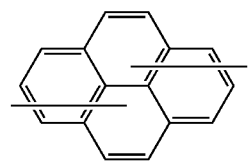

(8)

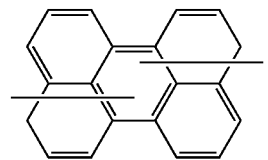

(9)

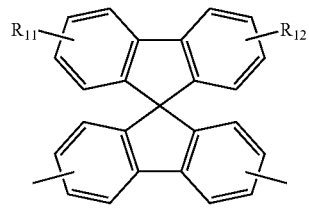

(10)

-continued

(11)
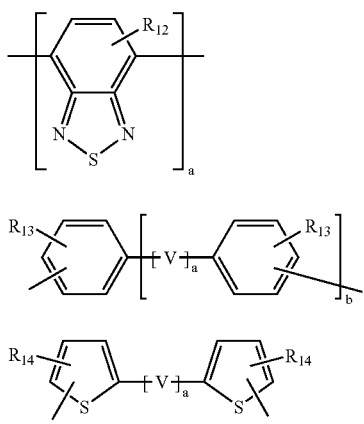

(12)

(13)

In the formulae (1) to (13), $R_1$ to $R_{14}$ each independently represent a hydrogen atom, an alkyl group having 1 to 10 carbon atoms, an alkoxy group having 1 to 10 carbon atoms, a substituted or unsubstituted phenyl group, a substituted or unsubstituted aralkyl group or a halogen atom; a is 0 or 1; b is an integer from 0 to 10; and V is a group represented by any one selected from the following formulae (14) to (34):

Formulae (14) to (34)

—(CH$_2$)$_b$— (14)

—C(CH$_3$)$_2$— (15)

—O— (16)

—S— (17)

—C(CF$_3$)$_2$— (18)

—Si(CH$_3$)$_2$— (19)

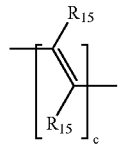 (20)

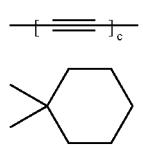 (21)

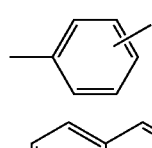 (22)

(23)

(24)

(25)

(26)

(27)

(28)

(29)

(30)

(31)

(32)

(33)

(34)

In the formulae (14) to (34), $R_{15}$ represents a hydrogen atom, or an alkyl or cyano group; $R_{16}$ and $R_{17}$ each represent a hydrogen atom, an alkyl group having 1 to 10 carbon atoms, an alkoxy group having 1 to 10 carbon atoms, a substituted or unsubstituted phenyl group, a substituted or unsubstituted aralkyl group or a halogen atom; and c is an integer from 0 to 10.

T represents a bivalent straight-chain hydrocarbon group having 1 to 6 carbon atoms or a bivalent branched hydrocarbon group having 2 to 10 carbon atoms, and preferably represents a bivalent normal hydrocarbon group having 2 to 6 carbon atoms or a bivalent branched hydrocarbon group having 3 to 7 carbon atoms. Specific structural examples thereof are illustrated below.

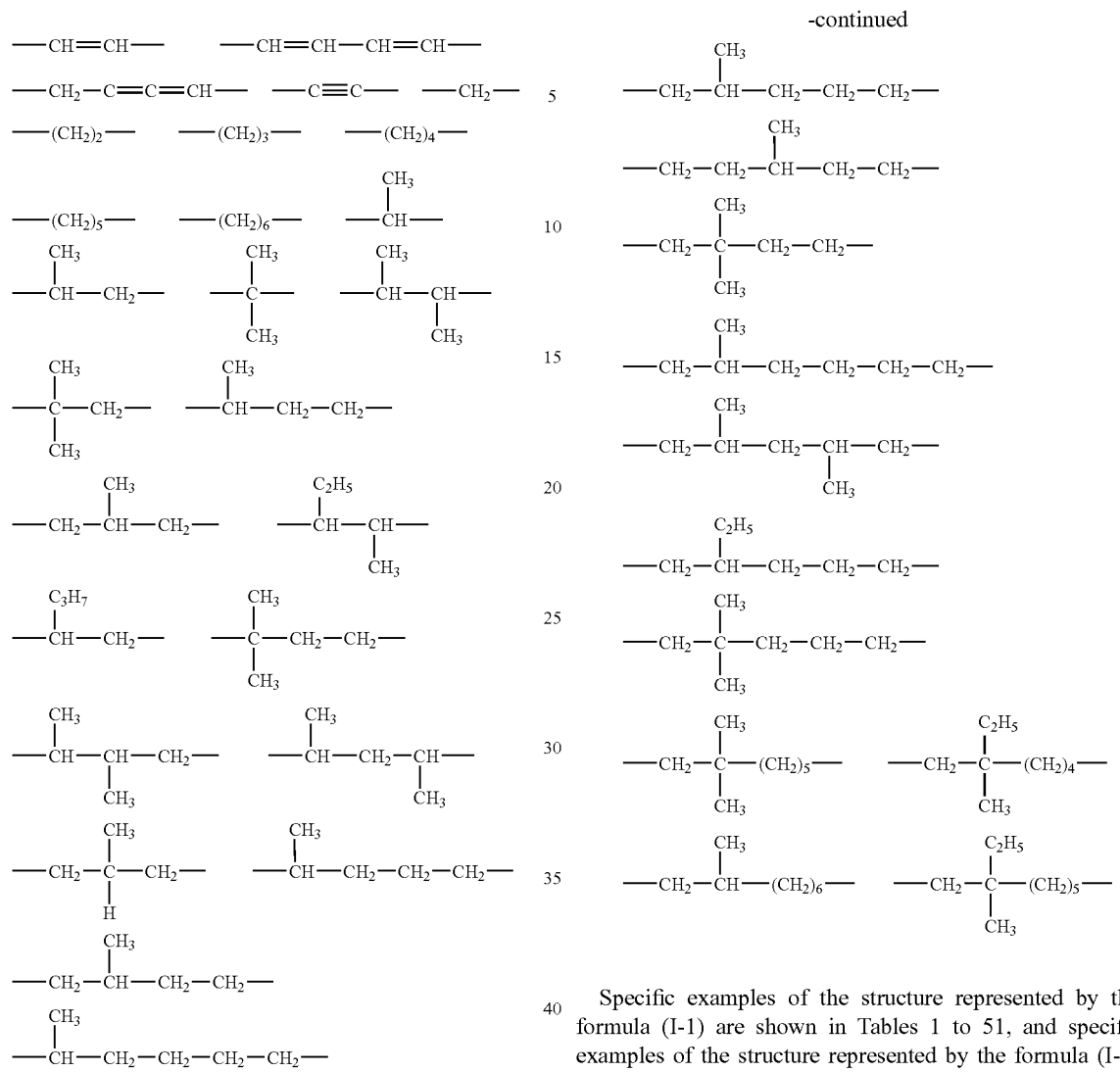
Specific examples of the structure represented by the formula (I-1) are shown in Tables 1 to 51, and specific examples of the structure represented by the formula (I-2) are shown in Tables 52 to 101.

TABLE 1-continued

| Structure | k | X | Ar | Bonding Position | i | j | T |
|---|---|---|---|---|---|---|---|
| 4 | 0 | (dimethyl-substituted phenyl) | –C₆H₄–CH₃ | 4 | 0 | 1 | –CH₂–C(CH₃)(CH₃)–CH₂– |
| 5 | 0 | (dimethyl-substituted phenyl) | –C₆H₃(CH₃)₂ (3,4-dimethylphenyl) | 4 | 0 | 1 | –CH₂–C(CH₃)(CH₃)–CH₂– |
| 6 | 0 | (dimethyl-substituted phenyl) | –C₆H₄–C₂H₅ | 4 | 0 | 1 | –CH₂CH₂– |
| 7 | 0 | –C₆H₄– | –C₆H₅ | 4 | 0 | 1 | –CH₂CH₂– |
| 8 | 0 | –C₆H₄– | –C₆H₄–CH₃ | 4 | 0 | 1 | –CH₂– |

TABLE 2

| Structure | k | X | Ar | Bonding Position | i | j | T |
|---|---|---|---|---|---|---|---|
| 9 | 0 | –C₆H₄– | –C₆H₃(CH₃)₂ (3,4-dimethylphenyl) | 4 | 0 | 1 | –CH₂CH₂– |
| 10 | 0 | –C₆H₄– | –C₆H₃(CH₃)₂ (3,4-dimethylphenyl) | 4 | 1 | 0 | — |
| 11 | 0 | –C₆H₄– | –C₆H₄–OCH₃ | 4 | 0 | 1 | –CH₂– |
| 12 | 0 | –C₆H₄– | –C₆H₄–OCH₃ | 4 | 0 | 1 | –CH₂CH₂– |
| 13 | 0 | –C₆H₄– | –C₆H₄–C₆H₅ (biphenyl) | 4 | 0 | 1 | –CH₂– |
| 14 | 0 | –C₆H₄– | –C₆H₄–C₆H₄–C₆H₄–C₆H₅ (quaterphenyl) | 4 | 0 | 1 | –CH₂CH₂– |

TABLE 2-continued

| Structure | k | X | Ar | Bonding Position | i | j | T |
|---|---|---|---|---|---|---|---|
| 15 | 0 | (p-phenylene) | (naphthalen-1-yl) | 4 | 0 | 1 | —CH$_2$—C(CH$_3$)$_2$—CH$_2$— |

TABLE 3

| Structure | k | X | Ar | Bonding Position | i | j | T |
|---|---|---|---|---|---|---|---|
| 16 | 0 | (p-phenylene) | (anthracen-9-yl) | 4 | 0 | 1 | —CH$_2$— |
| 17 | 0 | (p-phenylene) | (phenanthren-9-yl) | 4 | 0 | 1 | —CH$_2$CH$_2$— |
| 18 | 0 | (p-phenylene) | (9,9-dimethylfluoren-2-yl) | 4 | 0 | 1 | —CH$_2$CH$_2$— |
| 19 | 0 | (p-phenylene) | (pyren-1-yl) | 4 | 0 | 1 | —CH$_2$CH$_2$— |

TABLE 4

| Structure | k | X | Ar | Bonding Position | i | j | T |
|---|---|---|---|---|---|---|---|
| 20 | 0 | (p-phenylene) | (4-styrylphenyl) | 4 | 0 | 1 | —CH$_2$CH$_2$— |

TABLE 4-continued
| Structure | k | X | Ar | Bonding Position | i | j | T |
|---|---|---|---|---|---|---|---|
| 21 | 0 |  | 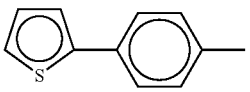 | 3 | 0 | 1 | —CH$_2$CH$_2$— |
| 22 | 0 |  | 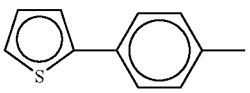 | 4 | 0 | 1 | —CH$_2$CH$_2$— |
| 23 | 0 |  | 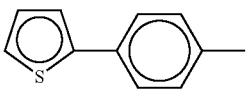 | 4 | 0 | 1 | 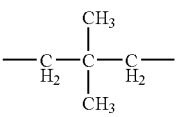 |
| 24 | 0 |  | 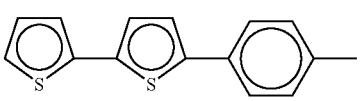 | 4 | 0 | 1 | —CH$_2$CH$_2$— |
| 25 | 0 |  | 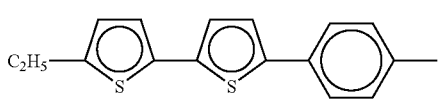 | 4 | 0 | 1 | —CH$_2$CH$_2$— |
| 26 | 0 |  | 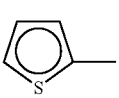 | 4 | 0 | 1 | —CH$_2$— |
TABLE 5
| Structure | k | X | Ar | Bonding Position | i | j | T |
|---|---|---|---|---|---|---|---|
| 27 | 0 | 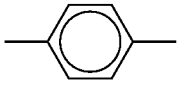 | 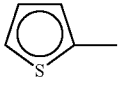 | 4 | 0 | 0 | — |
| 28 | 0 | 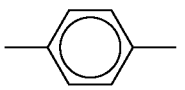 | 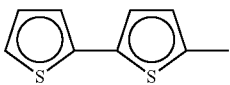 | 4 | 1 | 0 | — |
| 29 | 0 | 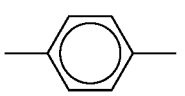 | 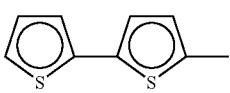 | 4 | 0 | 1 | —CH$_2$CH$_2$— |
| 30 | 0 | 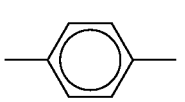 | 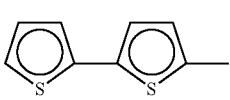 | 4 | 1 | 0 | — |
| 31 | 0 | 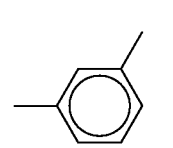 | 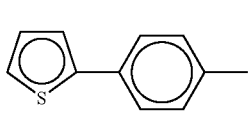 | 4 | 0 | 0 | — |
| 32 | 0 | 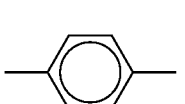 | 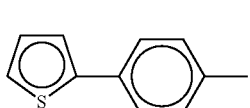 | 4 | 0 | 0 | — |

TABLE 5-continued

| Structure | k | X | Ar | Bonding Position | i | j | T |
|---|---|---|---|---|---|---|---|
| 33 | 0 | —⟨phenyl⟩— | ⟨thiophene⟩-⟨thiophene⟩-⟨phenyl⟩— | 4 | 0 | 0 | — |

TABLE 6

| Structure | k | X | Ar | Bonding Position | i | j | T |
|---|---|---|---|---|---|---|---|
| 34 | 0 | —⟨phenyl⟩— | C₂H₅—⟨thiophene⟩-⟨thiophene⟩-⟨phenyl⟩— | 4 | 0 | 0 | — |
| 35 | 0 | —⟨phenyl⟩— | —⟨thiophene⟩-⟨thiophene⟩— | 4 | 0 | 0 | — |
| 36 | 0 | —⟨methylphenyl⟩ | —⟨thiophene⟩-⟨phenyl⟩— | 3 | 1 | 1 | —CH₂CH₂— |
| 37 | 0 | —⟨phenyl⟩— | —⟨thiophene⟩-⟨phenyl⟩— | 4 | 1 | 1 | —CH₂— |
| 38 | 0 | —⟨phenyl⟩— | —⟨thiophene⟩-⟨phenyl⟩— | 4 | 1 | 1 | —CH₂CH₂— |
| 39 | 0 | —⟨phenyl⟩— | C₂H₅—⟨thiophene⟩-⟨thiophene⟩-⟨phenyl⟩— | 4 | 1 | 1 | —CH₂— |
| 40 | 0 | —⟨phenyl⟩— | —⟨thiophene⟩-⟨thiophene⟩— | 4 | 1 | 1 | —CH₂— |
| 41 | 1 | —⟨phenyl⟩-⟨phenyl⟩— | —⟨phenyl⟩— | 4 | 0 | 1 | —CH₂CH₂— |

TABLE 7

| Structure | k | X | Ar | Bonding Position | i | j | T |
|---|---|---|---|---|---|---|---|
| 42 | 1 | —⟨phenyl⟩-⟨phenyl⟩— | —⟨phenyl⟩—CH₃ | 4 | 0 | 1 | —CH₂CH₂— |
| 43 | 1 | —⟨phenyl⟩-⟨phenyl⟩— | —⟨phenyl⟩—OCH₃ | 4 | 0 | 1 | —CH₂CH₂— |

TABLE 7-continued

| Structure | k | X | Ar | Bonding Position | i | j | T |
|---|---|---|---|---|---|---|---|
| 44 | 1 | biphenyl | biphenyl | 4 | 0 | 1 | —CH$_2$CH$_2$— |
| 45 | 1 | biphenyl | terphenyl | 4 | 0 | 1 | —CH$_2$CH$_2$— |
| 46 | 1 | biphenyl | naphthyl | 4 | 0 | 1 | —CH$_2$CH$_2$— |
| 47 | 1 | biphenyl | phenanthryl | 4 | 0 | 1 | —CH$_2$— |

TABLE 8

| Structure | k | X | Ar | Bonding Position | i | j | T |
|---|---|---|---|---|---|---|---|
| 48 | 1 | biphenyl | fluorenyl | 4 | 0 | 1 | $-\underset{H_2}{C}-\underset{\underset{CH_3}{\overset{CH_3}{\mid}}}{C}-\underset{H_2}{C}-$ |
| 49 | 1 | biphenyl | 9,9-dimethylfluorenyl | 4 | 0 | 1 | $-\underset{H_2}{C}-\underset{\underset{CH_3}{\overset{CH_3}{\mid}}}{C}-\underset{H_2}{C}-$ |
| 50 | 1 | biphenyl | stilbenyl | 4 | 0 | 1 | —CH$_2$CH$_2$— |
| 51 | 1 | biphenyl | tolanyl | 4 | 0 | 1 | —CH$_2$CH$_2$— |

TABLE 8-continued
| Structure | k | X | Ar | Bonding Position | i | j | T |
|---|---|---|---|---|---|---|---|
| 52 | 1 | 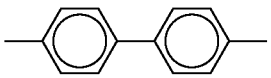 | 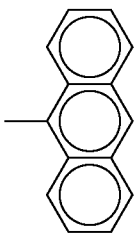 | 4 | 0 | 1 | —CH$_2$CH$_2$— |
TABLE 9
| Structure | k | X | Ar | Bonding Position | i | j | T |
|---|---|---|---|---|---|---|---|
| 53 | 1 | 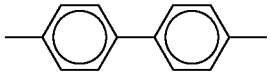 | 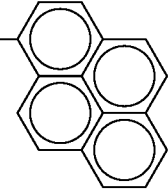 | 4 | 0 | 1 | —CH$_2$CH$_2$— |
| 54 | 1 | 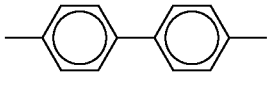 | 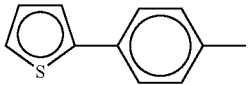 | 2 | 0 | 1 | —CH$_2$CH$_2$— |
| 55 | 1 | 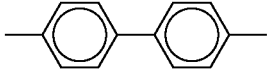 | 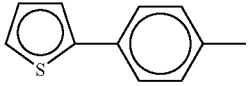 | 3 | 0 | 1 | —CH$_2$CH$_2$— |
| 56 | 1 | 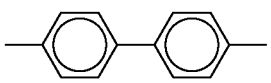 | 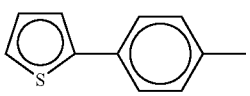 | 4 | 0 | 1 | —CH$_2$— |
| 57 | 1 | 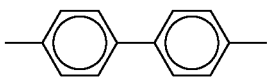 | 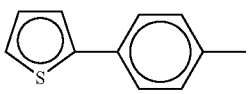 | 4 | 0 | 1 | —CH$_2$CH$_2$— |
| 58 | 1 | 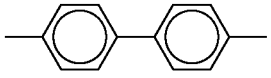 | 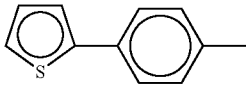 | 4 | 0 | 1 | —(CH$_2$)$_4$— |
| 59 | 1 | 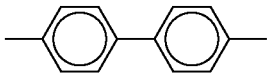 | 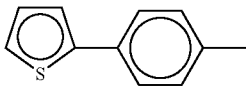 | 4 | 0 | 1 | 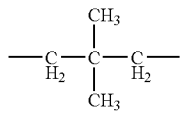 |

TABLE 10
| Structure | k | X | Ar | Bonding Position | i | j | T |
|---|---|---|---|---|---|---|---|
| 60 | 1 | 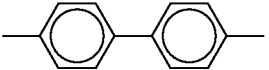 | 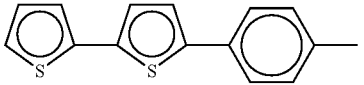 | 4 | 0 | 1 | —CH$_2$CH$_2$— |
| 61 | 1 | 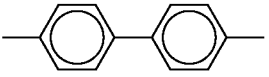 | C$_2$H$_5$—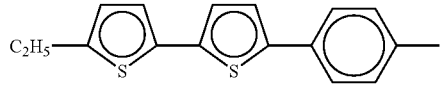 | 4 | 0 | 1 | —CH$_2$CH$_2$— |
| 62 | 1 | 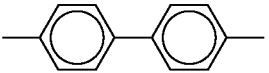 | 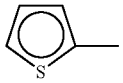 | 3 | 0 | 1 | —CH$_2$CH$_2$— |
| 63 | 1 | 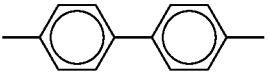 | 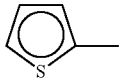 | 4 | 0 | 1 | —CH$_2$CH$_2$— |
| 64 | 1 | 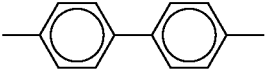 | 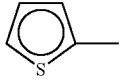 | 4 | 0 | 1 | 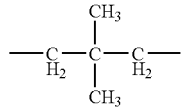 |
| 65 | 1 | 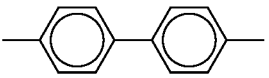 | 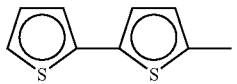 | 3 | 0 | 1 | —CH$_2$CH$_2$— |
| 66 | 1 | 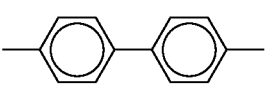 | 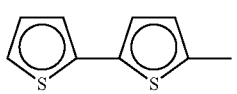 | 4 | 0 | 1 | —CH$_2$CH$_2$— |

TABLE 11

| Structure | k | X | Ar | Bonding Position | i | j | T |
|---|---|---|---|---|---|---|---|
| 67 | 1 | biphenyl | bithiophene with methyl | 4 | 0 | 1 | —(CH$_2$)$_3$— |
| 68 | 1 | biphenyl | thiazoline with p-tolyl | 4 | 0 | 1 | —CH$_2$CH$_2$— |
| 69 | 1 | biphenyl | thiazoline with p-tolyl | 4 | 0 | 1 | —C(CH$_3$)$_2$CH$_2$C(CH$_3$)$_2$— |
| 70 | 1 | biphenyl | 2,5-diphenyl-1,3,4-oxadiazole with p-tolyl | 4 | 0 | 1 | —CH$_2$CH$_2$— |
| 71 | 1 | biphenyl | 2,5-bis(4-tert-butylphenyl and 4-methylphenyl)-1,3,4-oxadiazole | 4 | 0 | 1 | —CH$_2$CH$_2$— |
| 72 | 1 | biphenyl | quinoline with p-tolyl | 4 | 0 | 1 | —CH$_2$CH$_2$— |
| 73 | 1 | biphenyl | 2-(naphthyl)-5-(p-tolyl)-1,3,4-oxadiazole | 3 | 0 | 1 | —CH$_2$— |

TABLE 12
| Structure | k | X | Ar | Bonding Position | i | j | T |
|---|---|---|---|---|---|---|---|
| 74 | 1 | 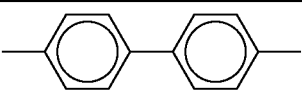 | 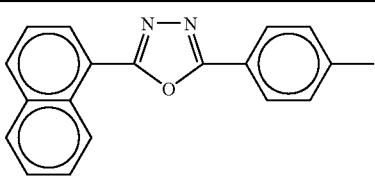 | 3 | 0 | 1 | —CH$_2$CH$_2$— |
| 75 | 1 | 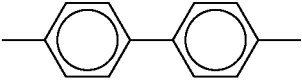 | 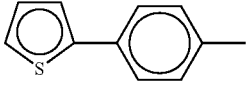 | 4 | 0 | 0 | — |
| 76 | 1 | 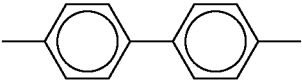 | 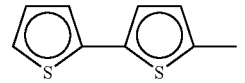 | 4 | 0 | 0 | — |
| 77 | 1 | 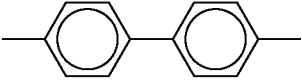 | C$_2$H$_5$—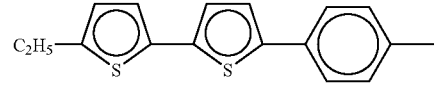 | 4 | 0 | 0 | — |
| 78 | 1 | 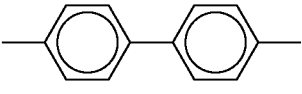 | 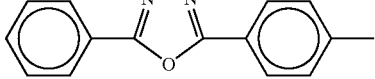 | 4 | 0 | 0 | — |
| 79 | 1 | 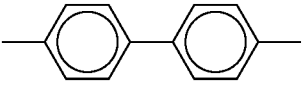 | 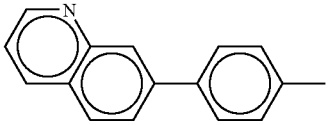 | 4 | 0 | 0 | — |
| 80 | 1 | 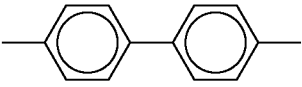 | 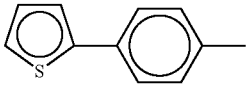 | 4 | 0 | 1 | —CH$_2$— |
TABLE 13
| Structure | k | X | Ar | Bonding Position | i | j | T |
|---|---|---|---|---|---|---|---|
| 81 | 1 | 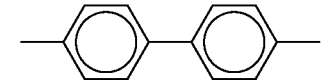 |  | 4 | 0 | 1 | —CH$_2$— |
| 82 | 1 | 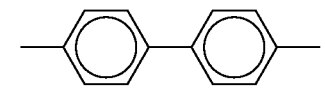 | 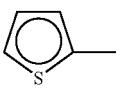 | 4 | 0 | 1 | —CH$_2$— |
| 83 | 1 | 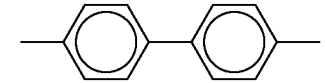 | 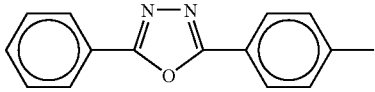 | 4 | 0 | 1 | —CH$_2$— |
| 84 | 1 | 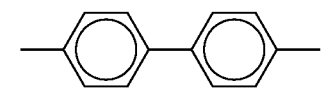 | 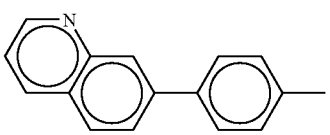 | 4 | 0 | 1 | —CH$_2$— |

TABLE 13-continued

| Structure | k | X | Ar | Bonding Position | i | j | T |
|---|---|---|---|---|---|---|---|
| 85 | 1 | 3,3'-dimethyl-biphenyl-4,4'-diyl | phenyl | 4 | 0 | 1 | —CH$_2$CH$_2$— |
| 86 | 1 | 3,3'-dimethyl-biphenyl-4,4'-diyl | 4-methylphenyl | 4 | 0 | 1 | —CH$_2$CH$_2$— |
| 87 | 1 | 3,3'-dimethyl-biphenyl-4,4'-diyl | 3,4-dimethylphenyl | 4 | 0 | 1 | —CH$_2$CH$_2$— |

TABLE 14

| Structure | k | X | Ar | Bonding Position | i | j | T |
|---|---|---|---|---|---|---|---|
| 88 | 1 | 3,3'-dimethyl-biphenyl-4,4'-diyl | biphenyl | 4 | 0 | 1 | —CH$_2$CH$_2$— |
| 89 | 1 | 3,3'-dimethyl-biphenyl-4,4'-diyl | terphenyl | 4 | 0 | 1 | —CH$_2$CH$_2$— |
| 90 | 1 | 3,3'-dimethyl-biphenyl-4,4'-diyl | naphthyl | 4 | 0 | 1 | —CH$_2$CH$_2$— |
| 91 | 1 | 3,3'-dimethyl-biphenyl-4,4'-diyl | fluorenyl | 4 | 0 | 1 | —CH$_2$CH$_2$— |
| 92 | 1 | 3,3'-dimethyl-biphenyl-4,4'-diyl | phenanthryl | 4 | 0 | 1 | —CH$_2$CH$_2$— |

TABLE 14-continued

| Structure | k | X | Ar | Bonding Position | i | j | T |
|---|---|---|---|---|---|---|---|
| 93 | 1 | 3,3'-dimethyl-4,4'-biphenylene | 4-styrylphenyl | 4 | 0 | 1 | —CH$_2$CH$_2$— |

TABLE 15

| Structure | k | X | Ar | Bonding Position | i | j | T |
|---|---|---|---|---|---|---|---|
| 94 | 1 | 3,3'-dimethyl-4,4'-biphenylene | 4-(thien-2-yl)phenyl | 4 | 0 | 1 | —CH$_2$CH$_2$— |
| 95 | 1 | 3,3'-dimethyl-4,4'-biphenylene | 4-(thien-2-yl)phenyl | 4 | 0 | 1 | —CH$_2$CH$_2$— |
| 96 | 1 | 3,3'-dimethyl-4,4'-biphenylene | 4-(thien-2-yl)phenyl | 4 | 0 | 1 | —(CH$_2$)$_4$— |
| 97 | 1 | 3,3'-dimethyl-4,4'-biphenylene | 4-(thien-2-yl)phenyl | 4 | 0 | 1 | —CH$_2$—C(CH$_3$)$_2$—CH$_2$— |
| 98 | 1 | 3,3'-dimethyl-4,4'-biphenylene | 4-(bithien-2-yl)phenyl | 4 | 0 | 1 | —CH$_2$CH$_2$— |
| 99 | 1 | 3,3'-dimethyl-4,4'-biphenylene | 4-(5'-ethyl-bithien-2-yl)phenyl | 4 | 0 | 1 | —CH$_2$CH$_2$— |

TABLE 16

| Structure | k | X | Ar | Bonding Position | i | j | T |
|---|---|---|---|---|---|---|---|
| 100 | 1 | (3,3'-dimethylbiphenyl-4,4'-diyl) | C₂H₅-substituted bithiophene-phenyl | 4 | 0 | 1 | —CH₂— |
| 101 | 1 | (3,3'-dimethylbiphenyl-4,4'-diyl) | thiophene | 4 | 0 | 1 | —CH₂CH₂— |
| 102 | 1 | (3,3'-dimethylbiphenyl-4,4'-diyl) | thiophene | 4 | 0 | 1 | —CH₂CH₂— |
| 103 | 1 | (3,3'-dimethylbiphenyl-4,4'-diyl) | bithiophene | 4 | 0 | 1 | —CH₂CH₂— |
| 104 | 1 | (3,3'-dimethylbiphenyl-4,4'-diyl) | bithiophene | 4 | 0 | 1 | —CH₂CH₂— |
| 105 | 1 | (3,3'-dimethylbiphenyl-4,4'-diyl) | thiazoline-phenyl | 4 | 0 | 1 | —CH₂CH₂— |
| 106 | 1 | (3,3'-dimethylbiphenyl-4,4'-diyl) | thiazoline-phenyl | 4 | 0 | 1 | —CH₂—C(CH₃)₂—CH₂— |

TABLE 17

| Structure | k | X | Ar | Bonding Position | i | j | T |
|---|---|---|---|---|---|---|---|
| 107 | 1 | 3,3'-dimethylbiphenyl | 2-phenyl-5-(4-methylphenyl)-1,3,4-oxadiazole | 4 | 0 | 1 | —CH$_2$CH$_2$— |
| 108 | 1 | 3,3'-dimethylbiphenyl | 2-(4-tert-C$_4$H$_9$-phenyl)-5-(4'-methylbiphenyl)-1,3,4-oxadiazole | 4 | 0 | 1 | —CH$_2$— |
| 109 | 1 | 3,3'-dimethylbiphenyl | 2-(4-tert-C$_4$H$_9$-phenyl)-5-(4'-methylbiphenyl)-1,3,4-oxadiazole | 4 | 0 | 1 | —CH$_2$CH$_2$— |
| 110 | 1 | 3,3'-dimethylbiphenyl | 5-(4-methylphenyl)thiophene | 4 | 0 | 0 | — |
| 111 | 1 | 3,3'-dimethylbiphenyl | 5-(4-methylphenyl)-2,2'-bithiophene | 4 | 0 | 0 | — |
| 112 | 1 | 3,3'-dimethylbiphenyl | 5-methyl-2,2'-bithiophene | 4 | 0 | 0 | — |
| 113 | 1 | 3,3'-dimethylbiphenyl | 2-(4-methylphenyl)-4,5-dihydrothiazole | 4 | 0 | 0 | — |

TABLE 18

| Structure | k | X | Ar | Bonding Position | i | j | T |
|---|---|---|---|---|---|---|---|
| 114 | 1 | 3,4'-dimethylbiphenyl (CH₃, H₃C) | quinoline-phenyl | 4 | 0 | 0 | — |
| 115 | 1 | 3,4'-dimethylbiphenyl | thiophene-phenyl | 4 | 0 | 1 | —CH₂— |
| 116 | 1 | 3,4'-dimethylbiphenyl | bithiophene-phenyl (with C₂H₅) | 4 | 0 | 1 | —CH₂— |
| 117 | 1 | 3,4'-dimethylbiphenyl | bithiophene | 4 | 0 | 1 | —CH₂— |
| 118 | 1 | 3,4'-dimethylbiphenyl | 2-phenyl-5-tolyl-1,3,4-oxadiazole | 4 | 0 | 1 | —CH₂— |
| 119 | 1 | 3,4'-dimethylbiphenyl | 2-(4-tert-butylphenyl)-5-(biphenyl)-1,3,4-oxadiazole | 4 | 0 | 1 | —CH₂— |
| 120 | 1 | 3,4'-dimethoxybiphenyl (OCH₃, H₃CO) | thiophene | 4 | 0 | 1 | —CH₂CH₂— |

TABLE 19
| Structure | k | X | Ar | Bonding Position | i | j | T |
|---|---|---|---|---|---|---|---|
| 121 | 1 | 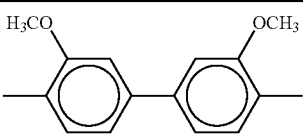 | 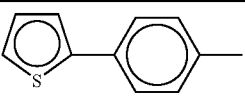 | 4 | 0 | 1 | —CH$_2$— |
| 122 | 1 | 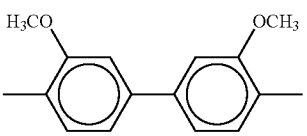 | 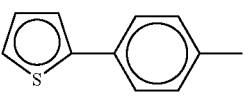 | 4 | 1 | 1 | —CH$_2$CH$_2$— |
| 123 | 1 | 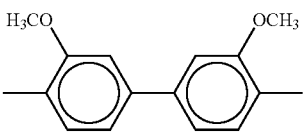 | 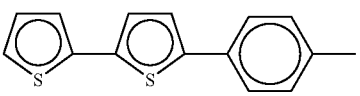 | 4 | 0 | 1 | —CH$_2$CH$_2$— |
| 124 | 1 | 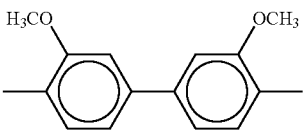 | 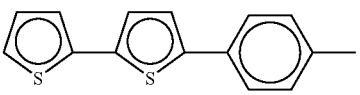 | 4 | 0 | 1 | 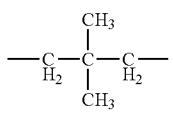 |
| 125 | 1 | 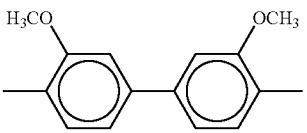 | 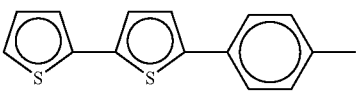 | 4 | 0 | 0 | — |
| 126 | 1 | 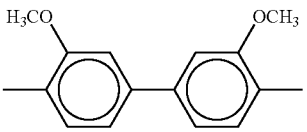 | 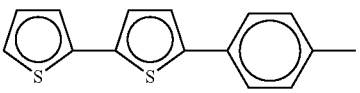 | 4 | 0 | 1 | —CH$_2$— |
| 127 | 1 | 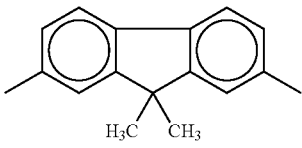 | 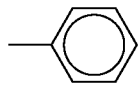 | 4 | 0 | 1 | —CH$_2$CH$_2$— |
TABLE 20
| Structure | k | X | Ar | Bonding Position | i | j | T |
|---|---|---|---|---|---|---|---|
| 128 | 1 | 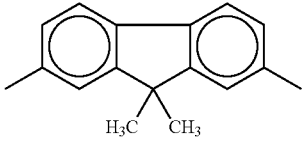 | 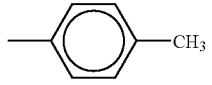 | 4 | 0 | 1 | —CH$_2$CH$_2$— |
| 129 | 1 | 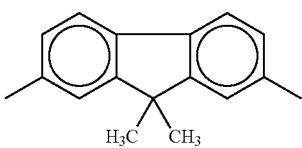 | 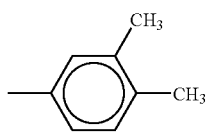 | 4 | 0 | 1 | —CH$_2$CH$_2$— |

TABLE 20-continued

| Structure | k | X | Ar | Bonding Position | i | j | T |
|---|---|---|---|---|---|---|---|
| 130 | 1 | 2,7-dimethyl-9,9-dimethylfluorene | 4-biphenyl | 4 | 0 | 1 | —CH$_2$CH$_2$— |
| 131 | 1 | 2,7-dimethyl-9,9-dimethylfluorene | 4-terphenyl | 4 | 0 | 1 | —CH$_2$CH$_2$— |
| 132 | 1 | 2,7-dimethyl-9,9-dimethylfluorene | 1-naphthyl | 4 | 0 | 1 | —CH$_2$CH$_2$— |
| 133 | 1 | 2,7-dimethyl-9,9-dimethylfluorene | 2,7-dimethyl-9,9-dimethylfluorene | 4 | 0 | 1 | —CH$_2$CH$_2$— |

TABLE 21

| Structure | k | X | Ar | Bonding Position | i | j | T |
|---|---|---|---|---|---|---|---|
| 134 | 1 | 2,7-dimethyl-9,9-dimethylfluorene | 9-phenanthryl | 4 | 0 | 1 | —CH$_2$CH$_2$— |
| 135 | 1 | 2,7-dimethyl-9,9-dimethylfluorene | 4-stilbenyl | 4 | 0 | 1 | —CH$_2$CH$_2$— |
| 136 | 1 | 2,7-dimethyl-9,9-dimethylfluorene | 2-thienyl | 4 | 0 | 1 | —CH$_2$CH$_2$— |
| 137 | 1 | 2,7-dimethyl-9,9-dimethylfluorene | 5-(2-thienyl)phenyl | 4 | 0 | 1 | —CH$_2$CH$_2$— |

TABLE 21-continued
| Structure | k | X | Ar | Bonding Position | i | j | T |
|---|---|---|---|---|---|---|---|
| 138 | 1 | 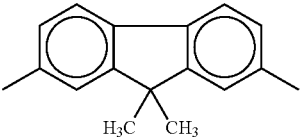 | 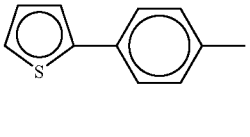 | 4 | 0 | 1 | —(CH$_2$)$_4$— |
| 139 | 1 | 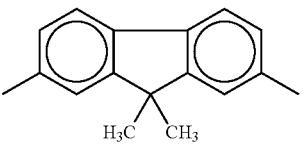 | 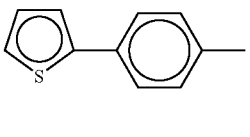 | 4 | 0 | 1 | 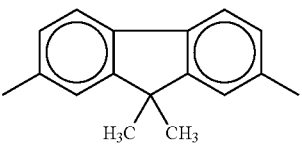 |
TABLE 22
| Structure | k | X | Ar | Bonding Position | i | j | T |
|---|---|---|---|---|---|---|---|
| 140 | 1 | 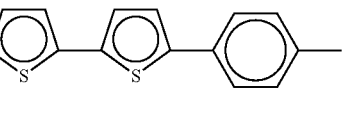 | 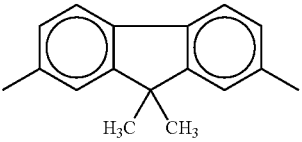 | 4 | 0 | 1 | —CH$_2$CH$_2$— |
| 141 | 1 | 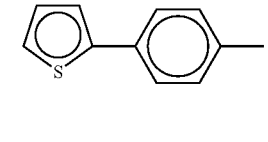 | 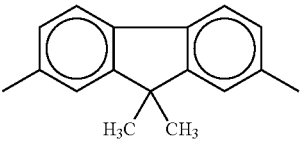 | 4 | 0 | 0 | — |
| 142 | 1 | 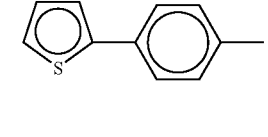 | 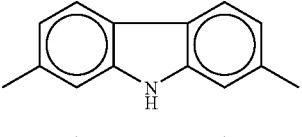 | 4 | 0 | 1 | —CH$_2$— |
| 143 | 1 | 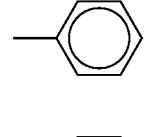 | 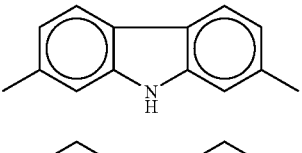 | 3 | 0 | 0 | — |
| 144 | 1 | 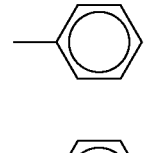 | 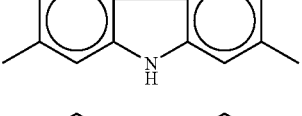 | 4 | 0 | 0 | — |
| 145 | 1 | 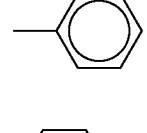 | 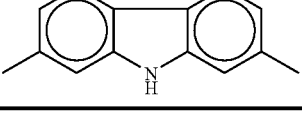 | 4 | 0 | 1 | —CH$_2$CH$_2$— |
| 146 | 1 | 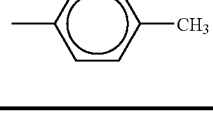 |  | 4 | 1 | 0 | — |

TABLE 23

| Structure | k | X | Ar | Bonding Position | i | j | T |
|---|---|---|---|---|---|---|---|
| 147 | 1 | carbazole | dimethylphenyl (2,4-CH₃) | 4 | 0 | 1 | —CH₂— |
| 148 | 1 | carbazole | methoxyphenyl | 4 | 0 | 1 | —C(CH₃)₂C(CH₃)₂— (neopentyl-type with CH₂-C(CH₃)₂-CH₂) |
| 149 | 1 | carbazole | biphenyl | 4 | 0 | 1 | —CH₂CH₂— |
| 150 | 1 | carbazole | terphenyl | 4 | 0 | 1 | —CH₂CH₂— |
| 151 | 1 | carbazole | naphthyl (1-) | 4 | 0 | 1 | —CH₂CH₂— |
| 152 | 1 | carbazole | naphthyl (2-) | 4 | 0 | 1 | —CH₂CH₂— |

TABLE 24

| Structure | k | X | Ar | Bonding Position | i | j | T |
|---|---|---|---|---|---|---|---|
| 153 | 1 | carbazole | 9,9-dimethylfluorenyl | 4 | 0 | 1 | —CH₂CH₂— |
| 154 | 1 | carbazole | phenanthrenyl | 4 | 0 | 1 | —CH₂CH₂— |

TABLE 24-continued
| Structure | k | X | Ar | Bonding Position | i | j | T |
|---|---|---|---|---|---|---|---|
| 155 | 1 | 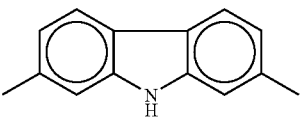 | 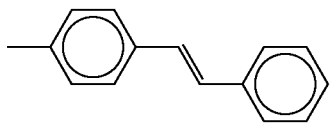 | 4 | 0 | 1 | —CH$_2$CH$_2$— |
| 156 | 1 | 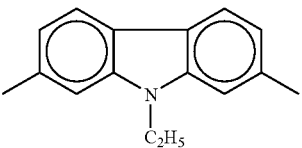 | 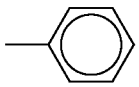 | 4 | 0 | 1 | —CH$_2$CH$_2$— |
| 157 | 1 | 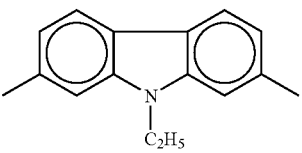 |  | 4 | 0 | 1 | —CH$_2$CH$_2$— |
| 158 | 1 | 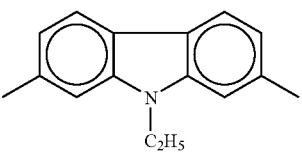 | 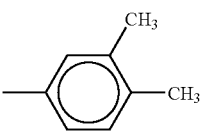 | 4 | 0 | 1 | —CH$_2$CH$_2$— |
TABLE 25
| Structure | k | X | Ar | Bonding Position | i | j | T |
|---|---|---|---|---|---|---|---|
| 159 | 1 | 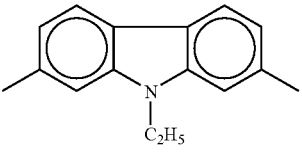 | 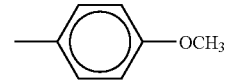 | 4 | 0 | 1 | —CH$_2$CH$_2$— |
| 160 | 1 | 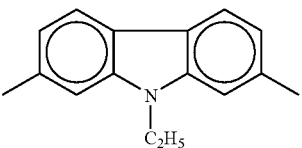 | 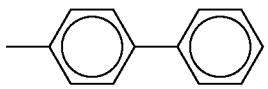 | 4 | 0 | 1 | —CH$_2$CH$_2$— |
| 161 | 1 | 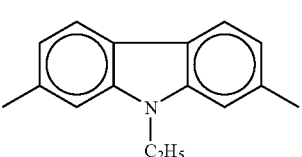 | 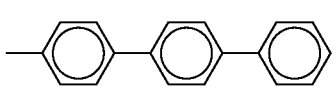 | 4 | 0 | 1 | —CH$_2$CH$_2$— |
| 162 | 1 | 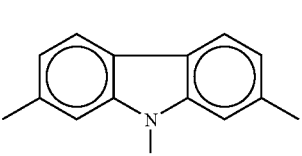 | 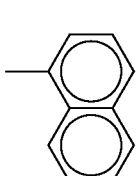 | 4 | 0 | 1 | —CH$_2$CH$_2$— |

TABLE 25-continued
| Structure | k | X | Ar | Bonding Position | i | j | T |
|---|---|---|---|---|---|---|---|
| 163 | 1 | 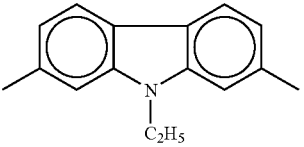 | 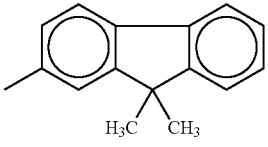 | 4 | 0 | 1 | —CH$_2$CH$_2$— |
| 164 | 1 | 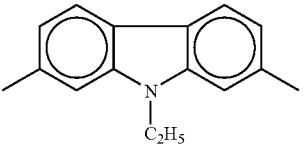 | 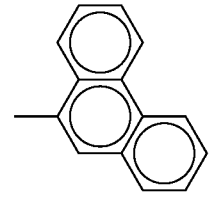 | 4 | 0 | 1 | —CH$_2$CH$_2$— |
TABLE 26
| Structure | k | X | Ar | Bonding Position | i | j | T |
|---|---|---|---|---|---|---|---|
| 165 | 1 | 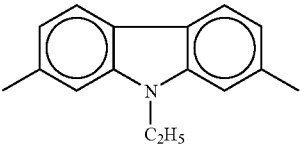 | 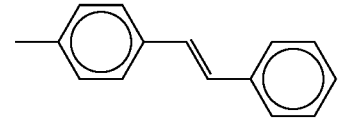 | 4 | 0 | 1 | —CH$_2$CH$_2$— |
| 166 | 1 | 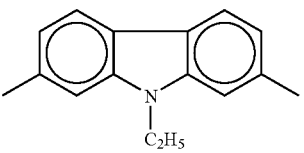 | 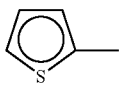 | 4 | 0 | 1 | —CH$_2$CH$_2$— |
| 167 | 1 | 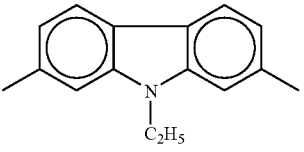 | 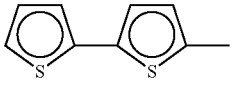 | 4 | 0 | 1 | —CH$_2$CH$_2$— |
| 168 | 1 | 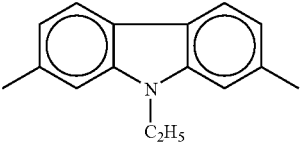 | 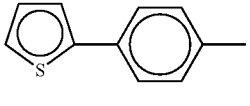 | 4 | 0 | 1 | —CH$_2$CH$_2$— |
| 169 | 1 | 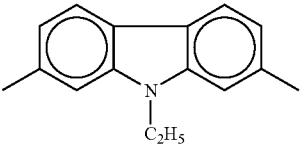 | 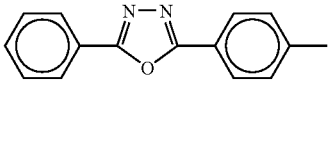 | 4 | 0 | 1 | —CH$_2$CH$_2$— |

TABLE 26-continued

| Structure | k | X | Ar | Bonding Position | i | j | T |
|---|---|---|---|---|---|---|---|
| 170 | 1 | (pyrene with two methyl substituents) | (thiophene-phenyl) | 4 | 0 | 1 | —CH$_2$CH$_2$— |

TABLE 27

| Structure | k | X | Ar | Bonding Position | i | j | T |
|---|---|---|---|---|---|---|---|
| 171 | 1 | (pyrene with two methyl substituents) | (thiophene-phenyl) | 4 | 0 | 0 | — |
| 172 | 1 | (pyrene with two methyl substituents) | (thiophene-phenyl) | 4 | 0 | 1 | —CH$_2$— |
| 173 | 1 | (terphenyl) | (phenyl) | 4 | 0 | 0 | — |
| 174 | 1 | (terphenyl) | (phenyl-CH$_3$) | 4 | 1 | 0 | — |
| 175 | 1 | (terphenyl) | (dimethylphenyl) | 4 | 0 | 1 | —CH$_2$CH$_2$— |
| 176 | 1 | (terphenyl) | (biphenyl) | 4 | 0 | 1 | —CH$_2$CH$_2$— |

TABLE 28

| Structure | k | X | Ar | Bonding Position | i | j | T |
|---|---|---|---|---|---|---|---|
| 177 | 1 | (terphenyl) | (terphenyl) | 4 | 0 | 1 | —CH$_2$CH$_2$— |

TABLE 28-continued

| Structure | k | X | Ar | Bonding Position | i | j | T |
|---|---|---|---|---|---|---|---|
| 178 | 1 | (terphenyl) | (naphthyl) | 4 | 0 | 1 | —CH$_2$CH$_2$— |
| 179 | 1 | (terphenyl) | (phenanthryl) | 4 | 0 | 1 | —CH$_2$CH$_2$— |
| 180 | 1 | (terphenyl) | (fluorenyl) | 4 | 0 | 1 | —CH$_2$CH$_2$— |
| 181 | 1 | (terphenyl) | (9,9-dimethylfluorenyl) | 4 | 0 | 1 | —CH$_2$CH$_2$— |

TABLE 29

| Structure | k | X | Ar | Bonding Position | i | j | T |
|---|---|---|---|---|---|---|---|
| 182 | 1 | (terphenyl) | (stilbenyl) | 4 | 0 | 1 | —CH$_2$CH$_2$— |
| 183 | 1 | (terphenyl) | (thienyl-phenyl) | 4 | 0 | 1 | —CH$_2$CH$_2$— |
| 184 | 1 | (terphenyl) | (bithienyl-phenyl) | 4 | 0 | 1 | —CH$_2$CH$_2$— |
| 185 | 1 | (terphenyl) | (thienyl) | 4 | 0 | 1 | —CH$_2$— |
| 186 | 1 | (terphenyl) | (thienyl) | 4 | 0 | 1 | —CH$_2$CH$_2$— |
| 187 | 1 | (terphenyl) | (bithienyl) | 4 | 0 | 1 | —CH$_2$CH$_2$— |

TABLE 29-continued
| Structure | k | X | Ar | Bonding Position | i | j | T |
|---|---|---|---|---|---|---|---|
| 188 | 1 |  | 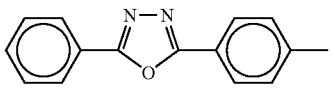 | 4 | 0 | 1 | —CH$_2$CH$_2$— |
TABLE 30
| Structure | k | X | Ar | Bonding Position | i | j | T |
|---|---|---|---|---|---|---|---|
| 189 | 1 |  | 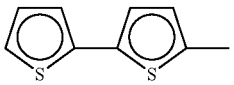 | 4 | 0 | 1 | — |
| 190 | 1 |  | 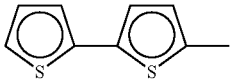 | 4 | 0 | 1 | —CH$_2$— |
| 191 | 1 | 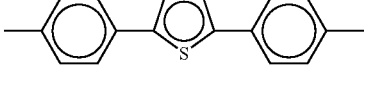 | 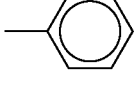 | 4 | 0 | 1 | —CH$_2$— |
| 192 | 1 | 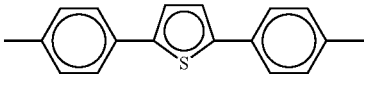 | 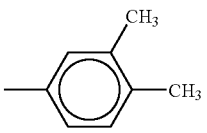 | 4 | 0 | 1 | —CH$_2$CH$_2$— |
| 193 | 1 | 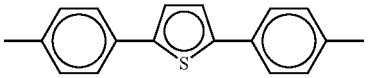 | 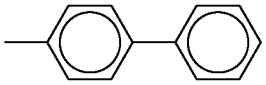 | 4 | 0 | 1 | 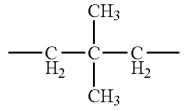 |
| 194 | 1 | 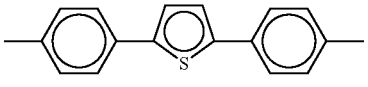 | 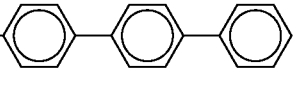 | 4 | 0 | 1 | —CH$_2$CH$_2$— |
| 195 | 1 | 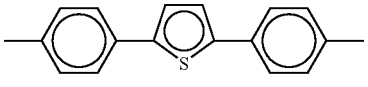 |  | 4 | 0 | 1 | —CH$_2$CH$_2$— |
TABLE 31
| Structure | k | X | Ar | Bonding Position | i | j | T |
|---|---|---|---|---|---|---|---|
| 196 | 1 | 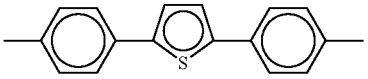 | 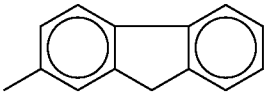 | 4 | 0 | 1 | —CH$_2$CH$_2$— |

TABLE 31-continued

| Structure | k | X | Ar | Bonding Position | i | j | T |
|---|---|---|---|---|---|---|---|
| 197 | 1 | (phenyl-thiophene-phenyl) | 9,9-dimethylfluorene | 4 | 0 | 1 | —CH₂CH₂— |
| 198 | 1 | (phenyl-thiophene-phenyl) | triphenylene | 4 | 0 | 1 | —CH₂CH₂— |
| 199 | 1 | (phenyl-thiophene-phenyl) | (thiophene-phenyl) | 4 | 0 | 1 | —CH₂CH₂— |
| 200 | 1 | (phenyl-thiophene-phenyl) | (thiophene-thiophene-phenyl) | 4 | 0 | 1 | —CH₂CH₂— |
| 201 | 1 | (phenyl-thiophene-phenyl) | thiophene | 4 | 0 | 1 | —CH₂CH₂— |
| 202 | 1 | (phenyl-thiophene-phenyl) | thiophene | 4 | 0 | 1 | —(CH₂)₃— |

TABLE 32

| Structure | k | X | Ar | Bonding Position | i | j | T |
|---|---|---|---|---|---|---|---|
| 203 | 1 | (phenyl-thiophene-phenyl) | (thiophene-thiophene) | 4 | 0 | 1 | —CH₂CH₂— |
| 204 | 1 | (phenyl-thiophene-phenyl) | 2,5-diphenyl-1,3,4-oxadiazole | 4 | 0 | 1 | —CH₂CH₂— |
| 205 | 1 | (phenyl-thiophene-phenyl) | (thiophene-thiophene) | 4 | 0 | 0 | — |
| 206 | 1 | (phenyl-thiophene-phenyl) | (thiophene-thiophene) | 4 | 0 | 1 | —CH₂— |
| 207 | 1 | (phenyl-thiophene-thiophene-phenyl) | phenyl | 4 | 0 | 1 | —CH₂CH₂— |

TABLE 32-continued

| Structure | k | X | Ar | Bonding Position | i | j | T |
|---|---|---|---|---|---|---|---|
| 208 | 1 | [phenyl-thiophene-thiophene-phenyl] | [dimethylphenyl with 2 CH₃] | 4 | 0 | 1 | —CH₂CH₂— |
| 209 | 1 | [phenyl-thiophene-thiophene-phenyl] | [naphthyl] | 4 | 0 | 1 | —CH₂CH₂— |

TABLE 33

| Structure | k | X | Ar | Bonding Position | i | j | T |
|---|---|---|---|---|---|---|---|
| 210 | 1 | [phenyl-thiophene-thiophene-phenyl] | [phenanthryl] | 4 | 0 | 1 | —CH₂CH₂— |
| 211 | 1 | [phenyl-thiophene-thiophene-phenyl] | [9,9-dimethylfluorenyl] | 4 | 0 | 1 | —CH₂CH₂— |
| 212 | 1 | [phenyl-thiophene-thiophene-phenyl] | [stilbenyl] | 4 | 0 | 1 | —CH₂CH₂— |
| 213 | 1 | [phenyl-thiophene-thiophene-phenyl] | [thienyl-phenyl] | 4 | 0 | 1 | —CH₂CH₂— |
| 214 | 1 | [phenyl-thiophene-thiophene-phenyl] | [bithienyl-phenyl] | 4 | 0 | 1 | —CH₂CH₂— |
| 215 | 1 | [phenyl-thiophene-thiophene-phenyl] | [thienyl] | 4 | 0 | 1 | —CH₂CH₂— |
| 216 | 1 | [phenyl-thiophene-thiophene-phenyl] | [bithienyl] | 4 | 0 | 1 | —CH₂CH₂— |

TABLE 34

| Structure | k | X | Ar | Bonding Position | i | j | T |
|---|---|---|---|---|---|---|---|
| 217 | 1 | phenyl-thiophene-thiophene-phenyl | phenyl-oxadiazole-phenyl | 4 | 0 | 1 | —CH₂CH₂— |
| 218 | 1 | phenyl-thiophene-thiophene-phenyl | thiophene-thiophene-phenyl | 4 | 0 | 0 | — |
| 219 | 1 | phenyl-thiophene-thiophene-phenyl | thiophene-thiophene-phenyl | 4 | 0 | 1 | —CH₂— |
| 220 | 1 | phenyl-oxadiazole-phenyl | phenyl | 4 | 0 | 1 | —CH₂— |
| 221 | 1 | phenyl-oxadiazole-phenyl | dimethylphenyl | 4 | 0 | 1 | —CH₂— |
| 222 | 1 | phenyl-oxadiazole-phenyl | naphthyl | 4 | 0 | 0 | — |

TABLE 35

| Structure | k | X | Ar | Bonding Position | i | j | T |
|---|---|---|---|---|---|---|---|
| 223 | 1 | phenyl-oxadiazole-phenyl | phenanthrenyl | 4 | 0 | 1 | —(CH₂)₃— |
| 224 | 1 | phenyl-oxadiazole-phenyl | 9,9-dimethylfluorenyl | 4 | 0 | 1 | —CH₂CH₂— |
| 225 | 1 | phenyl-oxadiazole-phenyl | thiophene-phenyl | 4 | 0 | 1 | —CH₂CH₂— |
| 226 | 1 | phenyl-oxadiazole-phenyl | phenyl-thiophene-thiophene-phenyl | 4 | 0 | 1 | —CH₂CH₂— |

TABLE 35-continued
| Structure | k | X | Ar | Bonding Position | i | j | T |
|---|---|---|---|---|---|---|---|
| 227 | 1 | 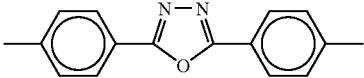 | 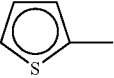 | 4 | 0 | 1 | —CH$_2$CH$_2$— |
| 228 | 1 | 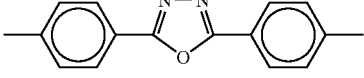 | 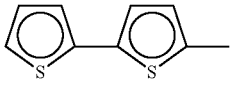 | 4 | 0 | 1 | —CH$_2$— |
| 229 | 1 | 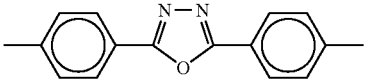 | 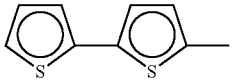 | 4 | 0 | 1 | —(CH$_2$)$_3$— |
TABLE 36
| Structure | k | X | Ar | Bonding Position | i | j | T |
|---|---|---|---|---|---|---|---|
| 230 | 1 | 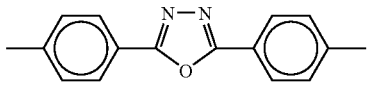 | 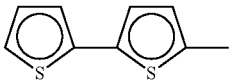 | 4 | 0 | 0 | — |
| 231 | 1 | 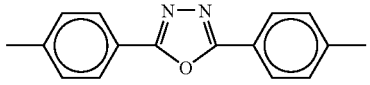 | 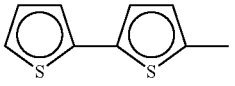 | 4 | 0 | 1 | —CH$_2$— |
| 232 | 1 | 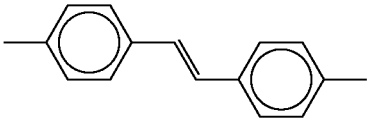 | 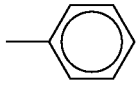 | 4 | 0 | 1 | —CH$_2$CH$_2$— |
| 233 | 1 | 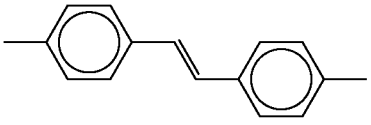 | 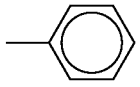 | 4 | 0 | 1 | —CH$_2$— |
| 234 | 1 | 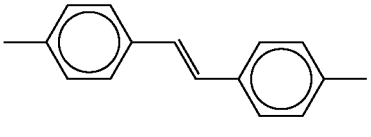 | 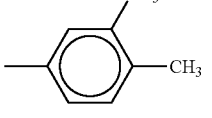 | 4 | 0 | 1 | —CH$_2$— |
| 235 | 1 | 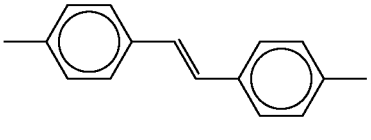 | 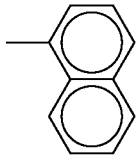 | 4 | 0 | 1 | —CH$_2$— |

TABLE 37
| Structure | k | X | Ar | Bonding Position | i | j | T |
|---|---|---|---|---|---|---|---|
| 236 | 1 | 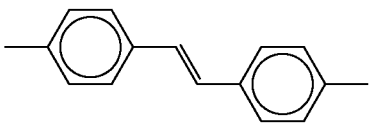 | 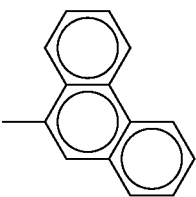 | 4 | 0 | 1 | —CH$_2$CH$_2$— |
| 237 | 1 | 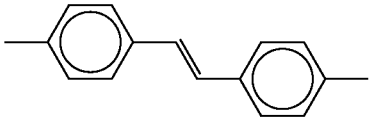 | 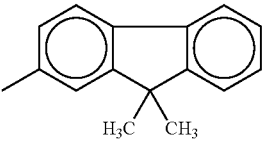 | 4 | 0 | 1 | —CH$_2$— |
| 238 | 1 | 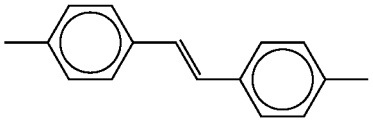 | 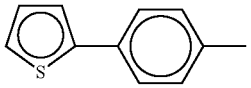 | 4 | 0 | 1 | —CH$_2$CH$_2$— |
| 239 | 1 | 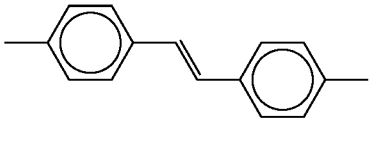 | 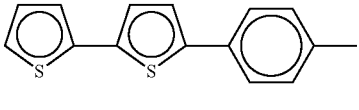 | 4 | 0 | 1 | —CH$_2$CH$_2$— |
| 240 | 1 | 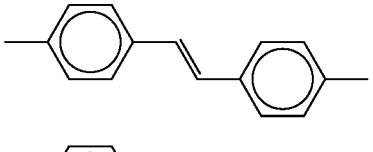 | 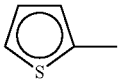 | 4 | 0 | 1 | —CH$_2$CH$_2$— |
| 241 | 1 | 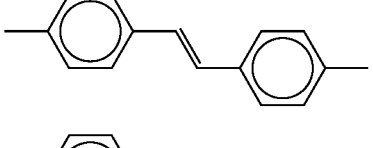 | 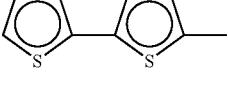 | 4 | 0 | 1 | —CH$_2$— |
| 242 | 1 | 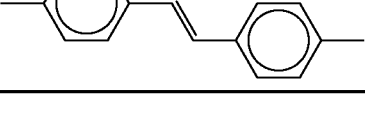 | 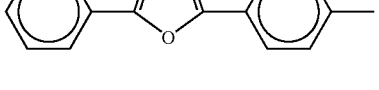 | 4 | 0 | 1 | —(CH$_2$)$_3$— |
TABLE 38
| Structure | k | X | Ar | Bonding Position | i | j | T |
|---|---|---|---|---|---|---|---|
| 243 | 1 | 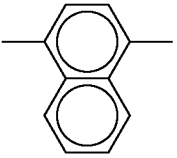 | 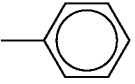 | 4 | 0 | 1 | —CH$_2$CH$_2$— |

TABLE 38-continued
| Structure | k | X | Ar | Bonding Position | i | j | T |
|---|---|---|---|---|---|---|---|
| 244 | 1 | 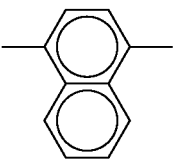 | 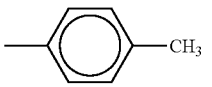 | 4 | 0 | 1 | —CH$_2$— |
| 245 | 1 | 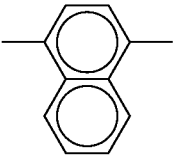 | 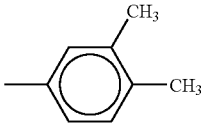 | 4 | 0 | 1 | —CH$_2$— |
| 246 | 1 | 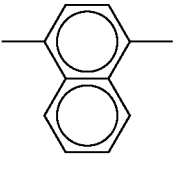 | 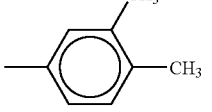 | 4 | 0 | 1 | —CH$_2$— |
| 247 | 1 | 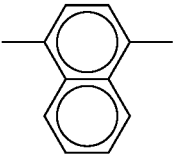 | 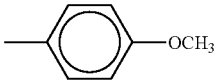 | 4 | 0 | 1 | —CH$_2$CH$_2$— |
| 248 | 1 | 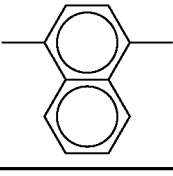 | 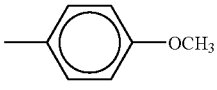 | 4 | 0 | 1 | —CH$_2$— |
TABLE 39
| Structure | k | X | Ar | Bonding Position | i | j | T |
|---|---|---|---|---|---|---|---|
| 249 | 1 | 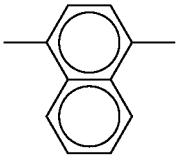 | 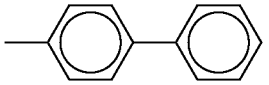 | 4 | 0 | 1 | —CH$_2$CH$_2$— |
| 250 | 1 | 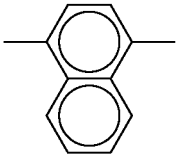 | 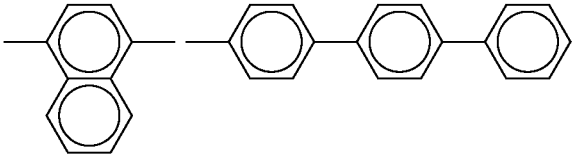 | 4 | 0 | 1 | —CH$_2$— |

TABLE 39-continued
| Structure | k | X | Ar | Bonding Position | i | j | T |
|---|---|---|---|---|---|---|---|
| 251 | 1 | 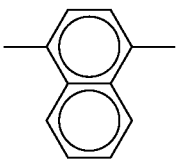 | 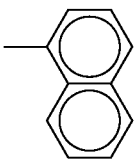 | 4 | 0 | 1 | —CH₂CH₂— |
| 252 | 1 | 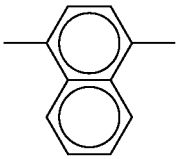 | 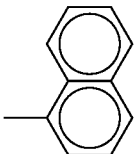 | 4 | 0 | 1 | —CH₂— |
| 253 | 1 | 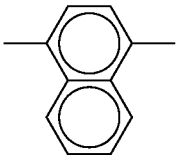 | 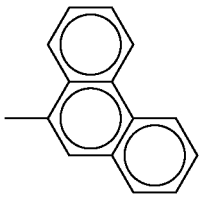 | 4 | 0 | 1 | —CH₂— |
TABLE 40
| Structure | k | X | Ar | Bonding Position | i | j | T |
|---|---|---|---|---|---|---|---|
| 254 | 1 | 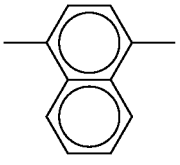 | 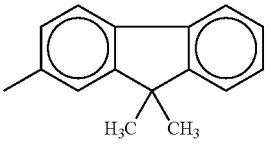 | 4 | 0 | 1 | —CH₂— |
| 255 | 1 | 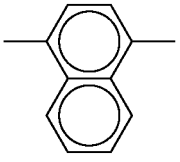 | 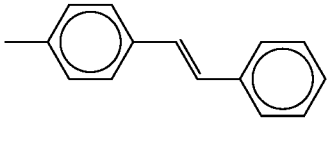 | 4 | 0 | 1 | —CH₂CH₂— |
| 256 | 1 | 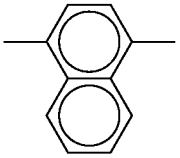 | 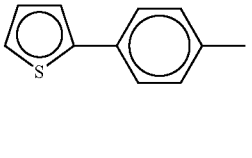 | 4 | 1 | 1 | —CH₂— |
| 257 | 1 | 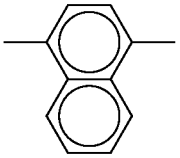 | 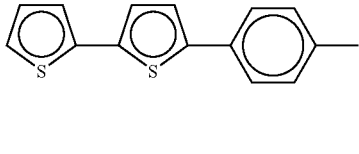 | 4 | 0 | 1 | —CH₂— |

TABLE 40-continued
| Structure | k | X | Ar | Bonding Position | i | j | T |
|---|---|---|---|---|---|---|---|
| 258 | 1 | 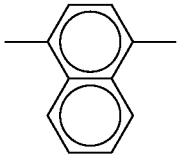 | 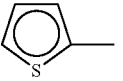 | 4 | 0 | 1 | —CH$_2$CH$_2$— |
TABLE 41
| Structure | k | X | Ar | Bonding Position | i | j | T |
|---|---|---|---|---|---|---|---|
| 259 | 1 | 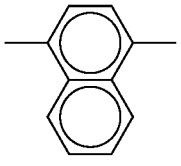 | 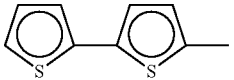 | 4 | 0 | 1 | —CH$_2$— |
| 260 | 1 | 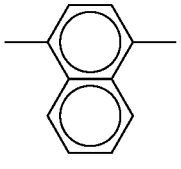 | 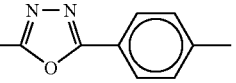 | 4 | 0 | 1 | —CH$_2$CH$_2$— |
| 261 | 1 | 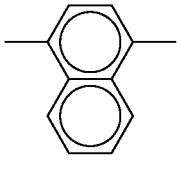 | 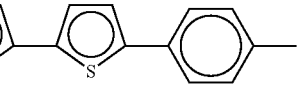 | 4 | 0 | 1 | —(CH$_2$)$_3$— |
| 262 | 1 | 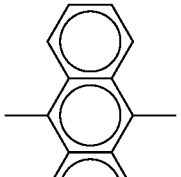 | 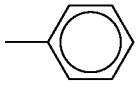 | 4 | 0 | 1 | —CH$_2$CH$_2$— |
| 263 | 1 | 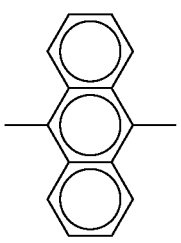 | 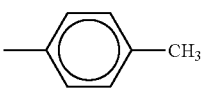 | 4 | 0 | 1 | —CH$_2$CH$_2$— |

TABLE 42

| Structure | k | X | Ar | Bonding Position | i | j | T |
|---|---|---|---|---|---|---|---|
| 264 | 1 | anthracene | dimethylphenyl (CH₃, CH₃) | 4 | 0 | 1 | —CH$_2$— |
| 265 | 1 | anthracene | dimethylphenyl (CH₃, CH₃) | 4 | 0 | 1 | —CH$_2$CH$_2$— |
| 266 | 1 | anthracene | —OCH$_3$ phenyl | 4 | 0 | 1 | —CH$_2$— |
| 267 | 1 | anthracene | —OCH$_3$ phenyl | 4 | 0 | 1 | —CH$_2$CH$_2$— |

TABLE 43

| Structure | k | X | Ar | Bonding Position | i | j | T |
|---|---|---|---|---|---|---|---|
| 268 | 1 | anthracene | biphenyl | 4 | 0 | 1 | —CH$_2$— |

TABLE 43-continued
| Structure | k | X | Ar | Bonding Position | i | j | T |
|---|---|---|---|---|---|---|---|
| 269 | 1 | 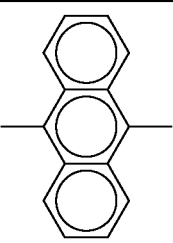 | 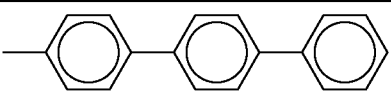 | 4 | 0 | 1 | —CH$_2$CH$_2$— |
| 270 | 1 | 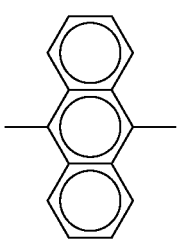 | 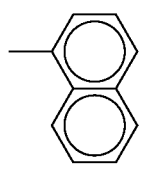 | 4 | 0 | 1 | —CH$_2$CH$_2$— |
| 271 | 1 | 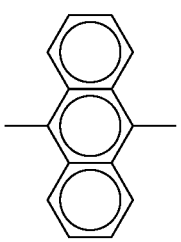 | 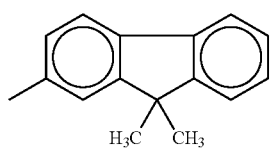 | 4 | 0 | 1 | —CH$_2$CH$_2$— |
TABLE 44
| Structure | k | X | Ar | Bonding Position | i | j | T |
|---|---|---|---|---|---|---|---|
| 272 | 1 | 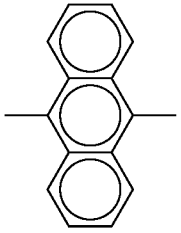 | 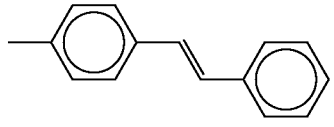 | 4 | 0 | 1 | —CH$_2$CH$_2$— |
| 273 | 1 | 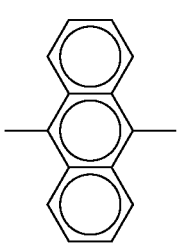 | 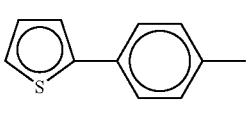 | 4 | 0 | 1 | —CH$_2$CH$_2$— |

TABLE 44-continued
| Structure | k | X | Ar | Bonding Position | i | j | T |
|---|---|---|---|---|---|---|---|
| 274 | 1 | 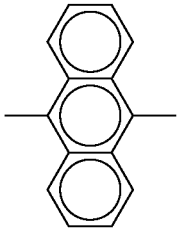 | 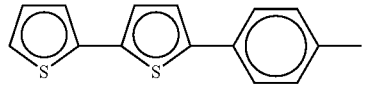 | 4 | 0 | 1 | —CH$_2$CH$_2$— |
TABLE 45
| Structure | k | X | Ar | Bonding Position | i | j | T |
|---|---|---|---|---|---|---|---|
| 275 | 1 | 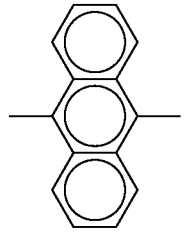 | 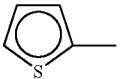 | 4 | 0 | 1 | —CH$_2$CH$_2$— |
| 276 | 1 | 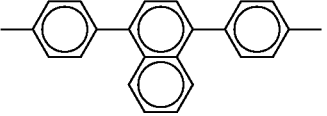 | 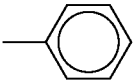 | 4 | 0 | 1 | —CH$_2$— |
| 277 | 1 | 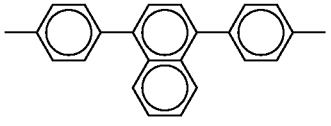 | 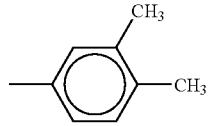 | 4 | 0 | 1 | —CH$_2$— |
| 278 | 1 | 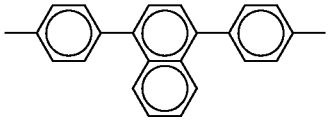 | 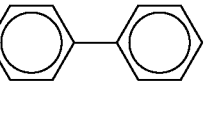 | 4 | 0 | 1 | —CH$_2$CH$_2$— |
TABLE 46
| Structure | k | X | Ar | Bonding Position | i | j | T |
|---|---|---|---|---|---|---|---|
| 279 | 1 | 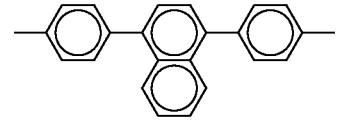 | 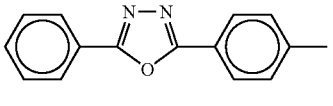 | 4 | 0 | 1 | —CH$_2$— |

TABLE 46-continued
| Structure | k | X | Ar | Bonding Position | i | j | T |
|---|---|---|---|---|---|---|---|
| 280 | 1 | 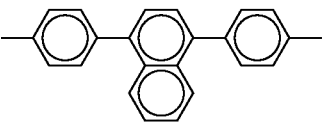 | 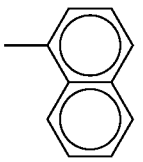 | 4 | 0 | 1 | —CH$_2$CH$_2$— |
| 281 | 1 | 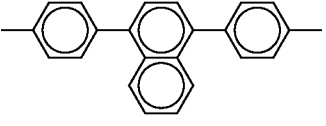 | 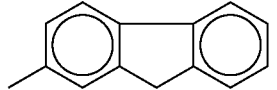 | 4 | 0 | 1 | —CH$_2$CH$_2$— |
| 282 | 1 | 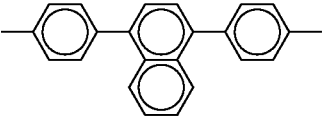 | 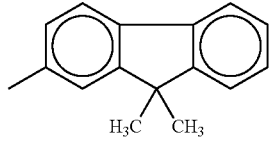 | 4 | 0 | 1 | —CH$_2$CH$_2$— |
TABLE 47
| Structure | k | X | Ar | Bonding Position | i | j | T |
|---|---|---|---|---|---|---|---|
| 283 | 1 | 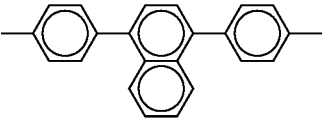 | 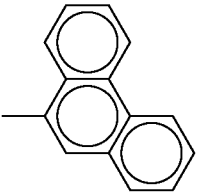 | 4 | 0 | 1 | —CH$_2$CH$_2$— |
| 284 | 1 | 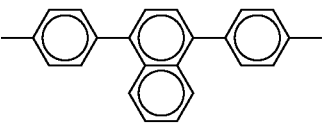 | 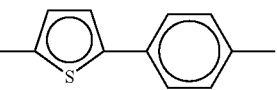 | 4 | 0 | 1 | —CH$_2$CH$_2$— |
| 285 | 1 | 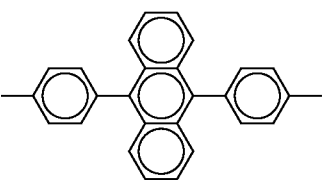 | 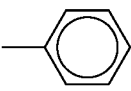 | 4 | 0 | 1 | —CH$_2$CH$_2$— |
| 286 | 1 | 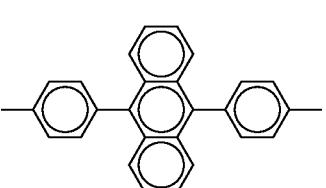 | 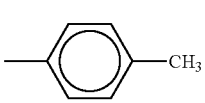 | 4 | 0 | 1 | —CH$_2$CH$_2$— |

TABLE 48
| Structure | k | X | Ar | Bonding Position | i | j | T |
|---|---|---|---|---|---|---|---|
| 287 | 1 | 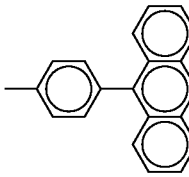 | 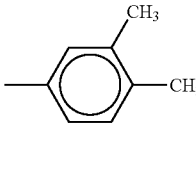 | 4 | 0 | 1 | —CH$_2$CH$_2$— |
| 288 | 1 | 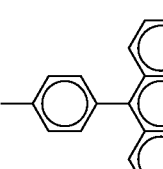 | 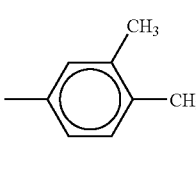 | 4 | 0 | 1 | —CH$_2$CH$_2$— |
| 289 | 1 | 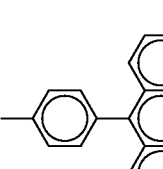 | 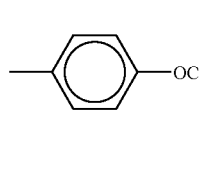 | 4 | 0 | 1 | —CH$_2$— |
| 290 | 1 | 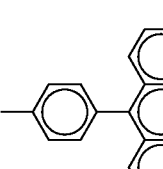 | 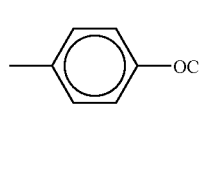 | 4 | 0 | 1 | —(CH$_2$)$_3$— |
TABLE 49
| Structure | k | X | Ar | Bonding Position | i | j | T |
|---|---|---|---|---|---|---|---|
| 291 | 1 | 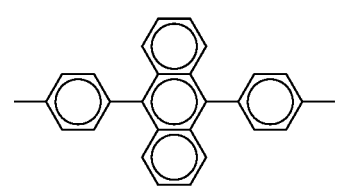 | 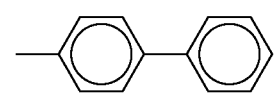 | 4 | 0 | 1 | —CH$_2$CH$_2$— |
| 292 | 1 | 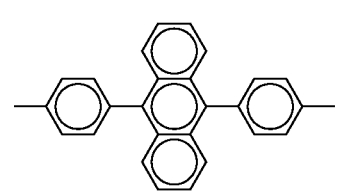 | 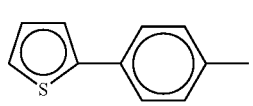 | 4 | 0 | 1 | —CH$_2$CH$_2$— |

TABLE 49-continued

| Structure | k | X | Ar | Bonding Position | i | j | T |
|---|---|---|---|---|---|---|---|
| 293 | 1 | (9,10-diphenylanthracene-diyl) | (bithiophene-phenylene) | 4 | 0 | 1 | —CH$_2$CH$_2$— |
| 294 | 1 | (9,10-diphenylanthracene-diyl) | (thiophene) | 4 | 0 | 1 | —CH$_2$— |

TABLE 50

| Structure | k | X | Ar | Bonding Position | i | j | T |
|---|---|---|---|---|---|---|---|
| 295 | 1 | (9,10-diphenylanthracene-diyl) | (bithiophene) | 4 | 0 | 1 | —CH$_2$— |
| 296 | 1 | (9,10-diphenylanthracene-diyl) | (2,5-diphenyl-1,3,4-oxadiazole) | 4 | 0 | 1 | —CH$_2$— |
| 297 | 1 | (9,9'-spirobifluorene-diyl) | (phenylene) | 4 | 0 | 1 | —CH$_2$CH$_2$— |
| 298 | 1 | (9,9'-spirobifluorene-diyl) | (methylphenylene) | 4 | 0 | 1 | —CH$_2$CH$_2$— |

TABLE 51

| Structure | k | X | Ar | Bonding Position | i | j | T |
|---|---|---|---|---|---|---|---|
| 299 | 1 | spirobifluorene | 2,4-dimethylphenyl | 4 | 0 | 1 | —CH$_2$— |
| 300 | 1 | spirobifluorene | 2,4-dimethylphenyl | 4 | 0 | 1 | —(CH$_2$)$_3$— |
| 301 | 1 | spirobifluorene | 4-methoxyphenyl | 4 | 0 | 1 | —CH$_2$CH$_2$— |
| 302 | 1 | spirobifluorene | 2-thienyl | 4 | 0 | 1 | —CH$_2$CH$_2$— |

TABLE 52

| Structure | k | X | Ar | Bonding Position | i | j | T |
|---|---|---|---|---|---|---|---|
| 303 | 0 | phenylene | phenyl | 4,4 | 0 | 0 | — |
| 304 | 0 | phenylene | phenyl | 4,4 | 1 | 1 | —CH$_2$CH$_2$— |
| 305 | 0 | phenylene | 4-methylphenyl | 4,4 | 0 | 1 | —CH$_2$CH$_2$— |

TABLE 52-continued

| Structure | k | X | Ar | Bonding Position | i | j | T |
|---|---|---|---|---|---|---|---|
| 306 | 0 | (1,3-dimethylphenyl) | (4-methylphenyl) | 4,4 | 0 | 1 | —CH₂—C(CH₃)(CH₃)—CH₂— |
| 307 | 0 | (1,3-dimethylphenyl) | (3,4-dimethylphenyl) | 4,4 | 0 | 1 | —CH₂CH₂— |
| 308 | 0 | (1,3-dimethylphenyl) | (4-ethylphenyl) | 4,4 | 0 | 1 | —CH₂—C(CH₃)(CH₃)—CH₂— |
| 309 | 0 | (methylphenyl) | (phenyl) | 4,4 | 0 | 1 | —CH₂CH₂— |

TABLE 53

| Structure | k | X | Ar | Bonding Position | i | j | T |
|---|---|---|---|---|---|---|---|
| 310 | 0 | (phenyl) | (4-methylphenyl) | 4,4 | 0 | 1 | —CH₂— |
| 311 | 0 | (phenyl) | (3,4-dimethylphenyl) | 4,4 | 0 | 1 | —CH₂CH₂— |
| 312 | 0 | (phenyl) | (4-methoxyphenyl) | 4,4 | 0 | 1 | —CH₂CH₂— |
| 313 | 0 | (phenyl) | (biphenyl) | 4,4 | 0 | 1 | —CH₂— |
| 314 | 0 | (phenyl) | (terphenyl) | 4,4 | 0 | 1 | —CH₂CH₂— |
| 315 | 0 | (phenyl) | (naphthyl) | 4,4 | 0 | 1 | —CH₂—C(CH₃)(CH₃)—CH₂— |

TABLE 54
| Structure | k | X | Ar | Bonding Position | i | j | T |
|---|---|---|---|---|---|---|---|
| 316 | 0 |  | 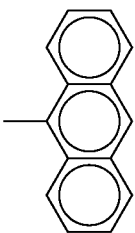 | 4,4 | 0 | 1 | —CH$_2$— |
| 317 | 0 |  | 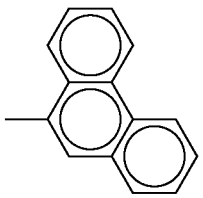 | 4,4 | 0 | 1 | —CH$_2$CH$_2$— |
| 318 | 0 |  | 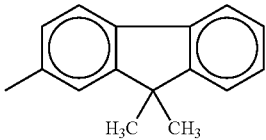 | 4,4 | 0 | 1 | —CH$_2$CH$_2$— |
| 319 | 0 |  | 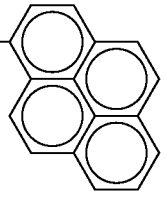 | 4,4 | 0 | 1 | —CH$_2$CH$_2$— |
TABLE 55
| Structure | k | X | Ar | Bonding Position | i | j | T |
|---|---|---|---|---|---|---|---|
| 320 | 0 |  | 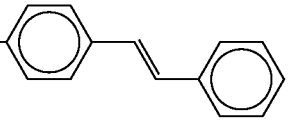 | 4,4 | 0 | 1 | —CH$_2$CH$_2$— |
| 321 | 0 |  | 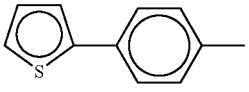 | 4,4 | 0 | 1 | —CH$_2$CH$_2$— |
| 322 | 0 |  | 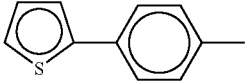 | 4,4 | 0 | 1 | 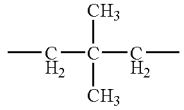 |
| 323 | 0 |  | 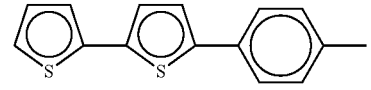 | 4,4 | 0 | 1 | —CH$_2$CH$_2$— |

TABLE 55-continued
| Structure | k | X | Ar | Bonding Position | i | j | T |
|---|---|---|---|---|---|---|---|
| 324 | 0 | 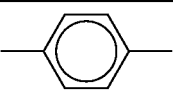 | 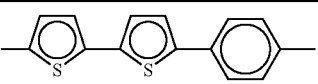 | 4,4 | 0 | 1 | —CH$_2$CH$_2$— |
| 325 | 0 | 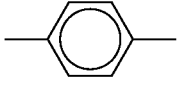 | 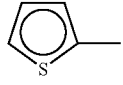 | 4,4 | 0 | 1 | —CH$_2$— |
TABLE 56
| Structure | k | X | Ar | Bonding Position | i | j | T |
|---|---|---|---|---|---|---|---|
| 326 | 0 |  | 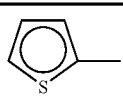 | 4,4 | 0 | 0 | — |
| 327 | 0 |  | 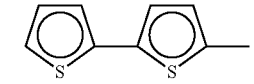 | 4,4 | 1 | 0 | — |
| 328 | 0 | 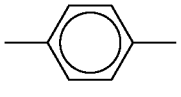 | 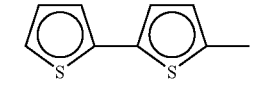 | 4,4 | 0 | 1 | —CH$_2$CH$_2$— |
| 329 | 0 |  | 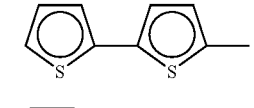 | 4,4 | 1 | 0 | —(CH$_2$)$_4$— |
| 330 | 0 | 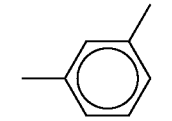 | 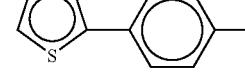 | 4,4 | 0 | 0 | — |
| 331 | 0 |  | 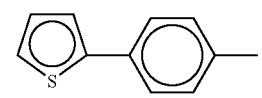 | 4,4 | 0 | 0 | — |
| 332 | 0 |  | 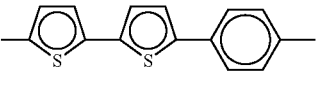 | 4,4 | 0 | 0 | — |
TABLE 57
| Structure | k | X | Ar | Bonding Position | i | j | T |
|---|---|---|---|---|---|---|---|
| 333 | 0 |  | 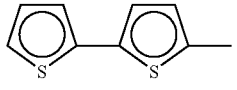 | 4,4 | 0 | 0 | — |

TABLE 57-continued

| Structure | k | X | Ar | Bonding Position | i | j | T |
|---|---|---|---|---|---|---|---|
| 334 | 0 | (dimethylphenyl) | (thiophene-phenyl) | 4,4 | 1 | 1 | —CH$_2$CH$_2$— |
| 335 | 0 | (phenyl) | (thiophene-phenyl) | 4,4 | 1 | 1 | —CH$_2$— |
| 336 | 0 | (phenyl) | (thiophene-phenyl) | 4,4 | 1 | 1 | —CH$_2$CH$_2$— |
| 337 | 0 | (phenyl) | C$_2$H$_5$—(bithiophene-phenyl) | 4,4 | 1 | 1 | —CH$_2$— |
| 338 | 0 | (phenyl) | (bithiophene) | 4,4 | 1 | 1 | —CH$_2$— |
| 339 | 1 | (biphenyl) | (phenyl) | 4,4 | 0 | 1 | —CH$_2$CH$_2$— |

TABLE 58

| Structure | k | X | Ar | Bonding Position | i | j | T |
|---|---|---|---|---|---|---|---|
| 340 | 1 | (biphenyl) | (phenyl)—CH$_3$ | 4,4 | 0 | 1 | —CH$_2$CH$_2$— |
| 341 | 1 | (biphenyl) | (phenyl)—OCH$_3$ | 4,4 | 0 | 1 | —CH$_2$CH$_2$— |
| 342 | 1 | (biphenyl) | (biphenyl) | 4,4 | 0 | 1 | —CH$_2$CH$_2$— |
| 343 | 1 | (biphenyl) | (terphenyl) | 4,4 | 0 | 1 | —CH$_2$CH$_2$— |
| 344 | 1 | (biphenyl) | (naphthyl) | 4,4 | 0 | 1 | —CH$_2$CH$_2$— |

TABLE 58-continued

| Structure | k | X | Ar | Bonding Position | i | j | T |
|---|---|---|---|---|---|---|---|
| 345 | 1 | —⟨phenyl-phenyl⟩— | triphenylene | 4,4 | 0 | 1 | —CH$_2$— |

TABLE 59

| Structure | k | X | Ar | Bonding Position | i | j | T |
|---|---|---|---|---|---|---|---|
| 346 | 1 | —⟨phenyl-phenyl⟩— | fluorene | 4,4 | 0 | 1 | —CH$_2$—C(CH$_3$)$_2$—CH$_2$— |
| 347 | 1 | —⟨phenyl-phenyl⟩— | 9,9-dimethylfluorene | 4,4 | 0 | 1 | —CH$_2$—C(CH$_3$)$_2$—CH$_2$— |
| 348 | 1 | —⟨phenyl-phenyl⟩— | stilbene | 4,4 | 0 | 1 | —CH$_2$CH$_2$— |
| 349 | 1 | —⟨phenyl-phenyl⟩— | diphenylacetylene | 4,4 | 0 | 1 | —CH$_2$CH$_2$— |
| 350 | 1 | —⟨phenyl-phenyl⟩— | anthracene | 4,4 | 0 | 1 | —CH$_2$CH$_2$— |

TABLE 60
| Structure | k | X | Ar | Bonding Position | i | j | T |
|---|---|---|---|---|---|---|---|
| 351 | 1 | 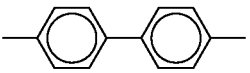 | 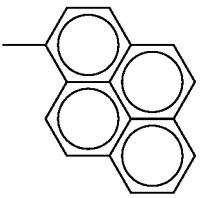 | 4,4 | 0 | 1 | —CH$_2$CH$_2$— |
| 352 | 1 | 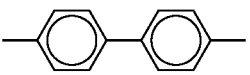 | 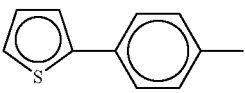 | 4,4 | 0 | 1 | —CH$_2$CH$_2$— |
| 353 | 1 |  | 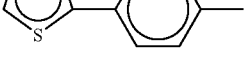 | 4,4 | 0 | 1 | —(CH$_2$)$_4$— |
| 354 | 1 | 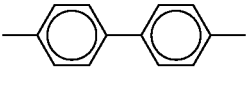 | 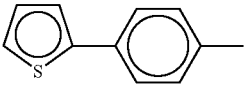 | 4,4 | 0 | 1 | 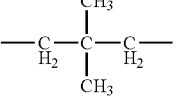 |
| 355 | 1 | 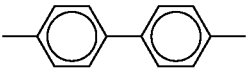 | 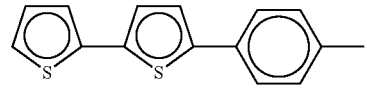 | 4,4 | 0 | 1 | —CH$_2$CH$_2$— |
| 356 | 1 | 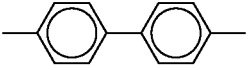 | 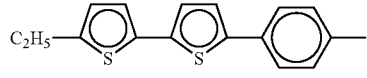 | 4,4 | 0 | 1 | —CH$_2$CH$_2$— |
| 357 | 1 | 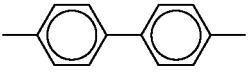 | 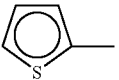 | 4,4 | 0 | 1 | —CH$_2$CH$_2$— |
TABLE 61
| Structure | k | X | Ar | Bonding Position | i | j | T |
|---|---|---|---|---|---|---|---|
| 358 | 1 | 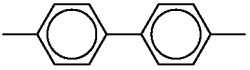 | 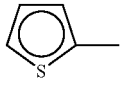 | 4,4 | 0 | 1 | 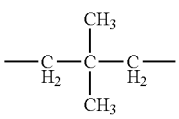 |
| 359 | 1 | 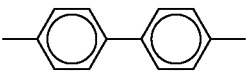 | 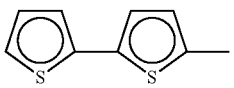 | 4,4 | 0 | 1 | —CH$_2$CH$_2$— |
| 360 | 1 | 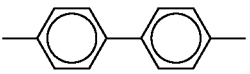 | 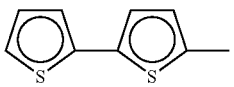 | 4,4 | 0 | 1 | —(CH$_2$)$_3$— |
| 361 | 1 | 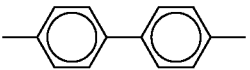 | 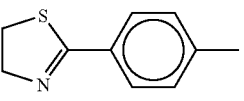 | 4,4 | 0 | 1 | 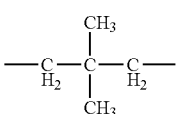 |

TABLE 61-continued
| Structure | k | X | Ar | Bonding Position | i | j | T |
|---|---|---|---|---|---|---|---|
| 362 | 1 | 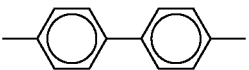 | 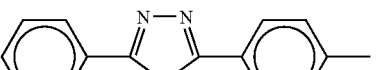 | 4,4 | 0 | 1 | —CH$_2$CH$_2$— |
| 363 | 1 | 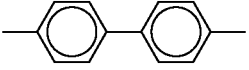 | 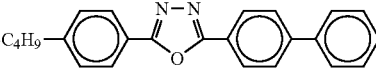 | 4,4 | 0 | 1 | 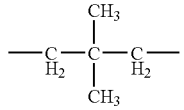 |
TABLE 62
| Structure | k | X | Ar | Bonding Position | i | j | T |
|---|---|---|---|---|---|---|---|
| 364 | 1 | 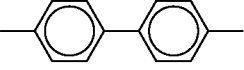 | 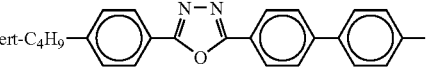 | 4,4 | 0 | 1 | —CH$_2$CH$_2$— |
| 365 | 1 | 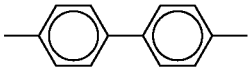 | 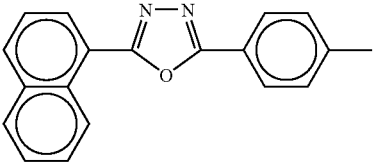 | 4,4 | 0 | 1 | —CH$_2$CH$_2$— |
| 366 | 1 | 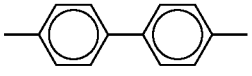 | 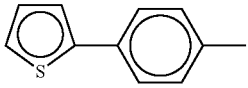 | 4,4 | 0 | 0 | — |
| 367 | 1 | 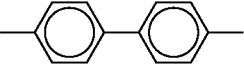 | 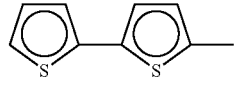 | 4,4 | 0 | 1 | —CH$_2$CH$_2$— |
| 368 | 1 | 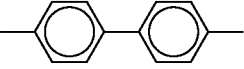 | 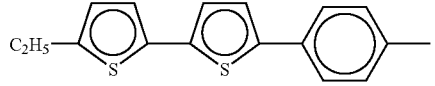 | 4,4 | 0 | 1 | —CH$_2$CH$_2$— |
| 369 | 1 | 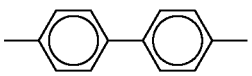 | 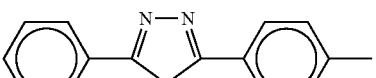 | 4,4 | 0 | 1 | —CH$_2$CH$_2$— |
| 370 | 1 | 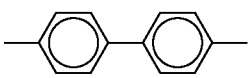 | 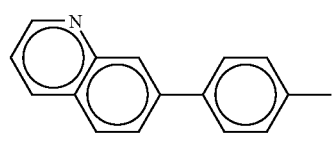 | 4,4 | 0 | 0 | — |

TABLE 63

| Structure | k | X | Ar | Bonding Position | i | j | T |
|---|---|---|---|---|---|---|---|
| 371 | 1 | biphenyl | thiophene-phenyl | 4,4 | 0 | 1 | —CH$_2$— |
| 372 | 1 | biphenyl | bithiophene-phenyl | 4,4 | 0 | 1 | —CH$_2$— |
| 373 | 1 | biphenyl | thiophene | 4,4 | 0 | 1 | —CH$_2$— |
| 374 | 1 | biphenyl | phenyl-oxadiazole-phenyl | 4,4 | 0 | 1 | —CH$_2$— |
| 375 | 1 | biphenyl | quinoline-phenyl | 4,4 | 0 | 1 | —CH$_2$— |
| 376 | 1 | dimethyl-biphenyl | phenyl | 4,4 | 0 | 1 | —CH$_2$CH$_2$— |

TABLE 64

| Structure | k | X | Ar | Bonding Position | i | j | T |
|---|---|---|---|---|---|---|---|
| 377 | 1 | dimethyl-biphenyl | methylphenyl | 4,4 | 0 | 1 | —CH$_2$CH$_2$— |
| 378 | 1 | dimethyl-biphenyl | dimethylphenyl | 4,4 | 1 | 1 | —CH$_2$CH$_2$— |
| 379 | 1 | dimethyl-biphenyl | biphenyl | 4,4 | 0 | 1 | —CH$_2$CH$_2$— |
| 380 | 1 | dimethyl-biphenyl | terphenyl | 4,4 | 0 | 1 | —CH$_2$CH$_2$— |

TABLE 64-continued
| Structure | k | X | Ar | Bonding Position | i | j | T |
|---|---|---|---|---|---|---|---|
| 381 | 1 | 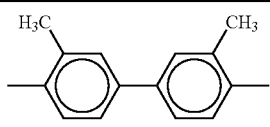 | 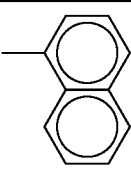 | 4,4 | 0 | 1 | —CH₂CH₂— |
| 382 | 1 | 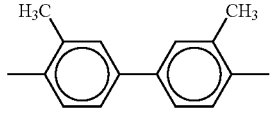 | 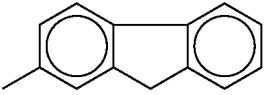 | 4,4 | 0 | 1 | —CH₂CH₂— |
TABLE 65
| Structure | k | X | Ar | Bonding Position | i | j | T |
|---|---|---|---|---|---|---|---|
| 383 | 1 | 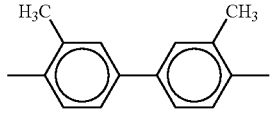 | 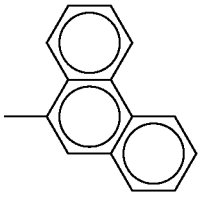 | 4,4 | 0 | 1 | —CH₂CH₂— |
| 384 | 1 | 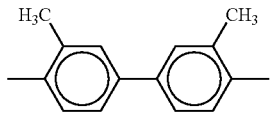 | 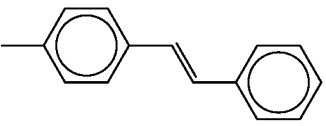 | 4,4 | 0 | 1 | —CH₂CH₂— |
| 385 | 1 | 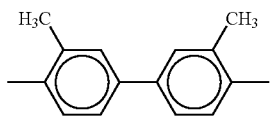 | 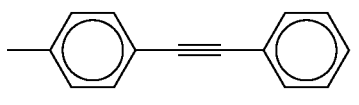 | 4,4 | 0 | 1 | —CH₂CH₂— |
| 386 | 1 | 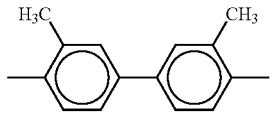 | 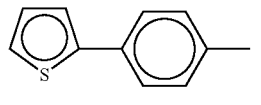 | 4,4 | 0 | 1 | —CH₂CH₂— |
| 387 | 1 | 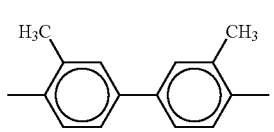 | 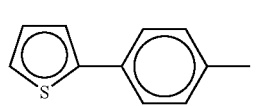 | 4,4 | 0 | 1 | —(CH₂)₄— |
| 388 | 1 | 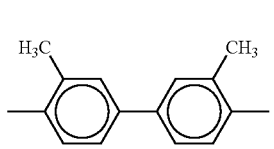 | 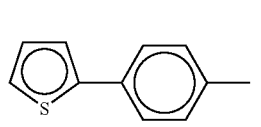 | 4,4 | 0 | 1 | 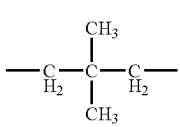 |

TABLE 66
| Structure | k | X | Ar | Bonding Position | i | j | T |
|---|---|---|---|---|---|---|---|
| 389 | 1 | 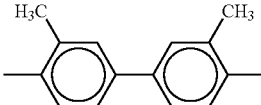 | 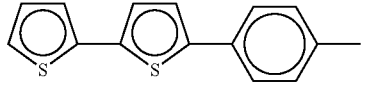 | 4,4 | 0 | 1 | —CH$_2$CH$_2$— |
| 390 | 1 | 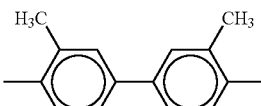 | 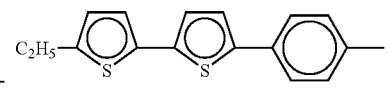 | 4,4 | 0 | 1 | —CH$_2$— |
| 391 | 1 | 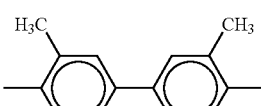 | 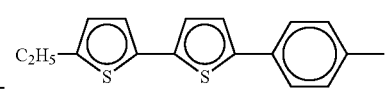 | 4,4 | 0 | 1 | —CH$_2$CH$_2$— |
| 392 | 1 | 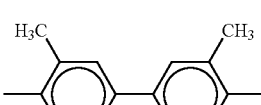 | 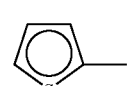 | 4,4 | 0 | 1 | —CH$_2$CH$_2$— |
| 393 | 1 |  | 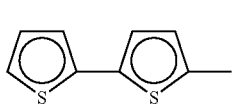 | 4,4 | 0 | 1 | —CH$_2$CH$_2$— |
| 394 | 1 |  | 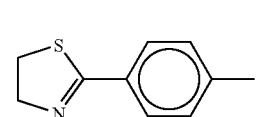 | 4,4 | 0 | 1 | —CH$_2$CH$_2$— |
| 395 | 1 |  | 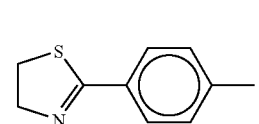 | 4,4 | 0 | 1 | 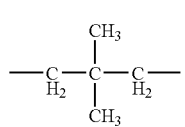 |
TABLE 67
| Structure | k | X | Ar | Bonding Position | i | j | T |
|---|---|---|---|---|---|---|---|
| 396 | 1 | 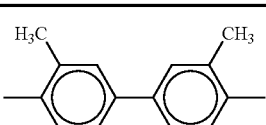 | 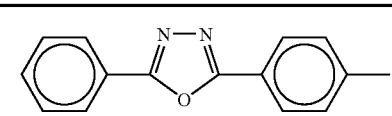 | 4,4 | 0 | 1 | —CH$_2$CH$_2$— |
| 397 | 1 |  | 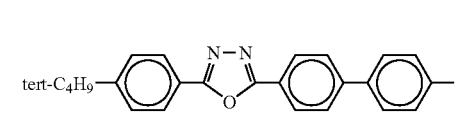 | 4,4 | 0 | 1 | —CH$_2$— |
| 398 | 1 |  | 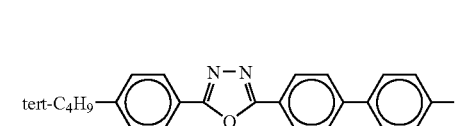 | 4,4 | 0 | 1 | —CH$_2$CH$_2$— |

TABLE 67-continued
| Structure | k | X | Ar | Bonding Position | i | j | T |
|---|---|---|---|---|---|---|---|
| 399 | 1 | 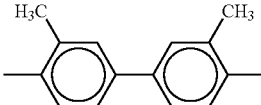 | 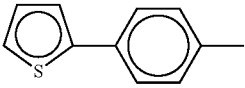 | 4,4 | 0 | 1 | —CH$_2$CH$_2$— |
| 400 | 1 | 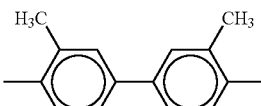 | 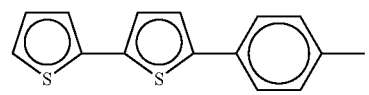 | 4,4 | 0 | 1 | —CH$_2$CH$_2$— |
| 401 | 1 | 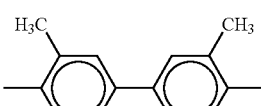 | 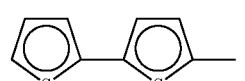 | 4,4 | 0 | 1 | —CH$_2$CH$_2$— |
| 402 | 1 | 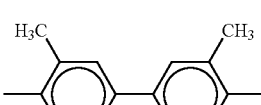 | 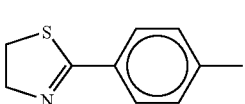 | 4,4 | 0 | 1 | —CH$_2$CH$_2$— |
TABLE 68
| Structure | k | X | Ar | Bonding Position | i | j | T |
|---|---|---|---|---|---|---|---|
| 403 | 1 | 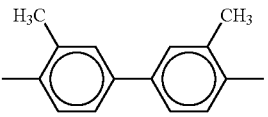 | 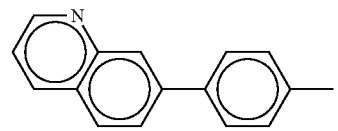 | 4,4 | 0 | 1 | —CH$_2$CH$_2$— |
| 404 | 1 | 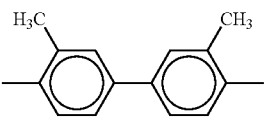 | 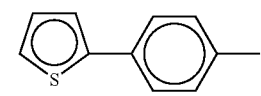 | 4,4 | 0 | 1 | —CH$_2$— |
| 405 | 1 | 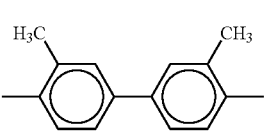 | 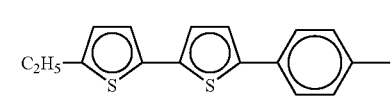 | 4,4 | 0 | 1 | —CH$_2$— |
| 406 | 1 |  | 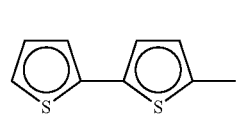 | 4,4 | 0 | 1 | —CH$_2$— |
| 407 | 1 |  | 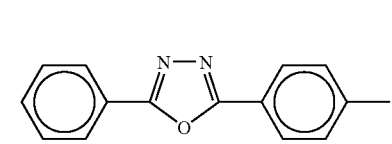 | 4,4 | 0 | 1 | —CH$_2$— |
| 408 | 1 | 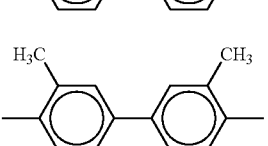 | 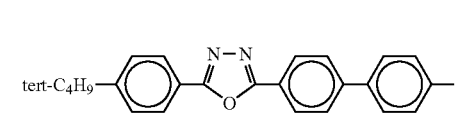 | 4,4 | 0 | 1 | —CH$_2$— |

TABLE 68-continued
| Structure | k | X | Ar | Bonding Position | i | j | T |
|---|---|---|---|---|---|---|---|
| 409 | 1 | 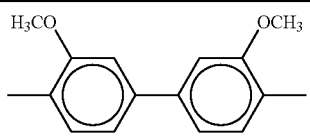 | 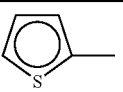 | 4,4 | 0 | 1 | —CH$_2$CH$_2$— |
TABLE 69
| Structure | k | X | Ar | Bonding Position | i | j | T |
|---|---|---|---|---|---|---|---|
| 410 | 1 | 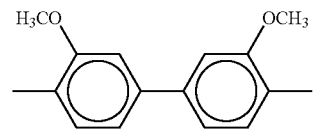 | 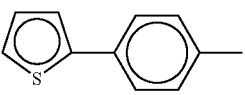 | 4,4 | 0 | 1 | —CH$_2$— |
| 411 | 1 | 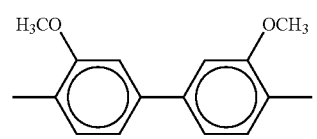 | 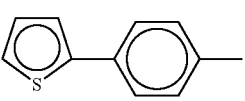 | 4,4 | 1 | 1 | —CH$_2$CH$_2$— |
| 412 | 1 | 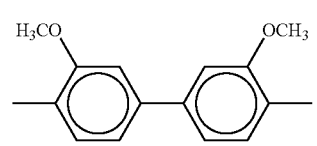 | 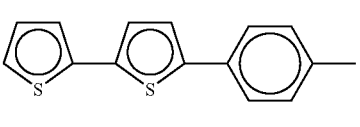 | 4,4 | 0 | 1 | —CH$_2$CH$_2$— |
| 413 | 1 | 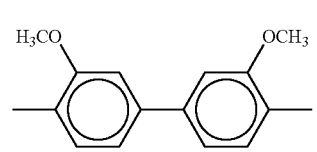 | 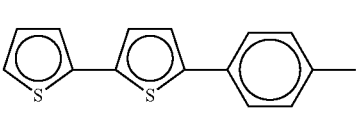 | 4,4 | 0 | 1 | 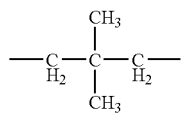 |
| 414 | 1 | 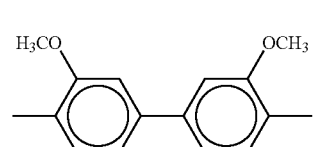 | 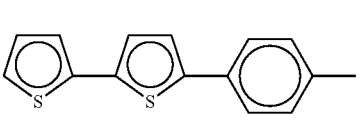 | 4,4 | 0 | 0 | — |
| 415 | 1 | 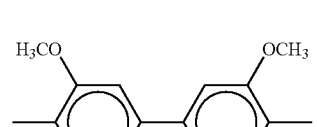 | 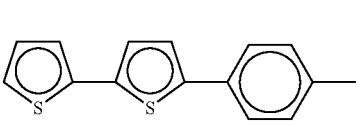 | 4,4 | 0 | 1 | —CH$_2$— |
| 416 | 1 | 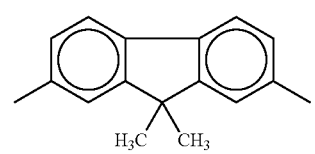 | 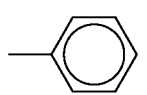 | 4,4 | 0 | 1 | —CH$_2$CH$_2$— |

TABLE 70

| Structure | k | X | Ar | Bonding Position | i | j | T |
|---|---|---|---|---|---|---|---|
| 417 | 1 | 2,7-dimethyl-9,9-dimethylfluorene | 4-methylphenyl | 4,4 | 0 | 1 | —CH$_2$CH$_2$— |
| 418 | 1 | 2,7-dimethyl-9,9-dimethylfluorene | 3,4-dimethylphenyl | 4,4 | 0 | 1 | —CH$_2$CH$_2$— |
| 419 | 1 | 2,7-dimethyl-9,9-dimethylfluorene | 4-biphenylyl | 4,4 | 0 | 1 | —CH$_2$CH$_2$— |
| 420 | 1 | 2,7-dimethyl-9,9-dimethylfluorene | 4-terphenylyl | 4,4 | 0 | 1 | —CH$_2$CH$_2$— |
| 421 | 1 | 2,7-dimethyl-9,9-dimethylfluorene | naphthyl | 4,4 | 0 | 1 | —CH$_2$CH$_2$— |
| 422 | 1 | 2,7-dimethyl-9,9-dimethylfluorene | 2,7-dimethyl-9,9-dimethylfluorenyl | 4,4 | 0 | 1 | —CH$_2$CH$_2$— |

TABLE 71

| Structure | k | X | Ar | Bonding Position | i | j | T |
|---|---|---|---|---|---|---|---|
| 423 | 1 | 2,7-dimethyl-9,9-dimethylfluorene | phenanthryl | 4,4 | 0 | 1 | —CH$_2$CH$_2$— |

TABLE 71-continued
| Structure | k | X | Ar | Bonding Position | i | j | T |
|---|---|---|---|---|---|---|---|
| 424 | 1 | 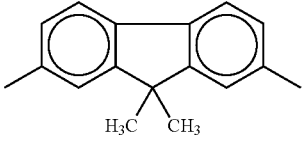 | 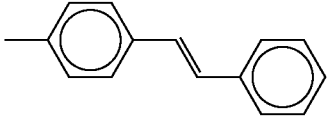 | 4,4 | 0 | 1 | —CH$_2$CH$_2$— |
| 425 | 1 | 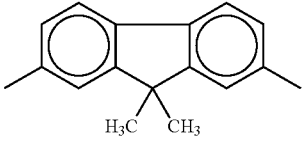 | 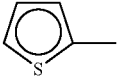 | 4,4 | 0 | 1 | —CH$_2$CH$_2$— |
| 426 | 1 | 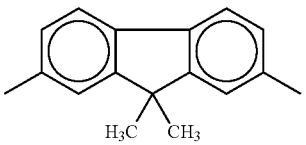 | 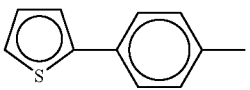 | 4,4 | 0 | 1 | —CH$_2$CH$_2$— |
| 427 | 1 | 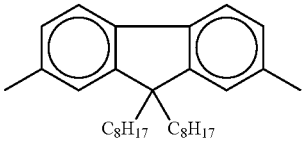 | 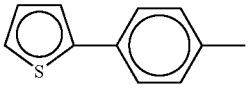 | 4,4 | 0 | 1 | —CH$_2$CH$_2$— |
| 428 | 1 | 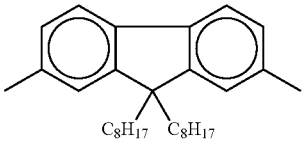 | 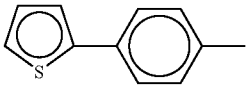 | 4,4 | 0 | 1 | 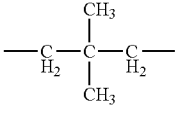 |
TABLE 72
| Structure | k | X | Ar | Bonding Position | i | j | T |
|---|---|---|---|---|---|---|---|
| 429 | 1 | 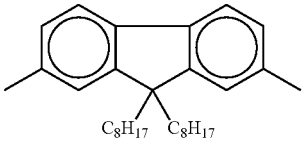 | 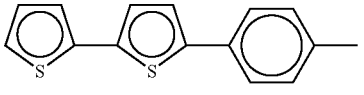 | 4,4 | 0 | 1 | —CH$_2$CH$_2$— |
| 430 | 1 | 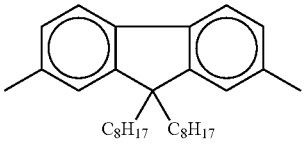 | 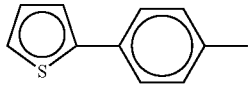 | 4,4 | 0 | 1 | —CH$_2$— |
| 431 | 1 | 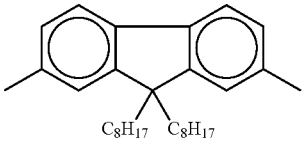 | 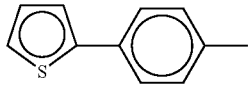 | 4,4 | 0 | 1 | —CH$_2$CH$_2$— |

TABLE 72-continued
| Structure | k | X | Ar | Bonding Position | i | j | T |
|---|---|---|---|---|---|---|---|
| 432 | 1 | 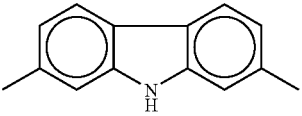 | 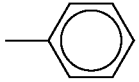 | 4,4 | 0 | 0 | — |
| 433 | 1 | 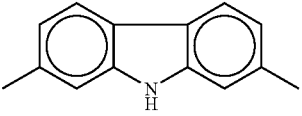 | 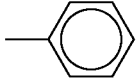 | 4,4 | 0 | 1 | —CH₂CH₂— |
| 434 | 1 | 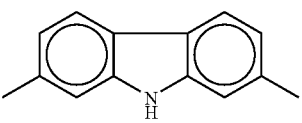 | 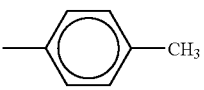 | 4,4 | 1 | 0 | — |
| 435 | 1 | 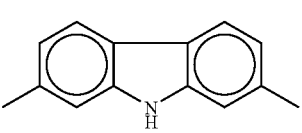 | 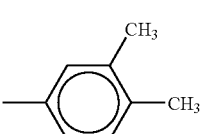 | 4,4 | 0 | 1 | —CH₂— |
TABLE 73
| Structure | k | X | Ar | Bonding Position | i | j | T |
|---|---|---|---|---|---|---|---|
| 436 | 1 | 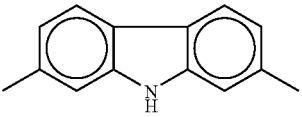 | 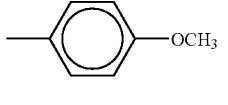 | 4,4 | 0 | 1 | 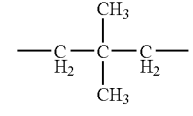 |
| 437 | 1 | 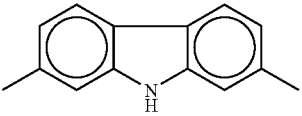 | 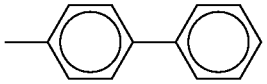 | 4,4 | 0 | 1 | —CH₂CH₂— |
| 438 | 1 | 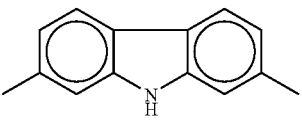 | 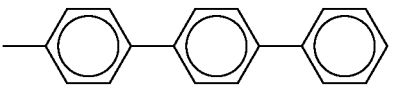 | 4,4 | 0 | 1 | —CH₂CH₂— |
| 439 | 1 | 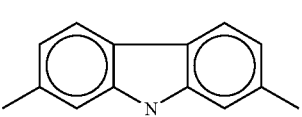 | 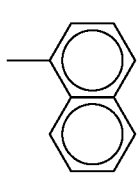 | 4,4 | 0 | 1 | —CH₂CH₂— |
| 440 | 1 | 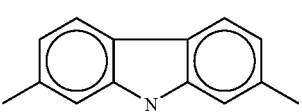 |  | 4,4 | 0 | 1 | —CH₂CH₂— |

TABLE 73-continued

| Structure | k | X | Ar | Bonding Position | i | j | T |
|---|---|---|---|---|---|---|---|
| 441 | 1 | (carbazole, NH) | (9,9-dimethylfluorene) | 4,4 | 0 | 1 | —CH$_2$CH$_2$— |

TABLE 74

| Structure | k | X | Ar | Bonding Position | i | j | T |
|---|---|---|---|---|---|---|---|
| 442 | 1 | (carbazole, NH) | (triphenylene) | 4,4 | 0 | 1 | —CH$_2$CH$_2$— |
| 443 | 1 | (carbazole, NH) | (stilbene) | 4,4 | 0 | 1 | —CH$_2$CH$_2$— |
| 444 | 1 | (carbazole, N-C$_2$H$_5$) | (phenyl) | 4,4 | 0 | 1 | —CH$_2$CH$_2$— |
| 445 | 1 | (carbazole, N-C$_2$H$_5$) | (4-methylphenyl) | 4,4 | 0 | 1 | —CH$_2$CH$_2$— |
| 446 | 1 | (carbazole, N-C$_2$H$_5$) | (3,4-dimethylphenyl) | 4,4 | 0 | 1 | —CH$_2$CH$_2$— |
| 447 | 1 | (carbazole, N-C$_2$H$_5$) | (4-methoxyphenyl) | 4,4 | 0 | 1 | —CH$_2$CH$_2$— |

TABLE 75

| Structure | k | X | Ar | Bonding Position | i | j | T |
|---|---|---|---|---|---|---|---|
| 448 | 1 | carbazole with N-C₂H₅ | biphenyl | 4,4 | 0 | 1 | —CH₂CH₂— |
| 449 | 1 | carbazole with N-C₂H₅ | terphenyl | 4,4 | 0 | 1 | —CH₂CH₂— |
| 450 | 1 | carbazole with N-C₂H₅ | naphthyl | 4,4 | 0 | 1 | —CH₂CH₂— |
| 451 | 1 | carbazole with N-C₂H₅ | 9,9-dimethylfluorenyl | 4,4 | 0 | 1 | —CH₂CH₂— |
| 452 | 1 | carbazole with N-C₂H₅ | phenanthrenyl | 4,4 | 0 | 1 | —(CH₂)₃— |
| 453 | 1 | carbazole with N-C₂H₅ | stilbenyl | 4,4 | 0 | 1 | —CH₂CH₂— |

TABLE 76

| Structure | k | X | Ar | Bonding Position | i | j | T |
|---|---|---|---|---|---|---|---|
| 454 | 1 | carbazole with N-C₂H₅ | thienyl | 4,4 | 0 | 1 | —CH₂CH₂— |
| 455 | 1 | carbazole with N-C₂H₅ | bithienyl | 4,4 | 0 | 1 | —CH₂CH₂— |

TABLE 76-continued
| Structure | k | X | Ar | Bonding Position | i | j | T |
|---|---|---|---|---|---|---|---|
| 456 | 1 | 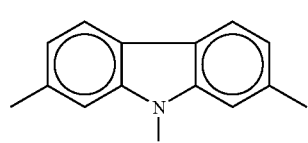 | 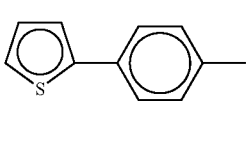 | 4,4 | 0 | 1 | —CH$_2$CH$_2$— |
| 457 | 1 | 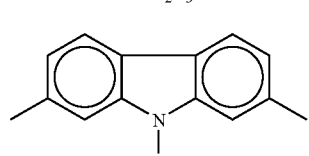 | 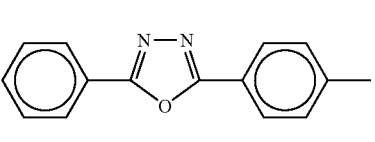 | 4,4 | 0 | 1 | —CH$_2$CH$_2$— |
| 458 | 1 | 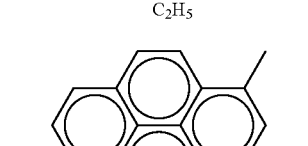 | 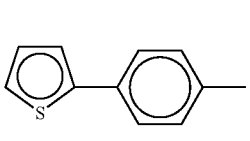 | 4,4 | 0 | 1 | —CH$_2$CH$_2$— |
| 459 | 1 | 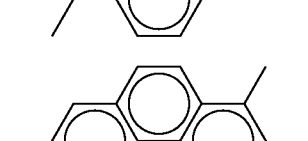 | 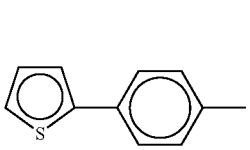 | 4,4 | 0 | 1 | —CH$_2$— |
TABLE 77
| Structure | k | X | Ar | Bonding Position | i | j | T |
|---|---|---|---|---|---|---|---|
| 460 | 1 |  | 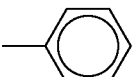 | 4,4 | 0 | 0 | —CH$_2$— |
| 461 | 1 |  | 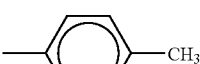 | 4,4 | 1 | 0 | — |
| 462 | 1 |  | 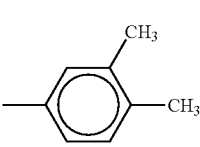 | 4,4 | 0 | 1 | —CH$_2$CH$_2$— |
| 463 | 1 |  | 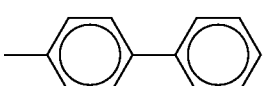 | 4,4 | 0 | 1 | —CH$_2$CH$_2$— |
| 464 | 1 |  | 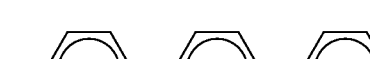 | 4,4 | 0 | 1 | —CH$_2$CH$_2$— |

TABLE 77-continued
| Structure | k | X | Ar | Bonding Position | i | j | T |
|---|---|---|---|---|---|---|---|
| 465 | 1 | 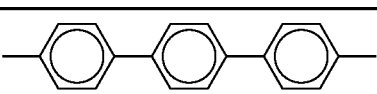 | 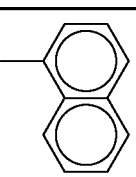 | 4,4 | 0 | 1 | —CH$_2$CH$_2$— |
TABLE 78
| Structure | k | X | Ar | Bonding Position | i | j | T |
|---|---|---|---|---|---|---|---|
| 466 | 1 | 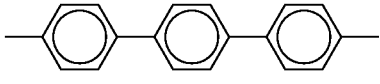 | 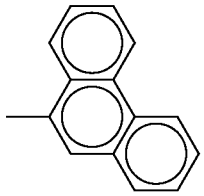 | 4,4 | 0 | 1 | —CH$_2$CH$_2$— |
| 467 | 1 | 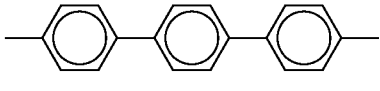 | 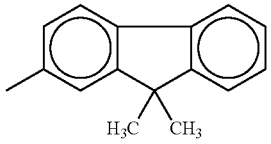 | 4,4 | 0 | 1 | —CH$_2$CH$_2$— |
| 468 | 1 | 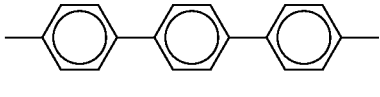 | 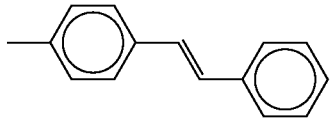 | 4,4 | 0 | 1 | —CH$_2$CH$_2$— |
| 469 | 1 | 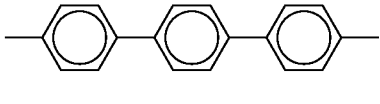 | 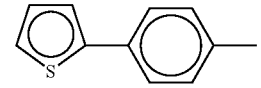 | 4,4 | 0 | 1 | —CH$_2$CH$_2$— |
| 470 | 1 |  | 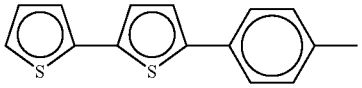 | 4,4 | 0 | 1 | —CH$_2$CH$_2$— |
| 471 | 1 |  | 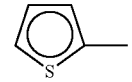 | 4,4 | 0 | 1 | —CH$_2$— |
TABLE 79
| Structure | k | X | Ar | Bonding Position | i | j | T |
|---|---|---|---|---|---|---|---|
| 472 | 1 | 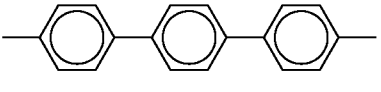 | 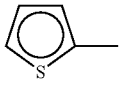 | 4,4 | 0 | 1 | —CH$_2$CH$_2$— |

TABLE 79-continued

| Structure | k | X | Ar | Bonding Position | i | j | T |
|---|---|---|---|---|---|---|---|
| 473 | 1 | (three phenyl rings linked) | (bithiophene) | 4,4 | 0 | 1 | —CH$_2$CH$_2$— |
| 474 | 1 | (three phenyl rings linked) | (phenyl-oxadiazole-phenyl) | 4,4 | 0 | 1 | —CH$_2$CH$_2$— |
| 475 | 1 | (three phenyl rings linked) | (bithiophene) | 4,4 | 0 | 0 | — |
| 476 | 1 | (three phenyl rings linked) | (bithiophene) | 4,4 | 0 | 1 | —CH$_2$— |
| 477 | 1 | (phenyl-thiophene-phenyl) | (phenyl) | 4,4 | 1 | 0 | —CH$_2$— |
| 478 | 1 | (phenyl-thiophene-phenyl) | (dimethylphenyl) | 4,4 | 0 | 1 | —CH$_2$CH$_2$— |

TABLE 80

| Structure | k | X | Ar | Bonding Position | i | j | T |
|---|---|---|---|---|---|---|---|
| 479 | 1 | (phenyl-thiophene-phenyl) | (biphenyl) | 4,4 | 0 | 0 | —CH$_2$—C(CH$_3$)$_2$—CH$_2$— |
| 480 | 1 | (phenyl-thiophene-phenyl) | (terphenyl) | 4,4 | 1 | 0 | —CH$_2$CH$_2$— |
| 481 | 1 | (phenyl-thiophene-phenyl) | (naphthalene) | 4,4 | 0 | 1 | —CH$_2$CH$_2$— |
| 482 | 1 | (phenyl-thiophene-phenyl) | (fluorene) | 4,4 | 0 | 1 | —CH$_2$CH$_2$— |
| 483 | 1 | (phenyl-thiophene-phenyl) | (9,9-dimethylfluorene) | 4,4 | 0 | 1 | —CH$_2$CH$_2$— |

TABLE 80-continued

| Structure | k | X | Ar | Bonding Position | i | j | T |
|---|---|---|---|---|---|---|---|
| 484 | 1 | (phenyl-thiophene-phenyl) | (phenanthrene) | 4,4 | 0 | 1 | —CH$_2$CH$_2$— |

TABLE 81

| Structure | k | X | Ar | Bonding Position | i | j | T |
|---|---|---|---|---|---|---|---|
| 485 | 1 | (phenyl-thiophene-phenyl) | (thiophene-phenyl) | 4,4 | 0 | 1 | —CH$_2$CH$_2$— |
| 486 | 1 | (phenyl-thiophene-phenyl) | (bithiophene-phenyl) | 4,4 | 0 | 1 | —CH$_2$CH$_2$— |
| 487 | 1 | (phenyl-thiophene-phenyl) | (thiophene) | 4,4 | 0 | 1 | —CH$_2$CH$_2$— |
| 488 | 1 | (phenyl-thiophene-phenyl) | (thiophene) | 4,4 | 0 | 1 | —(CH$_2$)$_3$— |
| 489 | 1 | (phenyl-thiophene-phenyl) | (bithiophene) | 4,4 | 0 | 1 | —CH$_2$CH$_2$— |
| 490 | 1 | (phenyl-thiophene-phenyl) | (phenyl-oxadiazole-phenyl) | 4,4 | 0 | 1 | —CH$_2$CH$_2$— |
| 491 | 1 | (phenyl-thiophene-phenyl) | (bithiophene) | 4,4 | 0 | 0 | — |
| 492 | 1 | (phenyl-thiophene-phenyl) | (bithiophene) | 4,4 | 0 | 1 | —CH$_2$— |

TABLE 82
| Structure | k | X | Ar | Bonding Position | i | j | T |
|---|---|---|---|---|---|---|---|
| 493 | 1 | 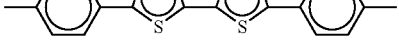 | 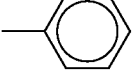 | 4,4 | 0 | 1 | —CH$_2$CH$_2$— |
| 494 | 1 | 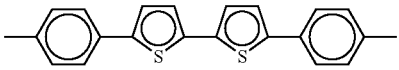 | 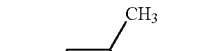 | 4,4 | 0 | 1 | —CH$_2$CH$_2$— |
| 495 | 1 |  |  | 4,4 | 0 | 1 | —CH$_2$CH$_2$— |
| 496 | 1 | 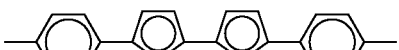 |  | 4,4 | 0 | 1 | —CH$_2$CH$_2$— |
| 497 | 1 |  |  | 4,4 | 0 | 1 | —CH$_2$CH$_2$— |
| 498 | 1 |  |  | 4,4 | 0 | 1 | —CH$_2$CH$_2$— |
TABLE 83
| Structure | k | X | Ar | Bonding Position | i | j | T |
|---|---|---|---|---|---|---|---|
| 499 | 1 |  | 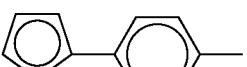 | 4,4 | 0 | 1 | —CH$_2$CH$_2$— |
| 500 | 1 |  | 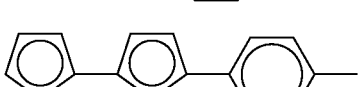 | 4,4 | 0 | 1 | —CH$_2$CH$_2$— |
| 501 | 1 |  | 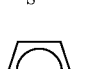 | 4,4 | 0 | 1 | —CH$_2$CH$_2$— |
| 502 | 1 |  | 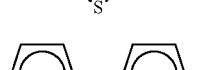 | 4,4 | 0 | 1 | —CH$_2$CH$_2$— |

TABLE 83-continued
| Structure | k | X | Ar | Bonding Position | i | j | T |
|---|---|---|---|---|---|---|---|
| 503 | 1 | 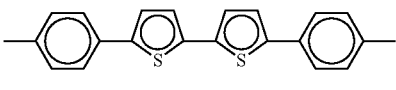 | 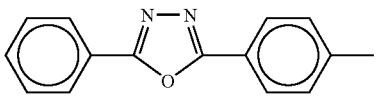 | 4,4 | 0 | 1 | —CH$_2$CH$_2$— |
| 504 | 1 | 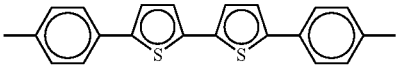 | 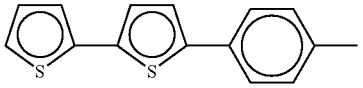 | 4,4 | 0 | 0 | — |
| 505 | 1 | 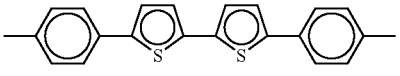 | 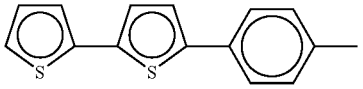 | 4,4 | 0 | 1 | —CH$_2$— |
| 506 | 1 | 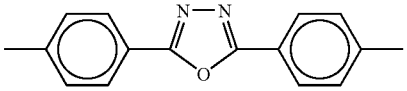 | 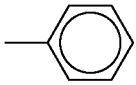 | 4,4 | 0 | 1 | —CH$_2$— |
TABLE 84
| Structure | k | X | Ar | Bonding Position | i | j | T |
|---|---|---|---|---|---|---|---|
| 507 | 1 | 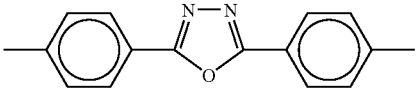 | 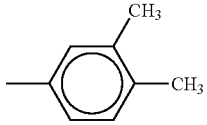 | 4,4 | 0 | 1 | —CH$_2$— |
| 508 | 1 | 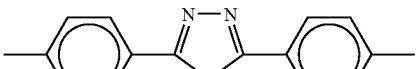 | 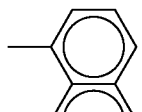 | 4,4 | 0 | 0 | — |
| 509 | 1 | 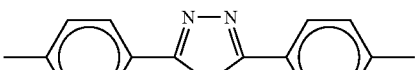 | 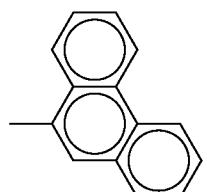 | 4,4 | 0 | 1 | —(CH$_2$)$_3$— |
| 510 | 1 | 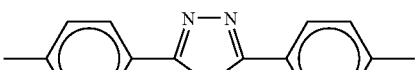 | 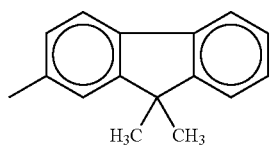 | 4,4 | 0 | 1 | —CH$_2$CH$_2$— |
| 511 | 1 | 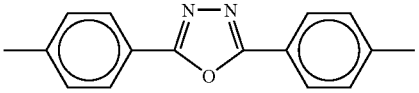 | 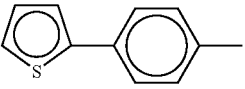 | 4,4 | 0 | 1 | —CH$_2$CH$_2$— |

TABLE 84-continued
| Structure | k | X | Ar | Bonding Position | i | j | T |
|---|---|---|---|---|---|---|---|
| 512 | 1 | 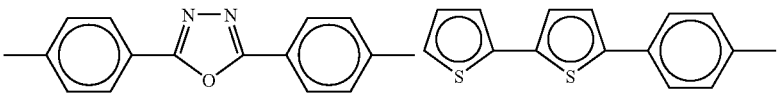 | 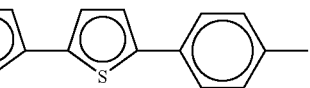 | 4,4 | 0 | 1 | —(CH$_2$)$_3$— |
TABLE 85
| Structure | k | X | Ar | Bonding Position | i | j | T |
|---|---|---|---|---|---|---|---|
| 513 | 1 | 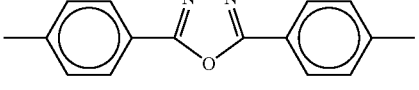 | 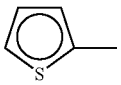 | 4,4 | 0 | 1 | —CH$_2$CH$_2$— |
| 514 | 1 | 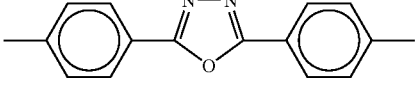 | 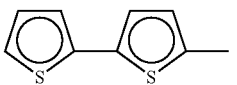 | 4,4 | 0 | 1 | —CH$_2$— |
| 515 | 1 | 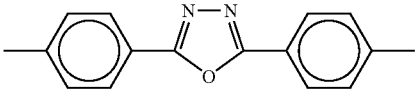 | 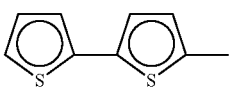 | 4,4 | 0 | 1 | —(CH$_2$)$_3$— |
| 516 | 1 | 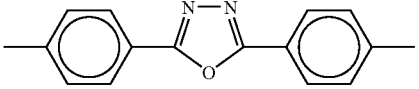 | 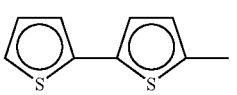 | 4,4 | 0 | 0 | — |
| 517 | 1 | 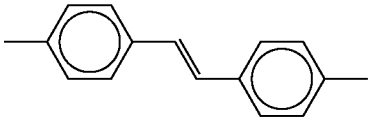 | 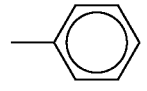 | 4,4 | 0 | 1 | —CH$_2$— |
| 518 | 1 | 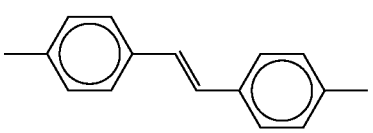 | 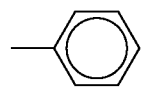 | 4,4 | 0 | 1 | —CH$_2$CH$_2$— |
| 519 | 1 | 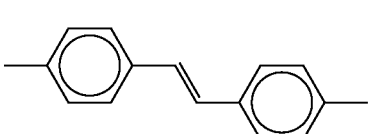 | 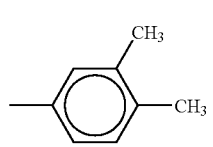 | 4,4 | 0 | 1 | —CH$_2$CH$_2$— |

TABLE 86

| Structure | k | X | Ar | Bonding Position | i | j | T |
|---|---|---|---|---|---|---|---|
| 520 | 1 | (stilbene) | (naphthyl) | 4,4 | 0 | 1 | —CH$_2$CH$_2$— |
| 521 | 1 | (stilbene) | (phenanthryl) | 4,4 | 0 | 1 | —(CH$_2$)$_3$— |
| 522 | 1 | (stilbene) | (9,9-dimethylfluorenyl) | 4,4 | 0 | 1 | —CH$_2$— |
| 523 | 1 | (stilbene) | (thienyl-phenyl) | 4,4 | 0 | 1 | —CH$_2$CH$_2$— |
| 524 | 1 | (stilbene) | (bithienyl-phenyl) | 4,4 | 0 | 1 | —CH$_2$CH$_2$— |
| 525 | 1 | (stilbene) | (thienyl) | 4,4 | 0 | 1 | —CH$_2$CH$_2$— |
| 526 | 1 | (stilbene) | (bithienyl) | 4,4 | 0 | 1 | —CH$_2$— |

TABLE 87

| Structure | k | X | Ar | Bonding Position | i | j | T |
|---|---|---|---|---|---|---|---|
| 527 | 1 | (stilbene) | (phenyl-oxadiazole-phenyl) | 4,4 | 0 | 1 | —(CH$_2$)$_3$— |

TABLE 87-continued
| Structure | k | X | Ar | Bonding Position | i | j | T |
|---|---|---|---|---|---|---|---|
| 528 | 1 | 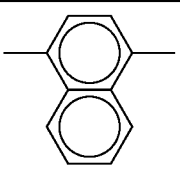 | 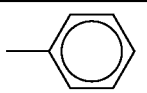 | 4,4 | 0 | 1 | —CH$_2$CH$_2$— |
| 529 | 1 | 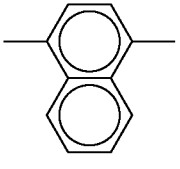 | 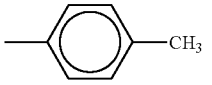 | 4,4 | 0 | 1 | —CH$_2$— |
| 530 | 1 | 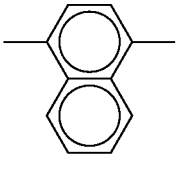 | 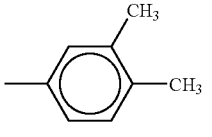 | 4,4 | 0 | 1 | —CH$_2$— |
| 531 | 1 | 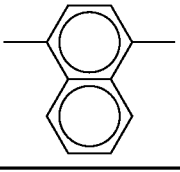 | 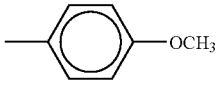 | 4,4 | 0 | 1 | —CH$_2$— |
TABLE 88
| Structure | k | X | Ar | Bonding Position | i | j | T |
|---|---|---|---|---|---|---|---|
| 532 | 1 | 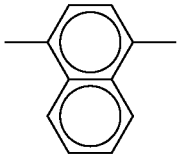 | 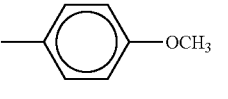 | 4,4 | 0 | 1 | —CH$_2$CH$_2$— |
| 533 | 1 | 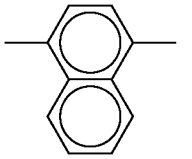 | 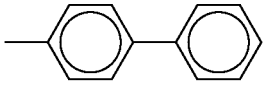 | 4,4 | 0 | 1 | —CH$_2$CH$_2$— |
| 534 | 1 | 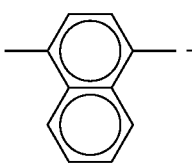 | 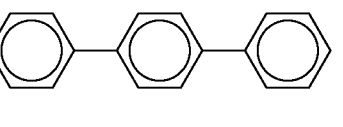 | 4,4 | 0 | 1 | —CH$_2$— |

TABLE 88-continued
| Structure | k | X | Ar | Bonding Position | i | j | T |
|---|---|---|---|---|---|---|---|
| 535 | 1 | 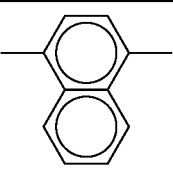 | 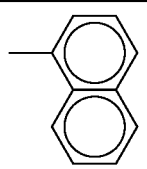 | 4,4 | 0 | 1 | —CH$_2$CH$_2$— |
TABLE 89
| Structure | k | X | Ar | Bonding Position | i | j | T |
|---|---|---|---|---|---|---|---|
| 536 | 1 | 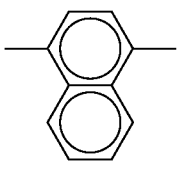 | 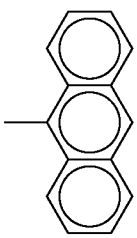 | 4,4 | 0 | 1 | —CH$_2$— |
| 537 | 1 | 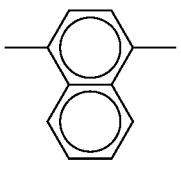 | 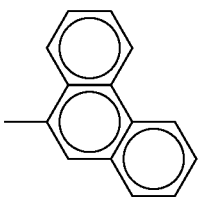 | 4,4 | 0 | 1 | —CH$_2$— |
| 538 | 1 | 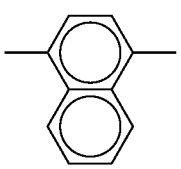 | 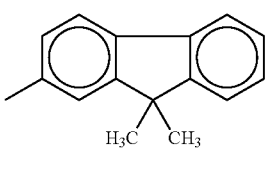 | 4,4 | 0 | 1 | —CH$_2$— |
| 539 | 1 | 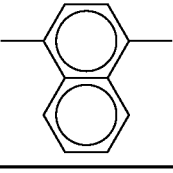 | 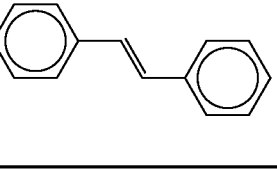 | 4,4 | 0 | 1 | —CH$_2$CH$_2$— |
TABLE 90
| Structure | k | X | Ar | Bonding Position | i | j | T |
|---|---|---|---|---|---|---|---|
| 540 | 1 | 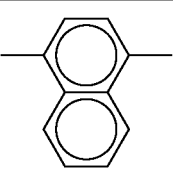 | 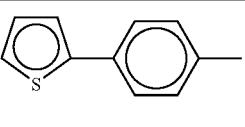 | 4,4 | 0 | 1 | —CH$_2$— |

TABLE 90-continued
| Structure | k | X | Ar | Bonding Position | i | j | T |
|---|---|---|---|---|---|---|---|
| 541 | 1 | 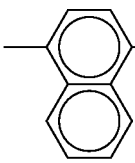 | 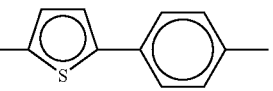 | 4,4 | 0 | 1 | —CH$_2$— |
| 542 | 1 | 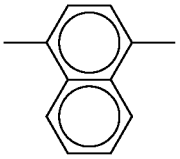 | 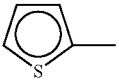 | 4,4 | 0 | 1 | —CH$_2$CH$_2$— |
| 543 | 1 | 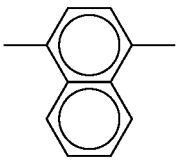 | 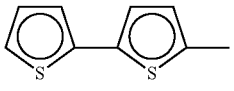 | 4,4 | 0 | 1 | —CH$_2$— |
| 544 | 1 | 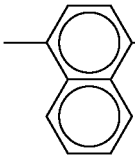 | 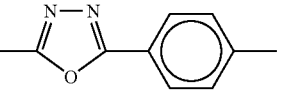 | 4,4 | 0 | 1 | —CH$_2$CH$_2$— |
| 545 | 1 | 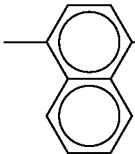 | 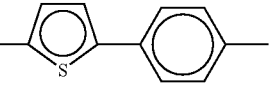 | 4,4 | 0 | 1 | —(CH$_2$)$_3$— |
TABLE 91
| Structure | k | X | Ar | Bonding Position | i | j | T |
|---|---|---|---|---|---|---|---|
| 546 | 1 | 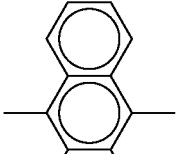 | 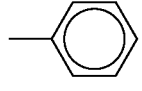 | 4,4 | 0 | 1 | —CH$_2$CH$_2$— |
| 547 | 1 | 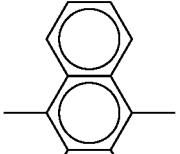 | 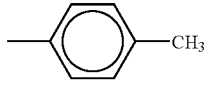 | 4,4 | 0 | 1 | —CH$_2$CH$_2$— |

TABLE 91-continued
| Structure | k | X | Ar | Bonding Position | i | j | T |
|---|---|---|---|---|---|---|---|
| 548 | 1 | 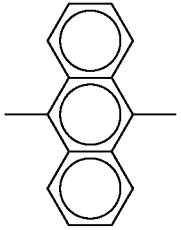 | 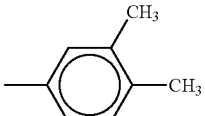 | 4,4 | 0 | 1 | —CH$_2$— |
TABLE 92
| Structure | k | X | Ar | Bonding Position | i | j | T |
|---|---|---|---|---|---|---|---|
| 549 | 1 | 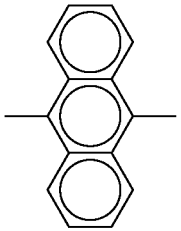 | 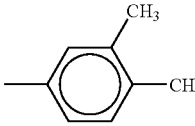 | 4,4 | 0 | 1 | —CH$_2$CH$_2$— |
| 550 | 1 | 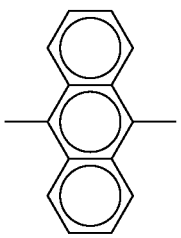 | 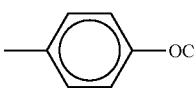 | 4,4 | 0 | 1 | —CH$_2$— |
| 551 | 1 | 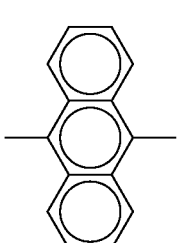 | 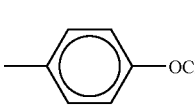 | 4,4 | 0 | 1 | —CH$_2$CH$_2$— |

TABLE 93

| Structure | k | X | Ar | Bonding Position | i | j | T |
|---|---|---|---|---|---|---|---|
| 552 | 1 | (anthracene) | (biphenyl) | 4,4 | 0 | 1 | —CH$_2$— |
| 553 | 1 | (anthracene) | (terphenyl) | 4,4 | 0 | 1 | —CH$_2$CH$_2$— |
| 554 | 1 | (anthracene) | (naphthyl) | 4,4 | 0 | 1 | —CH$_2$CH$_2$— |
| 555 | 1 | (anthracene) | (stilbene) | 4,4 | 0 | 1 | —CH$_2$CH$_2$— |

TABLE 94

| Structure | k | X | Ar | Bonding Position | i | j | T |
|---|---|---|---|---|---|---|---|
| 556 | 1 | (anthracene) | (thienyl-phenyl) | 4,4 | 0 | 1 | —CH$_2$CH$_2$— |

TABLE 94-continued
| Structure | k | X | Ar | Bonding Position | i | j | T |
|---|---|---|---|---|---|---|---|
| 557 | 1 | 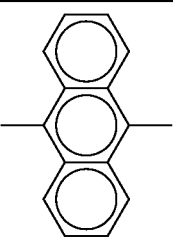 | 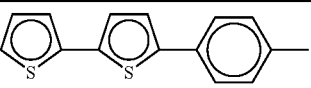 | 4,4 | 0 | 1 | —CH$_2$CH$_2$— |
| 558 | 1 | 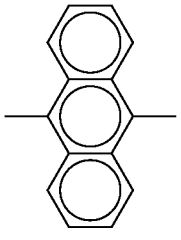 | 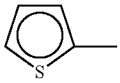 | 4,4 | 0 | 1 | —CH$_2$CH$_2$— |
TABLE 95
| Structure | k | X | Ar | Bonding Position | i | j | T |
|---|---|---|---|---|---|---|---|
| 559 | 1 | 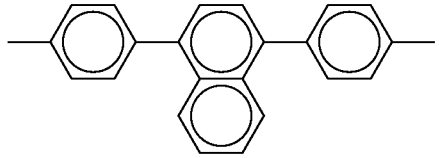 | 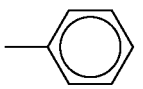 | 4,4 | 0 | 1 | —CH$_2$— |
| 560 | 1 | 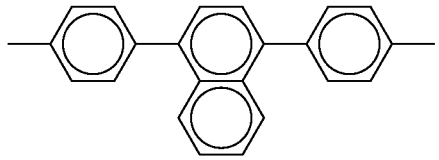 | 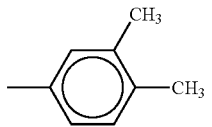 | 4,4 | 0 | 1 | —CH$_2$— |
| 561 | 1 | 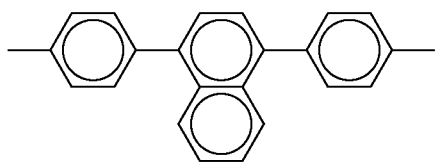 | 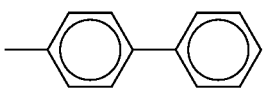 | 4,4 | 0 | 1 | —CH$_2$CH$_2$— |
| 562 | 1 | 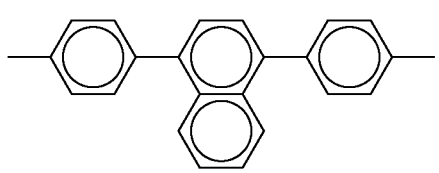 | 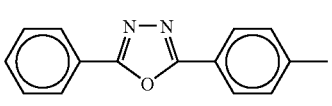 | 4,4 | 0 | 1 | —CH$_2$— |

TABLE 96

| Structure | k | X | Ar | Bonding Position | i | j | T |
|---|---|---|---|---|---|---|---|
| 563 | 1 | | | 4,4 | 0 | 1 | —CH$_2$CH$_2$— |
| 564 | 1 | | | 4,4 | 0 | 1 | —CH$_2$CH$_2$— |
| 565 | 1 | | | 4,4 | 0 | 1 | —CH$_2$CH$_2$— |
| 566 | 1 | | | 4,4 | 0 | 1 | —CH$_2$CH$_2$— |

TABLE 97

| Structure | k | X | Ar | Bonding Position | i | j | T |
|---|---|---|---|---|---|---|---|
| 567 | 1 | | | 4,4 | 0 | 1 | —(CH$_2$)$_3$— |
| 568 | 1 | | | 4,4 | 0 | 1 | —CH$_2$CH$_2$— |

TABLE 97-continued
| Structure | k | X | Ar | Bonding Position | i | j | T |
|---|---|---|---|---|---|---|---|
| 569 | 1 | 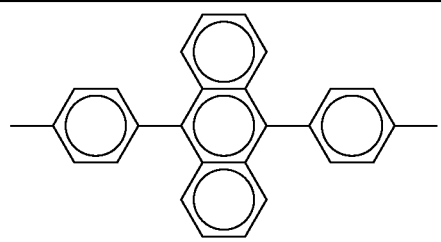 | 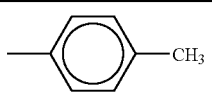 | 4,4 | 0 | 1 | —CH$_2$CH$_2$— |
| 570 | 1 | 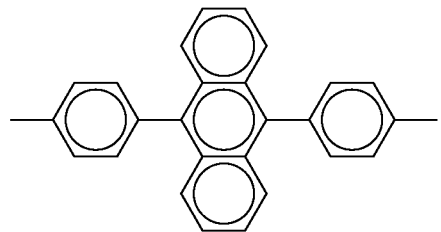 | 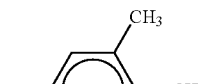 | 4,4 | 0 | 1 | —CH$_2$CH$_2$— |
TABLE 98
| Structure | k | X | Ar | Bonding Position | i | j | T |
|---|---|---|---|---|---|---|---|
| 571 | 1 | 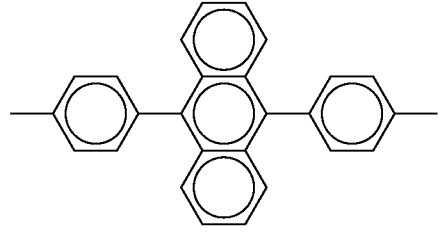 | 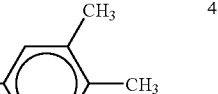 | 4,4 | 0 | 1 | —CH$_2$CH$_2$— |
| 572 | 1 | 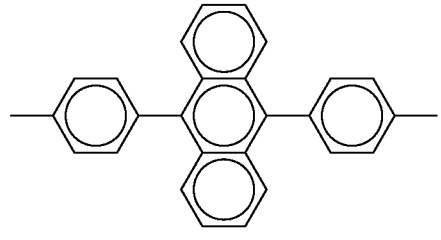 | 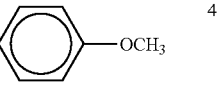 | 4,4 | 0 | 1 | —CH$_2$— |
| 573 | 1 | 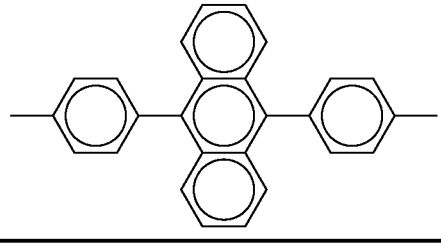 | 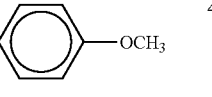 | 4,4 | 0 | 1 | —(CH$_2$)$_3$— |

TABLE 99
| Structure | k | X | Ar | Bonding Position | i | j | T |
|---|---|---|---|---|---|---|---|
| 574 | 1 | 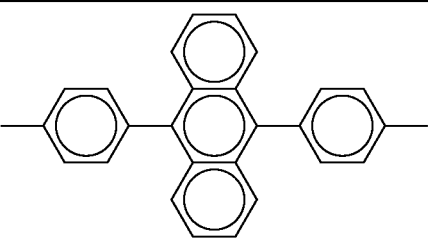 | 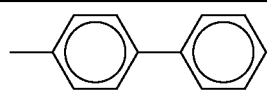 | 4,4 | 0 | 1 | —CH$_2$CH$_2$— |
| 575 | 1 | 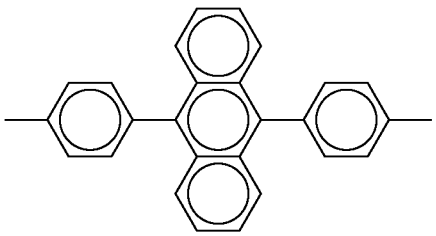 | 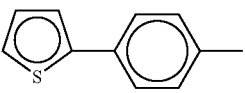 | 4,4 | 0 | 1 | —CH$_2$CH$_2$— |
| 576 | 1 | 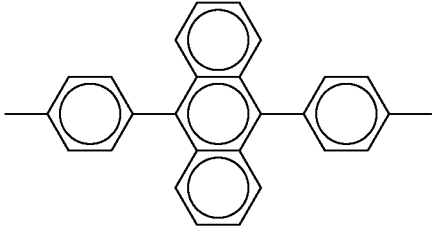 | 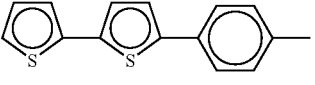 | 4,4 | 0 | 1 | —(CH$_2$)$_3$— |
| 577 | 1 | 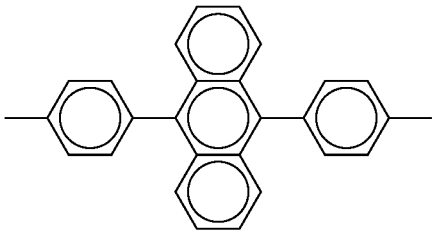 | 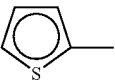 | 4,4 | 0 | 1 | —CH$_2$— |
TABLE 100
| Structure | k | X | Ar | Bonding Position | i | j | T |
|---|---|---|---|---|---|---|---|
| 578 | 1 | 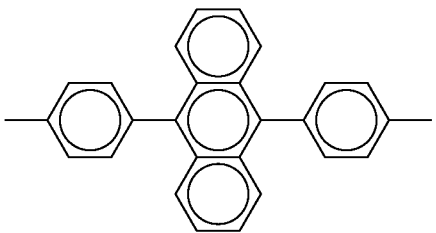 | 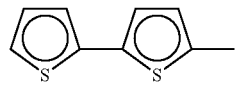 | 4,4 | 0 | 1 | —(CH$_2$)$_3$— |

TABLE 100-continued

| Structure | k | X | Ar | Bonding Position | i | j | T |
|---|---|---|---|---|---|---|---|
| 579 | 1 | (9,10-diphenylanthracene-di-tolyl) | (2,5-diphenyl-1,3,4-oxadiazole-tolyl) | 4,4 | 0 | 1 | —CH$_2$— |
| 580 | 1 | (2,7-disubstituted 9,9'-spirobifluorene) | (phenylene) | 4,4 | 0 | 1 | —CH$_2$CH$_2$— |

TABLE 101

| Structure | k | X | Ar | Bonding Position | i | j | T |
|---|---|---|---|---|---|---|---|
| 581 | 1 | (2,7-disubstituted 9,9'-spirobifluorene) | —C$_6$H$_3$(CH$_3$)— | 4,4 | 0 | 1 | —CH$_2$CH$_2$— |
| 582 | 1 | (2,7-disubstituted 9,9'-spirobifluorene) | —C$_6$H$_3$(CH$_3$)$_2$— | 4,4 | 0 | 1 | —CH$_2$— |
| 583 | 1 | (2,7-disubstituted 9,9'-spirobifluorene) | —C$_6$H$_3$(CH$_3$)$_2$— | 4,4 | 0 | 1 | —(CH$_2$)$_3$— |
| 584 | 1 | (2,7-disubstituted 9,9'-spirobifluorene) | —C$_6$H$_4$OCH$_3$ | 4,4 | 0 | 1 | —CH$_2$CH$_2$— |

The polymer compound including a repeating unit having, as its partial structure, at least one selected from the formulae (I-1) and (I-2) is not particularly limited, and is preferably a polyester represented by the following formula (II-1) or (II-2):

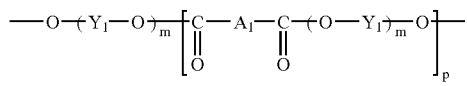

Formula (II-1)

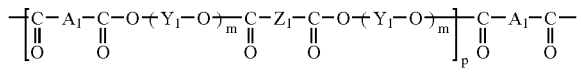

Formula (II-2)

In the formulae (II-1) and (II-2), $A_1$ represents at least one selected from the structures represented by the formulae (I-1) and (I-2); $Y_1$ represents a bivalent alcohol residue; $Z_1$ represents a bivalent carboxyl acid residue; m is an integer from 1 to 5; and p is an integer from 5 to 5000.

Specific examples of $Y_1$ or $Z_1$ include groups represented by the following formulae (35) to (40):

Formulae (35) to (40)

 (35)

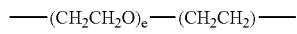 (36)

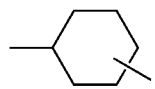 (37)

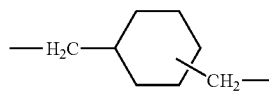 (38)

-continued

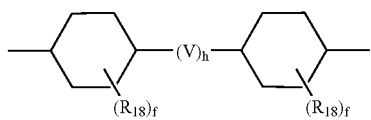 (39)

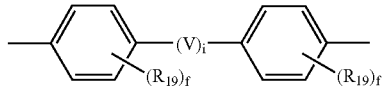 (40)

In the formulae (35) to (40), $R_{18}$ and $R_{19}$ each represent a hydrogen atom, an alkyl group having 1 to 4 carbon atoms, an alkoxy group having 1 to 4 carbon atoms, a substituted or unsubstituted phenyl group, a substituted or unsubstituted aralkyl group, or a halogen atom; d and e are each an integer from 1 to 10; f is an integer of 0, 1 or 2; h and i are each 0 or 1; V represents a group represented by any one selected from the formulae (14) to (34).

The structure represented by $A_1$ in the formula (II-1) or (II-2) represents at least one selected from structures represented by the formulae (I-1) and (I-2), and may represent two or more selected therefrom if necessary.

The molecular weight (the weight-average molecular weight Mw and the number-average molecular weight Mn) of the polymer compound used in the invention is not particularly limited, and is desirably about 1,000 or more, more desirably from 5,000 to 300,000, when taking into consideration the solubility and thin-film-forming ability of the polymer compound, as well as factors including the affinity of the formed film with a substrate and the flexibility thereof.

For the polymer compound, specific examples of the polyester represented by the formula (II-1) or (II-2) are shown in Tables 102 to 110. However, the polyester used in the invention is not limited thereto.

TABLE 102

| Compound | Monomer $A_1$ | Ratio | $Y_1$ | $Z_1$ | m | p |
|---|---|---|---|---|---|---|
| (1) | 2 | — | —CH$_2$CH$_2$— | — | 1 | 18 |
| (2) | 5 | — | —CH$_2$CH$_2$— | — | 1 | 41 |
| (3) | 9 | — | —CH$_2$CH$_2$— | — | 1 | 32 |
| (4) | 9 | — | —CH$_2$CH$_2$— | ⌬ | 1 | 44 |
| (5) | 9 | — | —CH$_2$CH$_2$— | ⌬ | 1 | 45 |
| (6) | 9 | — | —CH$_2$CH$_2$— | ⌬ | 2 | 85 |
| (7) | 13 | — | ⬡ | — | 1 | 45 |

TABLE 102-continued
| Compound | Monomer A₁ | Ratio | Y₁ | Z₁ | m | p |
|---|---|---|---|---|---|---|
| (8) | 13 | — | 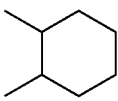 | —(CH₂)₄— | 1 | 30 |
| (9) | 19 | — |  | — | 1 | 35 |
| (10) | 19 | — | —CH₂CH₂— | — | 1 | 26 |
TABLE 103
| Compound | Monomer A₁ | Ratio | Y₁ | Z₁ | m | p |
|---|---|---|---|---|---|---|
| (11) | 41 | — | —CH₂CH₂— | — | 1 | 36 |
| (12) | 42 | — | —CH₂CH₂— | — | 1 | 45 |
| (13) | 42 | — | —CH₂CH₂— |  | 2 | 56 |
| (14) | 39 | — | —CH₂CH₂— | —(CH₂)₄— | 1 | 54 |
| (15) | 46 | — | —CH₂CH₂— | — | 1 | 62 |
| (16) | 46 | — | —(CH₂)₄— |  | 2 | 22 |
| (17) | 49 | — | 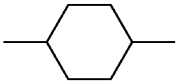 | — | 1 | 25 |
| (18) | 53 | — |  | — | 1 | 63 |
| (19) | 80 | — | 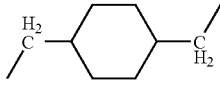 | 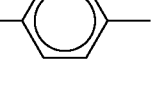 | 1 | 54 |
| (20) | 80 | — | —CH₂CH₂— | — | 1 | 23 |
TABLE 104
| Compound | Monomer A₁ | Ratio | Y₁ | Z₁ | m | p |
|---|---|---|---|---|---|---|
| (21) | 80 | — | —CH₂CH₂— | 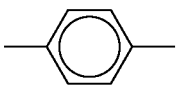 | 1 | 62 |
| (22) | 85 | — |  | — | 1 | 42 |

TABLE 104-continued
| Compound | Monomer A₁ | Ratio | Y₁ | Z₁ | m | p |
|---|---|---|---|---|---|---|
| (23) | 87 | — | 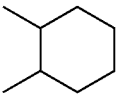 | — | 1 | 26 |
| (24) | 87 | — | 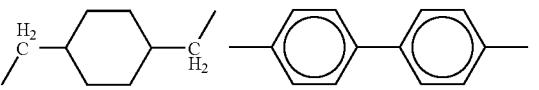 | 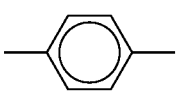 | 1 | 24 |
| (25) | 88 | — | —CH₂CH₂— | — | 1 | 29 |
| (26) | 92 | — | —CH₂CH₂— | — | 1 | 39 |
| (27) | 127 | — | —CH₂CH₂— |  | 1 | 25 |
| (28) | 127 | — | 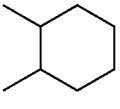 | — | 1 | 45 |
TABLE 105
| Compound | Monomer A₁ | Ratio | Y₁ | Z₁ | m | p |
|---|---|---|---|---|---|---|
| (29) | 127 | — | 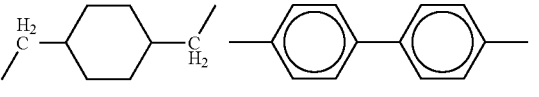 | — | 1 | 36 |
| (30) | 137 | — |  | 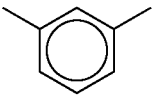 | 1 | 56 |
| (31) | 156 | — | —CH₂CH₂— | — | 1 | 15 |
| (32) | 160 | — | —CH₂CH₂— | 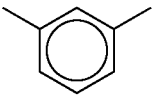 | 1 | 35 |
| (33) | 173 | — | —CH₂CH₂— | — | 1 | 34 |
| (34) | 175 | — | —CH₂CH₂— | — | 1 | 16 |
| (35) | 178 | — | —CH₂CH₂— | — | 1 | 35 |
| (36) | 181 | — | —CH₂CH₂— | — | 1 | 56 |
| (37) | 182 | — | —CH₂CH₂— | — | 1 | 53 |
| (38) | 183 | — | —CH₂CH₂— | — | 1 | 26 |
| (39) | 191 | — | —CH₂CH₂— | — | 1 | 45 |
TABLE 106
| Compound | Monomer A₁ | Ratio | Y₁ | Z₁ | m | p |
|---|---|---|---|---|---|---|
| (40) | 193 | — | —CH₂CH₂— | — | 1 | 36 |
| (41) | 233 | — | —CH₂CH₂— | — | 1 | 55 |
| (42) | 234 | — | —CH₂CH₂— | — | 1 | 36 |
| (43) | 238 | — | —CH₂CH₂— | — | 1 | 63 |
| (44) | 243 | — | —CH₂CH₂— | 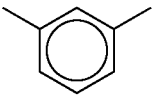 | 1 | 25 |

TABLE 106-continued

| Compound | Monomer A₁ | Ratio | Y₁ | Z₁ | m | p |
|---|---|---|---|---|---|---|
| (45) | 243 | — | —(CH₂)₄— | —(CH₂)₄— | 1 | 45 |
| (46) | 243 | — | ⬡ | — | 1 | 26 |
| (47) | 243 | — | —CH₂CH₂— | — | 1 | 36 |
| (48) | 243 | — | —CH₂CH₂— | ⌬ | 1 | 46 |
| (49) | 248 | — | ⬡ | — | 1 | 56 |

TABLE 107

| Compound | Monomer A₁ | Ratio | Y₁ | Z₁ | m | p |
|---|---|---|---|---|---|---|
| (50) | 249 | — | —CH₂CH₂— | — | 1 | 66 |
| (51) | 251 | — | —CH₂CH₂— | — | 1 | 65 |
| (52) | 251 | — | ⬡ | — | 1 | 52 |
| (53) | 255 | — | ⬡ (1,2-) | — | 1 | 15 |
| (54) | 262 | — | —CH₂CH₂— | — | 1 | 45 |
| (55) | 267 | — | —CH₂CH₂— | ⌬ | 1 | 35 |
| (56) | 304 | — | ⬡ | — | 1 | 26 |
| (57) | 306 | — | ⬡ (1,2-) | — | 1 | 36 |

TABLE 108

| Compound | Monomer A₁ | Ratio | Y₁ | Z₁ | m | p |
|---|---|---|---|---|---|---|
| (58) | 304 | — | —CH₂—⬡—CH₂— | ⌬—⌬ | 1 | 45 |
| (59) | 267 | — | —CH₂CH₂— | — | 1 | 15 |

TABLE 108-continued
| Compound | Monomer A₁ | Ratio | Y₁ | Z₁ | m | p |
|---|---|---|---|---|---|---|
| (60) | 335 | — | —CH₂CH₂— | 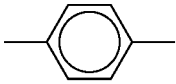 | 1 | 65 |
| (61) | 335 | — |  | — | 1 | 33 |
| (62) | 335 | — | 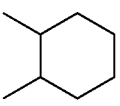 | — | 1 | 63 |
| (63) | 351 | — |  | 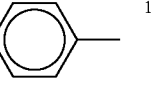 | 1 | 52 |
| (64) | 351 | — | 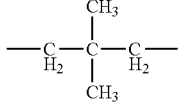 | — | 1 | 45 |
TABLE 109
| Compound | Monomer A₁ | Ratio | Y₁ | Z₁ | m | p |
|---|---|---|---|---|---|---|
| (65) | 375 | — | 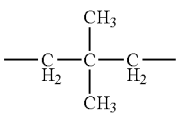 | — | 1 | 15 |
| (66) | 375 | — | 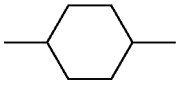 | — | 1 | 26 |
| (67) | 378 | — | —CH₂CH₂— | — | 1 | 56 |
| (68) | 378 | — | —CH₂CH₂— | 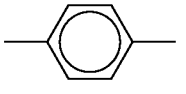 | 1 | 36 |
| (69) | 7/92 | 1/1 | —CH₂CH₂— | — | 1 | 56 |
| (70) | 7/92 | 1/1 | —CH₂CH₂— | — | 2 | 45 |
| (71) | 7/92 | 1/1 | 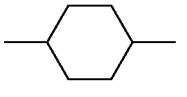 | 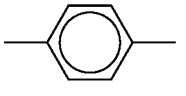 | 1 | 54 |
| (72) | 7/92 | 1/1 | —CH₂CH₂— | — | 1 | 65 |
TABLE 110
| Compound | Monomer A₁ | Ratio | Y₁ | Z₁ | m | p |
|---|---|---|---|---|---|---|
| (73) | 7/127 | 1/1 | —CH₂CH₂— | — | 1 | 56 |
| (74) | 7/127 | 1/1 | —CH₂CH₂— | — | 2 | 25 |
| (75) | 7/175 | 1/1 | —CH₂CH₂— | — | 1 | 12 |
| (76) | 7/92/ | 1/1/1 | —CH₂CH₂— | — | 1 | 15 |
TABLE 110-continued
| Compound | Monomer A₁ | Ratio | Y₁ | Z₁ | m | p |
|---|---|---|---|---|---|---|
| (77) | 175 173/ 220 | 1/1 | —CH₂CH₂— | — | 1 | 32 |

TABLE 110-continued

| Com-pound | Monomer A₁ | Ratio | Y₁ | Z₁ | m | p |
|---|---|---|---|---|---|---|
| (78) | 7/310 | 1/1 | —CH₂CH₂— |  | 1 | 25 |
| (79) | 7/310 | 1/2 | —CH₂CH₂— | — | 1 | 12 |
| (80) | 310/337 | 2/1 | —CH₂CH₂— | — | 1 | 40 |

The numbers in the column "$A_1$" in the column "Monomer" in Tables 102 to 110 correspond to compound numbers described in the column "Structure" in Tables 1 to 101. (The compounds specified by the numbers are specific examples of the compounds represented by the formulae (I-1) and (I-2).) The character "m" represents m in the formulae (II-1) and (II-2).

The process for synthesizing the polymer compound used in the invention is not particularly limited, and may be a process involving a combination of known processes according to the desired structure of the polymer compound. A specific example thereof will now be described using a case in which the polymer compound is a polyester as represented by the formula (II-1) or (II-2). The polymer compound includes a repeating unit having, as its partial structure, at least one selected from the structures represented by the formulae (I-1) and (I-2).

The aromatic tertiary amine used in the invention can be easily synthesized by a process [1] of causing an aryl amine to react with a halogenated carboalkoxyalkylbenzene or a halogenated carboalkoxybenzene to synthesize a diarylamine, and then causing this diarylamine to react with benzidine bishalide or the like. It can otherwise be synthesized by a different process [2] of causing an arylamine, diarylbenzidine or the like to react with a halogenated carboalkoxyalkylbenzene or a halogenated carboalkoxybenzene.

The aromatic tertiary amine having an alkylenecarboxylic acid ester group, which is a monomer used for obtaining a polyester as the polymer compound, can be synthesized by the process described in, for example, JP-A No. 5-80550. That is, by a process of introducing a chloromethyl group, forming a Grignard reagent by use of Mg, converting the chloromethyl group to a carboxylic acid by use of carbon dioxide, and then esterifying the acid.

However, in using this process, a chloromethyl group cannot be introduced into the raw material first used in the initial stage of the series of synthesis reactions in the process since the chloromethyl group has high reactivity. It is therefore necessary to use, for example, one of the three following processes. One process involves forming a skeleton of triarylamine, tetraarylbenzidine, or the like, and, for example, subsequently converting a methyl group, which has been introduced into the raw material first used in the initial stage of the series of synthesis reactions, to a chloromethyl group. A different process involves using an unsubstituted raw material to form a tetraarylbenzidine skeleton, introducing a functional group such as a formyl group into the skeleton to the aromatic ring thereof through a substitution reaction, reducing the group to obtain an alcohol, and then using a halogenation reagent such as thionyl chloride to convert the alcohol group to a chloromethyl group. A further different process involves performing direct chloromethylation with reagents such as para-formaldehyde and hydrochloric acid.

However, any aromatic tertiary amine having a skeleton such as triarylamine or tetraarylbenzidine has very high reactivity. Therefore, according to the process of converting a methyl group to a chloromethyl group, the methyl group having been introduced into the raw material first used in the initial stage of the series of synthesis reactions, a substitution reaction where halogen is introduced to the aromatic ring is easily caused; therefore, it is substantially impossible to selectively chlorinate only the methyl group.

According to the above process of using an unsubstituted raw material by which a functional group such as a formyl group is introduced to the skeleton and subsequently converted into a chloromethyl group, or the above process of performing direct chloromethylation, the chloromethyl group can only be introduced into the para-position to the nitrogen atom. Accordingly, an alkylenecarboxylic acid ester group can also only be introduced to the para-position to the nitrogen atom. Furthermore, reaction steps requires much time to complete in the former process involving the introduction of a functional group and then a chloromethyl group.

On the other hand, the process of causing an arylamine, diarylbenzidine or the like to react with a halogenated carboalkoxyalkylbenzene to yield a monomer is excellent in that the position of a substituent can easily be changed and the ionization potential and other properties of the resultant monomer can be easily controlled. Consequently, physical properties of the polymer compound to be yielded can be controlled. It is possible to easily introduce any of various substituents to an arbitrary position of the aromatic tertiary amine obtained using this kind of synthesis process. Furthermore, the amine is chemically stable, and is easy to handle. Thus, the above-mentioned problems are overcome.

In the case where the polymer compound used in the invention is a polyester as represented by the formula (II-1) or (II-2), the polymer compound can be synthesized by polymerizing a monomer represented by the following formula (II-3), which is obtained by the above synthesis process, in a known manner described, for example, in Experimental Chemical Lecture (Jikken Kagaku Kouza) vol. 28, $4^{th}$ ed. (Maruzen Co., Ltd., 1992).

$$A'-A_1-A' \qquad \text{Formula (II-3)}$$

In the formula (II-3), $A_1$ represents at least one selected from the structures represented by the formulae (I-1) and (I-2); A' represents a hydroxyl group, a halogen atom, or —O—$R_{20}$ wherein $R_{20}$ represents an alkyl group, a substituted or unsubstituted aryl group, or an aralkyl group.

Specifically, a polyester represented by the formula (II-1) or (II-2) can be synthesized as follows.

1) In the case where A' is a hydroxyl group, a bivalent alcohol is mixed with a monomer in an amount substantially equivalent to the monomer, after which the two are polymerized with an acidic catalyst. The bivalent alcohol is represented by OH—($Y_1$—O)m-H wherein $Y_1$ has the same meaning as described above and m is an integer equal to or greater than 1. The acidic catalyst may be an acidic catalyst which is used in ordinary esterifying reactions, examples of which include sulfuric acid, toluenesulfonic acid, and trifluoroacetic acid. The amount of the catalyst is from 1/10,000 to 1/10 parts by mass, preferably from 1/1,000 to 1/50 parts by mass, per 1 part by mass of the monomer.

To remove water generated in the polymerization, it is preferable to use a solvent that is azeotropic with water.

Examples of effective solvents include toluene, chlorobenzene, and 1-chloronaphthalene. The amount of the solvent is from 1 to 100 parts by mass, preferably from 2 to 50 parts by mass, per 1 part by mass of the monomer. The reaction temperature can be arbitrarily set, and is preferably made to be equal to the boiling point of the solvent in order to remove water generated in the polymerization.

After the completion of the reaction, when the solvent is not used, the reaction product is dissolved in a solvent able to dissolve the reaction product. When the solvent is used, the reaction solution is dripped, as it is, in to a poor solvent wherein a polymer to be obtained does not easily dissolve, for example, an alcohol (such as methanol or ethanol), or acetone, so as to precipitate a polyester. The polyester is separated, washed sufficiently with water or an organic solvent, and then dried. Furthermore, if necessary, the resultant product may be repeatedly subjected to reprecipitation treatment where the product is dissolved in an appropriate organic solvent and the solution is dripped into a poor solvent to precipitate the polyester.

In the reprecipitation treatment, it is preferable that the solution be effectively stirred with a mechanical stirrer or the like. The amount of solvent for dissolving the polyester in the reprecipitation treatment is from 1 to 100 parts by mass, preferably from 2 to 50 parts by mass, per 1 part by mass of the polyester. The amount of the poor solvent is from 1 to 1,000 parts by mass, preferably from 10 to 500 parts by mass, per 1 part by mass of the polyester. 2) In the case that A' is halogen, a bivalent alcohol represented by OH—($Y_1$—O)m-H is mixed with the monomer, in an amount substantially equivalent to the monomer, and then the two are polymerized with an organic basic catalyst such as pyridine or triethylamine. The amount of the organic basic catalyst is from 1 to 10 equivalents, preferably from 2 to 5 equivalents, per 1 equivalent of the monomer.

A solvent may be used, and examples of effective solvents include methylene chloride, tetrahydrofuran (THF), toluene, and chlorobenzene, and 1-chloronaphthalene. The amount of the solvent is from 1 to 100 parts by mass, preferably from 2 to 50 parts by mass, per 1 part by mass of the monomer. The reaction temperature can be arbitrarily set. After polymerization, reprecipitation treatment is conducted as described above to purify the resultant polymer.

In the case where the above-mentioned bivalent alcohol is a bivalent alcohol having a high acidity, such as bisphenol, interfacial polymerization may be used. In other words, the bivalent alcohol is added to water, a base is added thereto in an amount equivalent to the bivalent alcohol, and the mixture is dissolved. Then a solution of the monomer, the amount of which being equivalent to the bivalent alcohol, is added to the alcohol solution while the alcohol solution is stirred vigorously, whereby the alcohol and the monomer are polymerized. At this time, the amount of water is from 1 to 1,000 parts by mass, preferably from 2 to 500 parts by mass, per 1 part by mass of the bivalent alcohol.

Examples of the effective solvents for dissolving the monomer include methylene chloride, dichloroethane, trichloroethane, toluene, chlorobenzene, and 1-chloronaphthalene. The reaction temperature can be arbitrarily set. In order to promote the reaction, it is effective to use a phase transfer catalyst such as an ammonium salt or a sulfonium salt. The amount of the phase transfer catalyst is from 0.1 to 10 parts by mass, preferably from 0.2 to 5 parts by mass, per 1 part by mass of the monomer.

3) In the case where A' is —O—$R_{20}$, a bivalent alcohol represented by OH—($Y_1$—O)m-H is excessively added to a monomer after which the resultant solution is heated in the presence of an inorganic acid (such as sulfuric acid or phosphoric acid), titanium alkoxide, an acetate or carbonate of calcium, cobalt or the like, or an oxide of zinc or lead so as to perform transesterification and thereby synthesize the above-mentioned polyester.

The amount of the bivalent alcohol is from 2 to 100 equivalents, preferably from 3 to 50 equivalents, per 1 equivalent of the monomer. The amount of the catalyst is from 1/10,000 to 1 part by mass, preferably from 1/1,000 to 1/2 parts by mass, per 1 part by mass of the monomer. The reaction is conducted at a reaction temperature of 200 to 300° C. It is preferable to carry out the reaction under reduced pressure in order to promote polymerization through the release of OH—($Y_1$—O)m-H after the completion of the transesterification from the group —O—$R_{20}$ to the group —O—($Y_1$—O)m-H. The reaction may be carried out while a high boiling point solvent which is azeotropic with OH—($Y_1$—O)m-H, such as 1-chloronaphthalane, is used to remove OH—($Y_1$—O)m-H at normal pressure by azeotropy.

The polyester can be synthesized as follows. In each of the above-mentioned cases, the reaction is advanced by the addition of an excessive amount of the bivalent alcohol, thereby producing a compound represented by the following formula (II-4). The compound is next used instead of the monomer represented by the formula (II-3) to react with a bivalent carboxylic acid, a bivalent carboxylic acid halide or the like in the same manner as described above. The polyester can thus be obtained.

Formula (II-4)

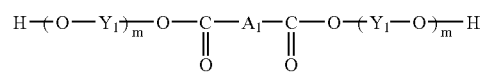

In the formula (II-4), Al represents at least one selected from the structures represented by the formulae (I-1) and (I-2); $Y_1$ represents a bivalent alcohol residue; and m is an integer from 1 to 5.

The structure of the organic semiconductor transistor element according to the invention will now be described in detail with specific examples thereof.

The organic semiconductor transistor element according to the invention has a structure that includes a source electrode, a drain electrode, an organic semiconductor formed to be electrically conductive to the source electrode and the drain electrode, and a gate electrode which is both insulated from the organic semiconductor and capable of applying an electric field. The organic semiconductor includes the above-mentioned polymer compound, which contains an aromatic tertiary amine. The organic semiconductor transistor element according to the invention can be made in any desired shape as the case may be, and is preferably made in the form of a thin film.

The structure of the organic semiconductor transistor element according to the invention will now be described in more detail with reference to the attached drawings. However, the organic semiconductor transistor element according to the invention is not limited thereto.

Figure 2:
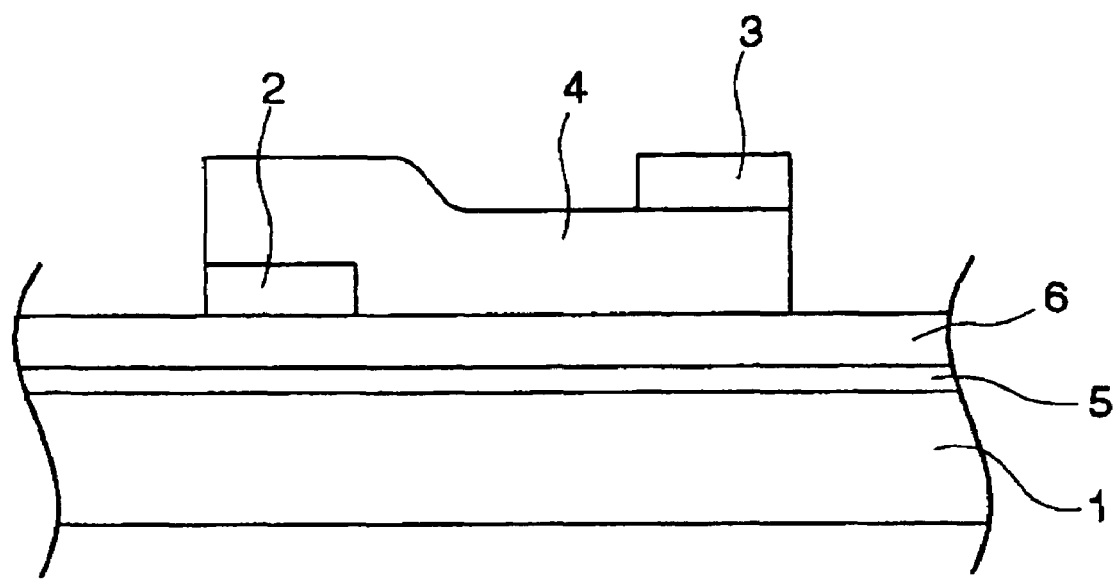
FIG. 2 is a view which schematically illustrates another example of the layer structure of the organic semiconductor transistor element according to the invention.
Figure 3:
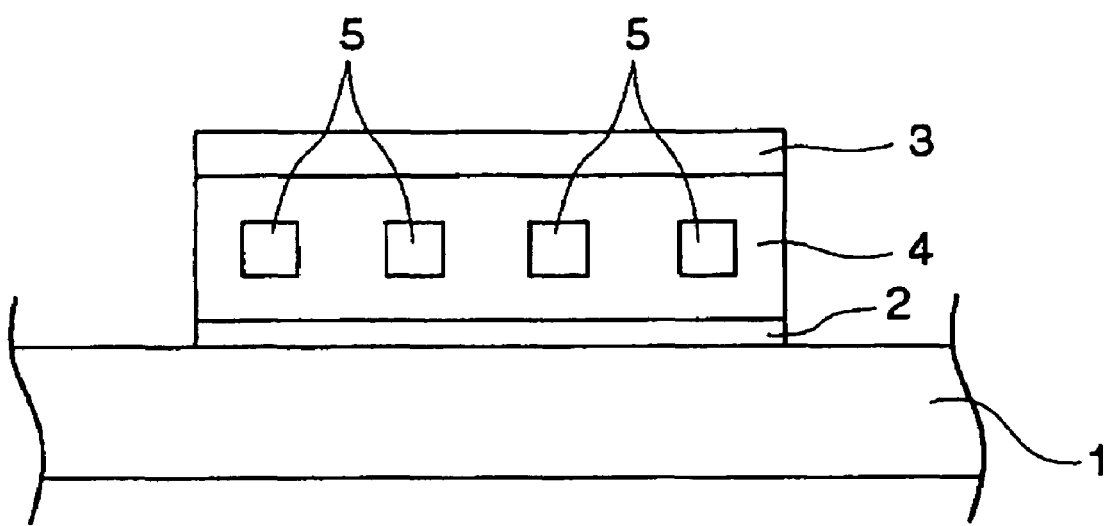
FIG. 3 is a view which schematically illustrates still another example of the layer structure of the organic semiconductor transistor element according to the invention.

FIGS. 1 to 3 are each a schematic sectional view showing individual examples of the structure of the organic semiconductor transistor element of the invention. The organic semiconductor transistor elements according to the invention shown in FIGS. 1 and 2 each have a field effect transistor structure. The organic semiconductor transistor element according to the invention illustrated in FIG. 3 has a static induction transistor structure.

In FIGS. 1 to 3, the same reference numbers are used to indicate members having a common function. Reference number 1 represents a substrate; 2, a source electrode; 3, a drain electrode; 4, an organic semiconductor layer; 5, a gate electrode or gate electrodes; and 6, an insulating layer. The structures of the organic semiconductor transistor elements of the present invention shown in FIGS. 1 to 3 are described individually hereinafter.

In the organic semiconductor transistor element according to the invention shown in FIG. 1, the gate electrode 5 and the insulating layer 6 are formed, in that order, on the substrate 1, and the source electrode 2 and the drain electrode 3 are formed on the insulating layer 6 so as to be located away from each other. The organic semiconductor layer 4 is formed so as to cover the source electrode 2 and the drain electrode 3.

In the organic semiconductor transistor element according to the invention illustrated in FIG. 2, the gate electrode 5 and the insulating layer 6 are formed, in that order, on the substrate 1. The source electrode 2 is formed on the insulating layer 6, and the organic semiconductor layer 4 is formed on the insulating layer 6 so as to cover a surface of the source electrode 2 opposite to another surface thereof which is in contact with the insulating layer 6. Furthermore, the drain electrode 3 is formed on a surface of the organic semiconductor layer 4 opposite to another surface thereof which is in contact with the insulating layer 6, so as to be located away from the source electrode 2 in the direction of the plane of the substrate 1.

In the organic semiconductor transistor element according to the invention shown in FIG. 3, the source electrode 2, the organic semiconductor layer 4, and the drain electrode 3 are formed, in that order, on the substrate 1. The gate electrodes 5 are formed inside the organic semiconductor layer 4. (In this example, the gate electrodes 5 are four in number, and are arranged at regular intervals parallel to the direction of the plane of the substrate 1.)

The gate electrodes 5 are arranged perpendicularly to the surface of the drawing sheet and parallel to both the source electrode 2 and the drain electrode 3, and further are arranged in parallel to each other. In FIG. 3, the gate electrodes 5 are electrically insulated from the organic semiconductor layer 4 with an insulating layer (not shown) formed therebetween.

In the organic semiconductor transistor elements as shown in FIGS. 1 to 3, electric current flowing between the source electrode 2 and the drain electrode 3 can be controlled through voltage applied to the gate electrode(s) 5.

In producing an electronic device having a semiconductor device, a structure having one or more organic semiconductor transistor elements according to the invention mounted on a substrate can be used as the semiconductor device. Other components, circuits, etc. are combinable with the semiconductor device to produce an electronic device.

Each of the members which constitute the organic semiconductor element or the semiconductor device according to the present invention except the organic semiconductor part thereof will now be described in detail.

Electrode material used in the source electrode, the drain electrode and the gate electrode may be any material capable of injecting electric charge effectively, and specific examples thereof include metal, metal oxide, and electroconductive polymer.

Examples of metals include magnesium, aluminum, gold, silver, copper, chromium, tantalum, indium, palladium, lithium, calcium, and alloys thereof. Examples of metal oxides include lithium oxide, magnesium oxide, aluminum oxide, indium tin oxide (ITO), tin oxide (NESA), indium oxide, zinc oxide, and indium zinc oxide.

Examples of electroconductive polymers include polyaniline, polythiophene, polythiophene derivatives, polypyrrole, polypyridine, and complexes of polyethylenedioxythiophene and polystyrenesulfonic acid.

If the difference between the ionization potential of the electrode material and that of the above-mentioned polymer compound used in the organic semiconductor (layer) is large, the charge injecting property of the electrode or device is adversely affected. Therefore, the difference between the ionization potential of the material used in the drain electrode and/or the source electrode and that of the polymer compound used in the organic semiconductor (layer) is preferably about 1.0 eV or less, more preferably 0.5 eV or less. For the electrode material, Au is particularly preferable from the viewpoint of the difference in ionization potential between the electrode(s) and the polymer compound.

One of the following three methods can be used for producing each of the electrodes: a method involving making a thin film formed from the above-mentioned electrode material by a known thin-film-forming process, such as vapor deposition or sputtering, into a desired shape by a known photolithography or lift-off process; a different method involving etching the thin film into a desired pattern (electrode shape) by use of a resist formed by ink-jet printing or the like; or a further different method involving transferring the electrode material, such as aluminum, thermally and directly. In the case where the above-mentioned electroconductive polymer is used as the electrode material, the polymer can be dissolved in a solvent, after which the resultant solution can be patterned by ink-jet printing.

Examples of the insulating material for insulating the electrodes from each other or insulating the gate electrode(s) from the organic semiconductor (layer) include inorganic substances such as silicon dioxide, silicon nitride, tantalum oxide, aluminum oxide, and titanium oxide; and organic insulating polymers such as polycarbonate resin, polyester resin, methacrylic resin, acrylic resin, polyvinyl chloride resin, cellulose resin, urethane resin, epoxy resin, polystyrene resin, polyvinyl acetate resin, styrene-butadiene copolymer, vinylidene chloride-acrylonitrile copolymer, vinyl chloride-vinyl acetate-maleic anhydride copolymer, and silicone resin. However, the insulating material is not limited thereto.

Examples of the substrate include a substrate being made of silicon monocrystal doped with phosphorus in a high concentration; a glass substrate; and a plastic substrate made of polycarbonate resin, polyester resin, methacrylic resin, acrylic resin, polyvinyl chloride resin, cellulose resin, urethane resin, epoxy resin, polystyrene resin, polyvinyl acetate resin, styrene-butadiene copolymer, vinylidene chloride-acrylonitrile copolymer, vinyl chloride-vinyl acetate-maleic anhydride copolymer, or silicone resin. However, the substrate is not limited thereto.

In particular, when the organic semiconductor transistor element according to the invention is used in an electronic circuit of an electronic device required to have flexibility, such as electronic paper or digital paper, (hereinafter referred to as a "flexible electronic device"), it is desirable that a flexible substrate be used for the substrate thereof. In particular, by using a substrate having a flexural modulus of about 1000 MPa or more, preferably 5000 MPa or more, the organic semiconductor transistor element according to the invention can be adapted to a driving circuit or electronic circuit of a display element having flexiblity.

The organic semiconductor transistor element according to the invention has sufficient elasticity for such an application since the organic semiconductor part of the element contains the above-mentioned polymer compound as the main component thereof; thus, even if the element is formed on the flexible substrate, the element resists any great deformation or repeated deformation and the element is thereby able to maintain stabilized performance. In contract, the semiconductor part of an inorganic semiconductor transistor element is made of an inorganic substance, and the transistor element thus lacks elasticity. Therefore, it is very difficult to use this kind of transistor element for purposes in which, it is subjected to the kind of deformation described above. Furthermore, an inorganic semiconductor transistor element has the disadvantage that no plastic can be used as the material of the substrate thereof since the transistor element is required to undergo high temperatures during the production process. Likewise, an organic semiconductor transistor element having an organic semiconductor part made mainly of a low molecular weight material lacks elasticity, unlike polymer material. Therefore, it is also difficult to use a transistor element of this nature for application where it is subjected to deformation as described above; alternatively, such use of this kind of transistor element results in unreliability.

In the present invention, "flexible electronic device" means an electronic device satisfying each of the following conditions [1] to [3]: [1] the device can be used while being altered from a flat state to a bent, warped or wound state, or vice versa, regardless of whether the power supply thereto is cut or not, as can be performed with the above-mentioned electronic paper or digital paper; [2] the device has a structure comprising a substrate, and one or more organic semiconductor transistor elements, and [3] the substrate of the device on which the organic semiconductor transistor element(s) is/are formed is required to have the flexibility described in condition [1].

A liquid-phase film-forming method is preferably used for forming the organic semiconductor part into a layer form. Examples thereof include spin coating, casting, dipping, die coating, roll coating, bar coating, and ink-jet coating, and various printing methods. However, the liquid-phase film-forming method is not limited thereto.

A protective layer may be formed on the organic semiconductor transistor element to prevent the element from being deteriorated by moisture or oxygen. Specific examples of material for the protective layer include metals such as In, Sn, Pb, Au, Cu, Ag and Al; metal oxides such as MgO, $SiO_2$ and $TiO_2$; and resins such as polyethylene resin, polyurea resin, and polyimide resin. The protective layer can be formed through vacuum evaporation, sputtering, plasma polymerization, CVD, or coating.

As described above, according to the organic semiconductor transistor element of the invention, the on/off ratio thereof can be adjusted to fall within a range of about $10^2$ to $10^5$ according to the intended purpose of the organic semiconductor transistor element by appropriately selecting, for example, the kind of polymer compound to be used in the organic semiconductor part of the element, and the structure of the element.

EXAMPLES

The present invention is more specifically described hereinafter by way of the following examples. However, the present invention is not limited by these examples.

(Example 1)

Gold is deposited in film form on a glass substrate by vacuum evaporation, forming a gate electrode with a thickness of 100 nm. Next, $SiO_2$ is deposited on the gate electrode by sputtering, so as to form an insulating layer with a thickness of 300 nm. Thereafter, a metal mask is set on the insulating layer and gold is deposited in film form on the insulating layer, so as to form a source electrode and a drain electrode each with a thickness of 150 nm. The distance between the two formed electrodes is 50 µm.

To form an organic semiconductor layer, a 5% by mass solution of the example compound (6) in dichloroethane is prepared, and this is filtrated through a PTFE filter having sieve openings of 0.1 µm to prepare a coating solution.

The coating solution is then used to form an organic semiconductor layer with a thickness of 0.150 µm on the insulating layer by dip coating, so as to cover the source electrode and the drain electrode.

(Example 2)

An organic semiconductor transistor element is produced in the same way as in Example 1 except that the exempla compound (8) is used instead of the exempla compound (6) used in Example 1.

(Example 3)

An organic semiconductor transistor element is produced in the same way as in Example 1 except that the exempla compound (20) is used instead of the exempla compound (6) used in Example 1.

(Example 4)

An organic semiconductor transistor element is produced in the same way as in Example 1 except that the exemplified compound (37) is used instead of the exempla compound (6) used in Example 1.

(Example 5)

An organic semiconductor transistor element is produced in the same way as in Example 1 except that the exempla compound (39) is used instead of the exempla compound (6) used in Example 1.

(Example 6)

An organic semiconductor transistor element is produced in the same way as in Example 1 except that the exempla compound (47) is used instead of the exempla compound (6) used in Example 1.

(Example 7)

An organic semiconductor transistor element is produced in the same way as in Example 1 except that the exempla compound (67) is used instead of the exempla compound (6) used in Example 1.

(Comparative Example 1)

An organic semiconductor transistor element is produced in the same way as in Example 1 except that a charge-transporting low molecular weight compound represented by the following structural formula (IX) is used instead of the exempla compound (6) used in Example 1.

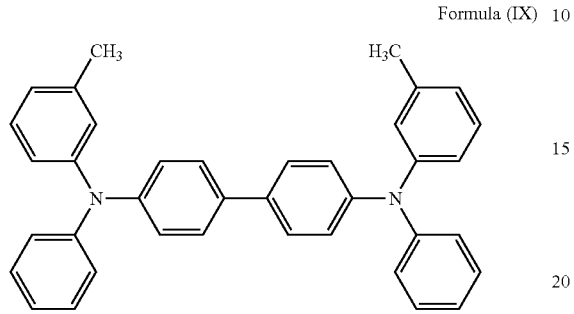

Formula (IX)

(Comparative Example 2)

An organic semiconductor transistor element is produced in the same way as in Example 1 except that poly[2-methoxy-5-(2-ethylhexyl)-1,4-phenylenevinylene] is used instead of the exempla compound (6) used in Example 1.

-Evaluation-

A semiconductor parameter analyzer (trade name: 4155C, manufactured by Agilent Technologies Co.) is used to measure the current-voltage characteristic of each of the organic semiconductor transistor elements obtained in the working examples according to the invention and the comparative examples when gate voltage is applied thereto. The carrier mobilities (linear region) and the on/off ratios thereof are then calculated.

The on/off ratios of the organic semiconductor transistor elements produced as described above are shown in Table 111 together with the carrier mobilities of charge-transporting materials used in their organic compound layers. As can be understood from Table 111, the organic semiconductor transistor element in any one of the working examples exhibits a switching property where the drain-source current flowing between the source electrode and the drain electrode through the organic semiconductor layer changes with a change in voltage applied to the gate electrode (gate voltage), and the on/off ratio thereof is in the order of $10^4$.

In contract, in each of the comparative examples, the carrier mobility of the charge-transporting material used in the formation of the organic semiconductor layer is low. Accordingly, there are cases where the on/off ratio thereof is far poorer than the ratios of the working examples, and there are also cases in which a liquid-phase film-forming process cannot be used, and thus, a gas-phase film-forming process must be used in order to form the organic semiconductor layer.

TABLE 111

| Example 1 | Carrier mobility (cm$^2$/Vs) | On/off ratio (×10$^2$) |
|---|---|---|
| Example 2 | 3.7 × 10$^{-4}$ | 42 |
| Example 3 | 2.1 × 10$^{-5}$ | 62 |

TABLE 111-continued

| Example 1 | Carrier mobility (cm$^2$/Vs) | On/off ratio (×10$^2$) |
|---|---|---|
| Example 4 | 6.7 × 10$^{-5}$ | 26 |
| Example 5 | 8.5 × 10$^{-6}$ | 55 |
| Example 6 | 4.5 × 10$^{-5}$ | 10 |
| Example 7 | 1.5 × 10$^{-6}$ | 41 |
| Example 8 | 2.4 × 10$^{-6}$ | 25 |
| Comparative Example 1 | 2.7 × 10$^{-7}$ | 0.27 |
| Comparative Example 2 | 1.0 × 10$^{-6}$ | 10 |

As described above, according to the invention, a polymer compound is used which contains an aromatic tertiary amine having excellent solubility in solvent or resin, excellent compatibility with solvent or resin, and a high carrier mobility. The present invention therefore makes it possible to provide an organic semiconductor transistor element which has a high operating speed and is easy to produce, a semiconductor device using this element, and a process for producing the semiconductor device.

What is claimed is:

1. An organic semiconductor transistor element, comprising at least a source electrode, a drain electrode, an organic semiconductor formed to be electrically conductive to the source electrode and the drain electrode, and a gate electrode which is both insulated from the organic semiconductor and capable of applying an electric field, wherein the organic semiconductor comprises a polymer compound comprising an aromatic tertiary amine.

2. An organic semiconductor transistor element according to claim 1, wherein the polymer compound is a polyester.

3. An organic semiconductor transistor element according to claim 1, wherein the molecular weight of the polymer compound is about 1000 or more.

4. An organic semiconductor transistor element according to claim 1, wherein the aromatic tertiary amine contains an aromatic component comprising at least one of a condensed aromatic ring and a polynuclear aromatic ring, bonded to a tertiary amine nitrogen atom thereof.

5. An organic semiconductor transistor element according to claim 1, wherein the aromatic tertiary amine is represented by one of the following formulae (I-1) and (I-2):

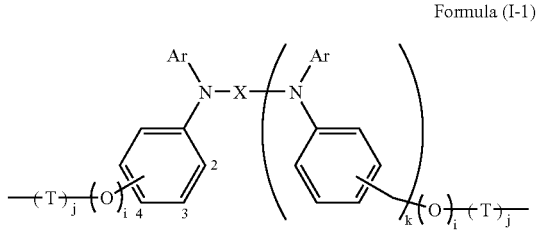

Formula (I-1)

-continued

Formula (I-2)

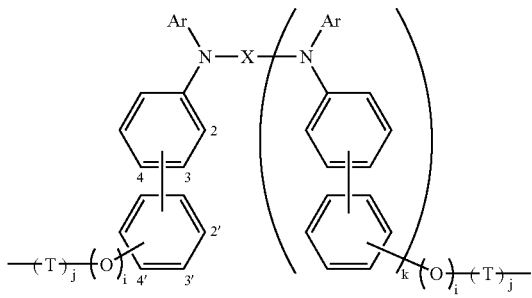

wherein Ar represents one selected from the group consisting of a substituted or unsubstituted monovalent benzene ring, a substituted or unsubstituted monovalent polynuclear aromatic hydrocarbon having 2 to 10 aromatic rings, a substituted or unsubstituted monovalent condensed aromatic hydrocarbon having 2 to 10 aromatic rings, and a substituted or unsubstituted monovalent aromatic heteroring; X represents one selected from the group consisting of a substituted or unsubstituted bivalent benzene ring, a substituted or unsubstituted bivalent polynuclear aromatic hydrocarbon having 2 to 10 aromatic rings, a substituted or unsubstituted bivalent condensed aromatic hydrocarbon having 2 to 10 aromatic rings, and a substituted or unsubstituted bivalent aromatic heteroring; T represents one selected from the group consisting of a bivalent straight-chain hydrocarbon group having 1 to 6 carbon atoms, and a bivalent branched hydrocarbon group having 2 to 10 carbon atoms; and k, i, and j each independently represent an integer which is one of 0 and 1.

6. An organic semiconductor transistor element according to claim 5, wherein the polymer compound is a polyester represented by one of the following formulae (II-1) and (II-2):

Formula (II-1)

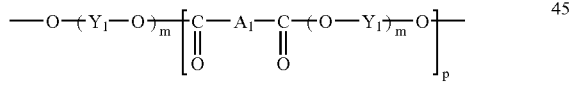

Formula (II-2)

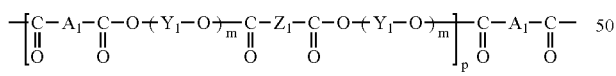

wherein $A_1$ represents at least one aromatic tertiary amine selected from the structures represented by the formulae (I-1) and (I-2); $Y_1$ represents a bivalent alcohol residue; $Z_1$ represents a bivalent carboxylic acid residue; m represents an integer from 1 to 5; and p represents an integer from 5 to 5000.

7. An organic semiconductor transistor element according to claim 1, wherein the difference between an ionization potential of one of the source electrode and the drain electrode and that of the polymer compound is about 1.0 eV or less.

8. A semiconductor device, comprising a substrate, and one or more organic semiconductor transistor elements provided on the substrate, the one or more organic semiconductor transistor elements comprising at least a source electrode, a drain electrode, an organic semiconductor formed to be electrically conductive to the source electrode and the drain electrode, and a gate electrode which is both insulated from the organic semiconductor and capable of applying an electric field, wherein the organic semiconductor comprises a polymer compound comprising an aromatic tertiary amine.

9. A semiconductor device according to claim 8, wherein the flexural modulus of the substrate is about 1000 MPa or more.

10. A semiconductor device according to claim 9, which is used in a flexible electronic device.

11. A semiconductor device according to claim 8, wherein the polymer compound is a polyester.

12. A semiconductor device according to claim 8, wherein the molecular weight of the polymer compound is about 1000 or more.

13. A semiconductor device according to claim 8, wherein the aromatic tertiary amine contains an aromatic component comprising at least one of a condensed aromatic ring and a polynuclear aromatic ring, bonded to a tertiary amine nitrogen atom thereof.

14. A semiconductor device according to claim 8, wherein the aromatic tertiary amine is represented by one of the following formulae (I-1) and (I-2):

Formula (I-1)

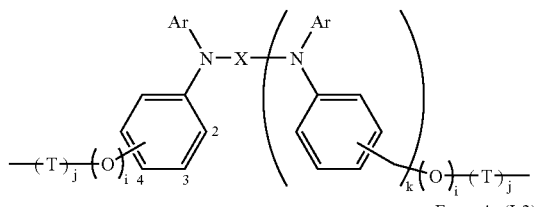

Formula (I-2)

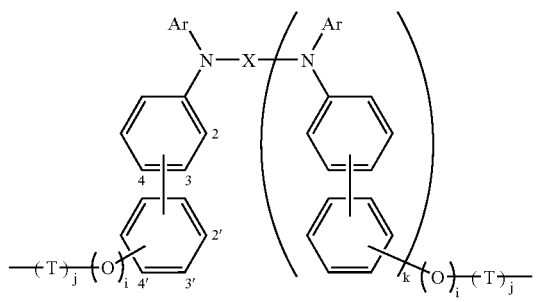

wherein Ar represents one selected from the group consisting of a substituted or unsubstituted monovalent benzene ring, a substituted or unsubstituted monovalent polynuclear aromatic hydrocarbon having 2 to 10 aromatic rings, a substituted or unsubstituted monovalent condensed aromatic hydrocarbon having 2 to 10 aromatic rings, and a substituted or unsubstituted monovalent aromatic heteroring; X represents one selected from the group consisting of a substituted or unsubstituted bivalent benzene ring, a substituted or unsubstituted bivalent polynuclear aromatic hydrocarbon having 2 to 10 aromatic rings, a substituted or unsubstituted bivalent condensed aromatic hydrocarbon having 2 to 10 aromatic rings, and a substituted or unsubstituted bivalent aromatic heteroring; T represents one selected from the group consisting of a bivalent straight-chain hydrocarbon group having 1 to 6 carbon atoms, and a bivalent branched hydrocarbon group having 2 to 10 carbon atoms; and k, i, and j each independently represent an integer which is one of 0 and 1.

15. A semiconductor device according to claim 14, wherein the polymer compound is a polyester represented by one of the following formulae (II-1) and (II-2):

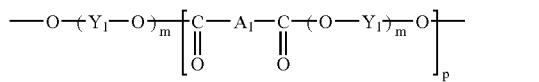

Formula (II-1)

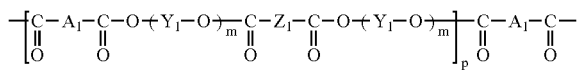

Formula (II-2)

wherein $A_1$ represents at least one aromatic tertiary amine selected from the structures represented by the formulae (I-1) and (I-2); $Y_1$ represents a bivalent alcohol residue; $Z_1$ represents a bivalent carboxylic acid residue; m represents an integer from 1 to 5; and p represents an integer from 5 to 5000.

16. A semiconductor device according to claim 8, wherein the difference between an ionization potential of one of the source electrode and the drain electrode and that of the polymer compound is about 1.0 eV or less.

17. A process for producing a semiconductor device comprising a substrate, and one or more organic semiconductor transistor elements provided on the substrate, the one or more organic semiconductor transistor elements comprising at least a source electrode, a drain electrode, an organic semiconductor layer which is formed to be electrically conductive to the source electrode and the drain electrode and which comprises a polymer compound comprising an aromatic tertiary amine, and a gate electrode which is both insulated from the organic semiconductor layer and capable of applying an electric field, wherein the organic semiconductor layer is formed through a liquid-phase film-forming process.

18. A process for producing a semiconductor device according to claim 17, wherein the polymer compound is a polyester.

19. A process for producing a semiconductor device according to claim 17, wherein the molecular weight of the polymer compound is about 1000 or more.

20. A process for producing a semiconductor device according to claim 17, wherein the flexural modulus of the substrate is about 1000 MPa or more.

* * * * *